United States Patent
Fujita et al.

(10) Patent No.: US 11,942,499 B2
(45) Date of Patent: Mar. 26, 2024

(54) IMAGE SENSOR

(71) Applicant: Samsung Electronics Co., Ltd., Suwon-si (KR)

(72) Inventors: Masato Fujita, Suwon-si (KR); Doosik Seol, Seoul (KR); Kyungduck Lee, Hwaseong-si (KR); Kyungho Lee, Suwon-si (KR); Taesub Jung, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 274 days.

(21) Appl. No.: 17/232,735

(22) Filed: Apr. 16, 2021

(65) Prior Publication Data

US 2022/0045110 A1 Feb. 10, 2022

(30) Foreign Application Priority Data

Aug. 10, 2020 (KR) .................. 10-2020-0100044

(51) Int. Cl.
*H01L 27/146* (2006.01)
*H04N 25/704* (2023.01)
*H04N 25/79* (2023.01)

(52) U.S. Cl.
CPC .... *H01L 27/1463* (2013.01); *H01L 27/14621* (2013.01); *H01L 27/14627* (2013.01); *H01L 27/14645* (2013.01); *H01L 27/14685* (2013.01); *H01L 27/14689* (2013.01); *H04N 25/704* (2023.01); *H04N 25/79* (2023.01)

(58) Field of Classification Search
CPC ......................................... H01L 27/146–14893
See application file for complete search history.

(56) References Cited

U.S. PATENT DOCUMENTS

| | | | |
|---|---|---|---|
| 9,711,553 B2 | 7/2017 | Kim et al. | |
| 10,014,338 B2 | 7/2018 | Lee | |
| 10,347,679 B2 | 7/2019 | Kato et al. | |
| 10,461,109 B2 | 10/2019 | Wu et al. | |
| 2013/0222552 A1* | 8/2013 | Agranov | H04N 13/204 |
| | | | 348/49 |

(Continued)

FOREIGN PATENT DOCUMENTS

JP 2018201015 A 12/2018

*Primary Examiner* — Eric A. Ward
*Assistant Examiner* — Zachary Taylor Nix
(74) *Attorney, Agent, or Firm* — HARNESS, DICKEY & PIERCE, P.L.C.

(57) ABSTRACT

An image sensor includes a pixel array and a logic circuit. The pixel array includes a pixel isolation layer between a plurality of pixels. Each of the plurality of pixels include a pixel circuit below at least one photodiode. The logic circuit acquires a pixel signal from the plurality of pixels. The pixel array includes at least one autofocusing pixel, which includes a first photodiode, a second photodiode, a pixel internal isolation layer between the first and second photodiodes, and a microlens on the first and second photodiodes. The pixel internal isolation layer includes a first pixel internal isolation layer and a second pixel internal isolation layer, separated from each other in a first direction, perpendicular to the upper surface of the substrate, and the first pixel internal isolation layer and the second pixel internal isolation layer include different materials.

16 Claims, 43 Drawing Sheets

(56) References Cited

U.S. PATENT DOCUMENTS

| | | | |
|---|---|---|---|
| 2016/0043119 A1* | 2/2016 | Lee | H01L 27/1464 |
| | | | 257/446 |
| 2016/0064430 A1* | 3/2016 | Lee | H01L 27/14623 |
| | | | 257/292 |
| 2016/0240571 A1* | 8/2016 | Baek | H01L 27/14636 |
| 2017/0047363 A1 | 2/2017 | Choi et al. | |
| 2017/0345853 A1* | 11/2017 | Kato | H01L 27/14627 |
| 2018/0158864 A1* | 6/2018 | Kim | H01L 27/14831 |
| 2019/0043901 A1* | 2/2019 | Honda | H01L 27/14603 |
| 2019/0131478 A1 | 5/2019 | Wang et al. | |
| 2019/0172868 A1 | 6/2019 | Chen et al. | |
| 2020/0083263 A1* | 3/2020 | Tanaka | H01L 27/14603 |
| 2020/0235149 A1 | 7/2020 | Shiraishi et al. | |
| 2020/0273894 A1* | 8/2020 | Inui | H01L 27/1463 |
| 2020/0369371 A1* | 11/2020 | Ishiwata | H04N 25/771 |
| 2020/0411584 A1* | 12/2020 | Hara | H01L 27/14621 |

* cited by examiner

IMAGE SENSOR

CROSS-REFERENCE TO RELATED APPLICATION(S)

This application claims benefit of priority to Korean Patent Application No. 10-2020-0100044 filed on Aug. 10, 2020 in the Korean Intellectual Property Office, the disclosure of which is incorporated herein by reference in its entirety.

BACKGROUND

Inventive concepts relate to an image sensor.

An image sensor is a semiconductor-based sensor receiving light and generating an electrical signal, and may include a pixel array having a plurality of pixels, a logic circuit driving the pixel array and generating an image, and the like. The logic circuit may acquire a pixel signal from the pixels to generate image data. The image sensor may provide an autofocusing function for focusing on a subject.

SUMMARY

An aspect of inventive concepts is to provide an image sensor capable of reducing and/or minimizing alignment errors that may occur in forming an isolation layer disposed between photodiodes, and limiting and/or preventing saturation of the photodiodes.

According to an example embodiment, an image sensor may include a pixel array including a substrate, a plurality of pixels arranged in directions parallel to an upper surface of the substrate, and a pixel isolation layer between the plurality of pixels, each of the plurality of pixels including at least one photodiode and a pixel circuit below the at least one photodiode; and a logic circuit configured to acquire a pixel signal from the plurality of pixels. The pixel array may include at least one autofocusing pixel. The at least one autofocusing pixel may include a first photodiode, a second photodiode, a pixel internal isolation layer between the first photodiode and the second photodiode, and a microlens on the first photodiode and the second photodiode. The pixel internal isolation layer may include a first pixel internal isolation layer and a second pixel internal isolation layer. The first pixel internal isolation layer and the second pixel internal isolation layer may be separated from each other in a first direction. The first direction may be perpendicular to the upper surface of the substrate. A material of the first pixel internal isolation layer may be different than a material of the second pixel internal isolation layer.

According to an example embodiment, an image sensor may include a substrate having a first surface and a second surface opposing the first surface; a pixel array including a plurality of pixels and a pixel isolation layer between the plurality of pixels, the pixel isolation layer extending from the first surface to the second surface of the substrate in a first direction perpendicular to the first surface, each of the plurality of pixels including at least one photodiode inside the substrate and a pixel circuit having a plurality of elements on the first surface; and a logic circuit configured to acquire pixel signal from the plurality of pixels. The pixel array may include at least one autofocusing pixel, wherein the at least one autofocusing pixel may include a first photodiode, a second photodiode, a pixel internal isolation layer extending from the first surface in the first direction between the first photodiode and the second photodiode, and a microlens on the second surface. The pixel internal isolation layer may include a first pixel internal isolation layer extending from the first surface and a second pixel internal isolation layer extending from the second surface. The first pixel internal isolation layer and the second pixel internal isolation layer may have different shapes in a plane parallel to the first surface.

According to an example embodiment, an image sensor may include a substrate having a first surface and a second surface opposing the first surface; a pixel array including a plurality of pixels and a pixel isolation layer between the plurality of pixels, the pixel isolation layer extending from the first surface in a first direction perpendicular to the first surface, each of the plurality of pixels including at least one photodiode and a pixel circuit, the pixel circuit having a plurality of elements on the first surface; and a logic circuit configured to acquire pixel signal from the plurality of pixels. The pixel array may include at least one autofocusing pixel. The autofocusing pixel may include a first photodiode and a second photodiode separated from each other in a second direction parallel to the first surface, a pixel internal isolation layer extending from the first surface in the first direction between the first photodiode and the second photodiode, and a microlens on the second surface. The internal pixel isolation layer may have a first vertical surface and a second vertical surface extending in the first direction and opposing each other in a third direction intersecting the second direction. At least one of the first vertical surface and the second vertical surface may be separated from the pixel isolation layer.

BRIEF DESCRIPTION OF DRAWINGS

The above and other aspects, features, and effective of inventive concepts will be more clearly understood from the following detailed description, taken in conjunction with the accompanying drawings, in which.

DETAILED DESCRIPTION

Hereinafter, example embodiments of inventive concepts will be described with reference to the accompanying drawings.

Figure 1:
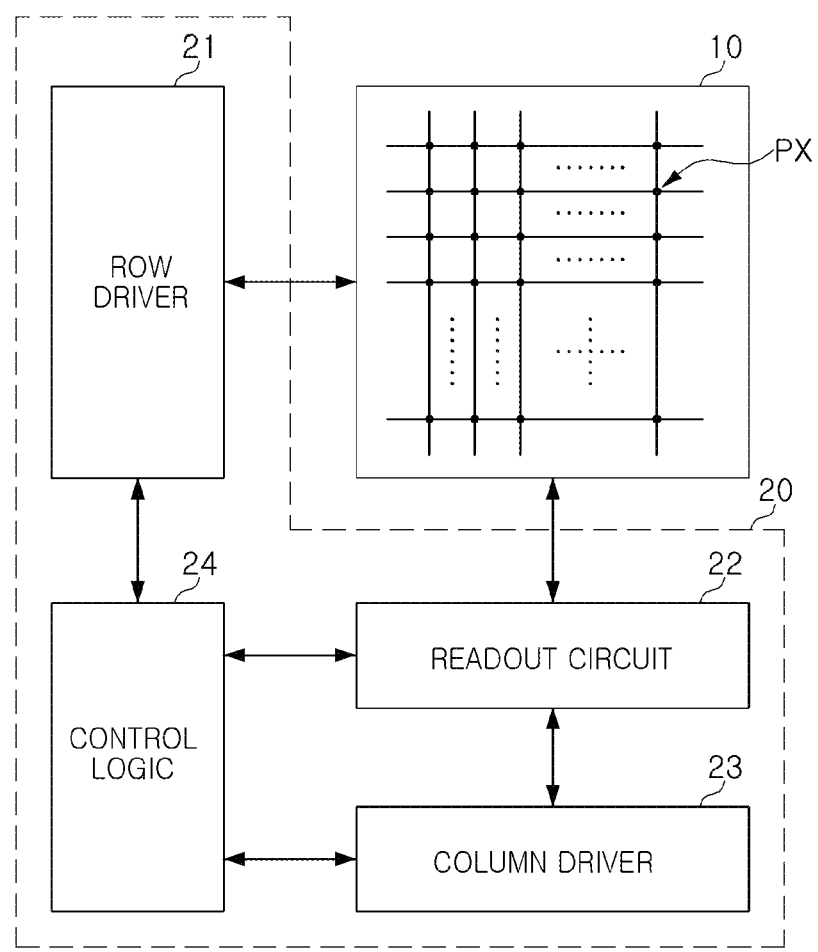
FIG. 1 is a block diagram schematically illustrating an image sensor according to an embodiment of inventive concepts.

FIG. 1 is a block diagram schematically illustrating an image sensor according to an embodiment of inventive concepts.

Referring to FIG. 1, an image sensor 1 may include a pixel array 10, a logic circuit 20, and the like.

The pixel array 10 may include a plurality of pixels PX arranged in an array shape along a plurality of rows and a plurality of columns. Each of the plurality of pixels PX may include at least one photoelectric conversion element that generates charge in response to light, a pixel circuit that generates a pixel signal corresponding to the charge generated by the photoelectric conversion element, and the like. The photoelectric conversion element may include a photodiode formed of a semiconductor material, an organic photodiode formed of an organic material, and/or the like.

For example, the pixel circuit may include a floating diffusion, a transfer transistor, a reset transistor, a driving transistor, and a select transistor. A configuration of the pixels PX may vary according to embodiments. As an example, each of the pixels PX may include an organic photodiode including an organic material or may be implemented as a digital pixel. When the pixels PX are implemented as digital pixels, each of the pixels PX may include an analog-to-digital converter for outputting a digital pixel signal.

The logic circuit 20 may include circuits for controlling the pixel array 10. For example, the logic circuit 20 may include a row driver 21, a readout circuit 22, a column driver 23, a control logic 24, and the like. The row driver 21 may drive the pixel array 10 in units of row lines. For example, the row driver 21 may generate a transmission control signal for controlling the transfer transistor of the pixel circuit, a reset control signal for controlling the reset transistor, a select control signal for controlling the select transistor, etc., to input them into the pixel array 10 in units of row lines.

The readout circuit 22 may include a correlated double sampler (CDS), an analog-to-digital converter (ADC), or the like. The correlated double samplers may be connected to the pixels PX through column lines. The correlated double samplers may read a pixel signal through column lines, from the pixels PX connected to a row line selected by a row line select signal of the row driver 21. The analog-to-digital converter may convert the pixel signal detected by the correlated double sampler into a digital pixel signal, and may transmit the digital pixel signal to the column driver 23.

The column driver 23 may include a latch circuit or a buffer circuit for temporarily storing the digital pixel signal, an amplifying circuit, and the like, and may process the digital pixel signal received from the readout circuit 22. The row driver 21, the readout circuit 22, and the column driver 23 may be controlled by the control logic 24. The control logic 24 may include a timing controller for controlling operation timing of the row driver 21, the readout circuit 22, and the column driver 23, and the like.

Among the pixels PX, pixels PX disposed at the same position in a horizontal direction may share the same column line. For example, pixels PX disposed at the same position in a vertical direction may be simultaneously selected by the row driver 21, and may output pixel signals through column lines. In an embodiment, the readout circuit 22 may simultaneously acquire the pixel signals through column lines, from the pixels PX selected by the row driver 21. The pixel signal may include a reset voltage and a pixel voltage. The pixel voltage may be a voltage in which charges generated in response to light in each of the pixels PX are reflected in the reset voltage.

In an embodiment, the pixel array 10 may include at least one autofocusing pixel. The autofocusing pixel may include two or more photodiodes. The logic circuit 20 may use a difference in pixel signals acquired from photodiodes included in each of the autofocusing pixels, to implement an autofocusing function of an image sensor 1 and/or an autofocusing function of a camera device including the image sensor 1.

To accurately calculate a difference in pixel signals acquired from two or more photodiodes included in an autofocusing pixel, the autofocusing pixel may include a pixel internal isolation layer for separating the photodiodes. Since the photodiodes may be separated from each other by the pixel internal isolation layer, a light-receiving area of each of the photodiodes may be determined according to a position of the pixel internal isolation layer. When the position of the internal isolation layer inside the pixel is not accurately aligned and a difference occurs in the light-receiving area of each of the photodiodes, the autofocusing function of the image sensor 1 may be deteriorated.

In an embodiment of inventive concepts, to reduce and/or minimize an error in the light-receiving area of each of the photodiodes in the autofocusing pixel, the pixel internal isolation layer may be formed from a first surface of a substrate, similar to a pixel isolation layer between the pixels PX. For example, the first surface may be a surface on which a pixel circuit included in each of the pixels PX is formed. For example, the pixel internal isolation layer may be formed in the same process as the pixel isolation layer. Therefore, an alignment error of the pixel internal isolation layer may be reduced and/or minimized, and an error in the light-receiving area of each of the photodiodes may be reduced, to improve an autofocusing function of the image sensor 1. In addition, even when an area of each of the pixels PX decreases to increase resolution of the image sensor 1, an autofocusing function of the image sensor 1 may be effectively implemented.

Figure 2:
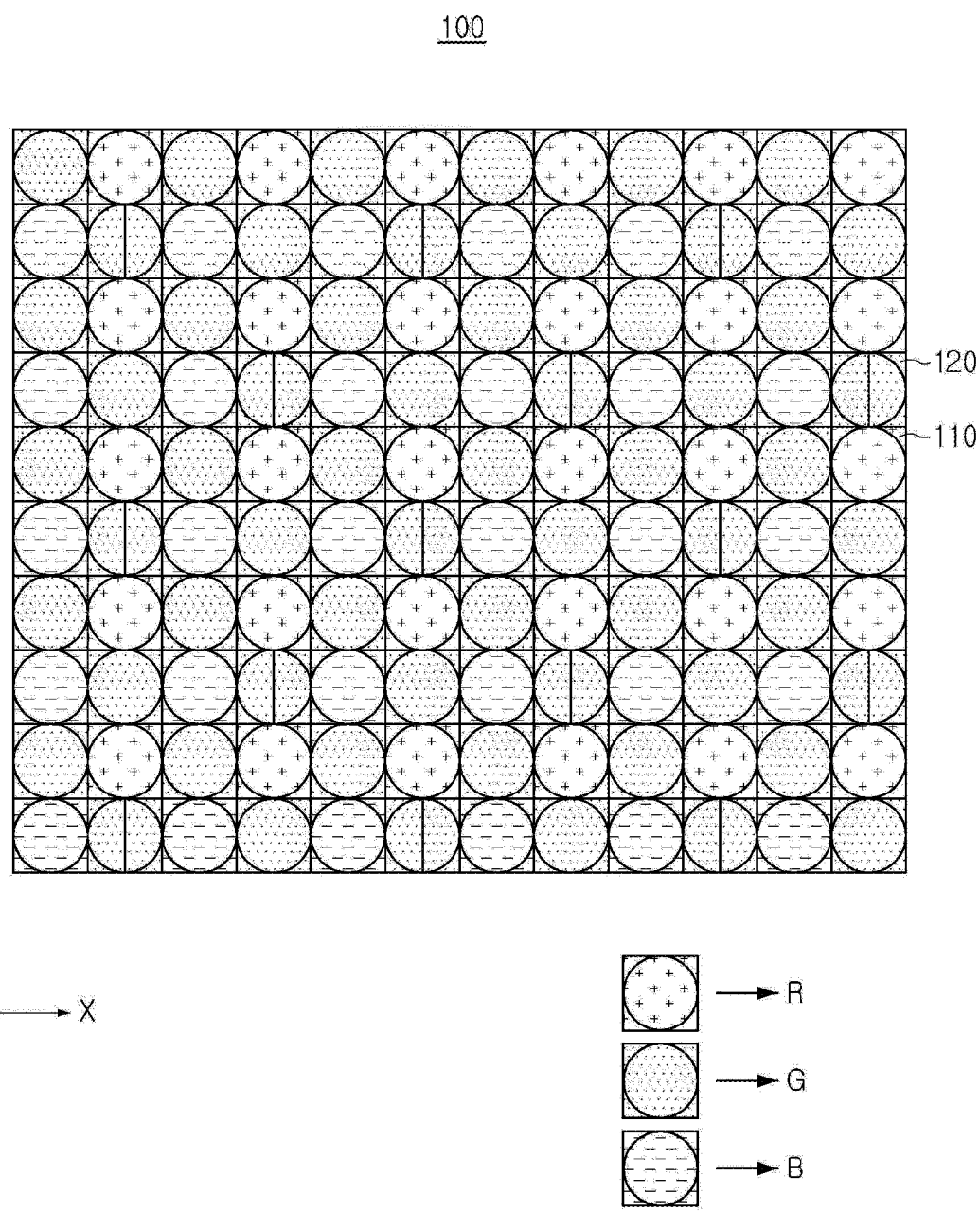
FIGS. 2 to 4 are views schematically illustrating a pixel array of an image sensor according to embodiments of inventive concepts.
Figure 3:
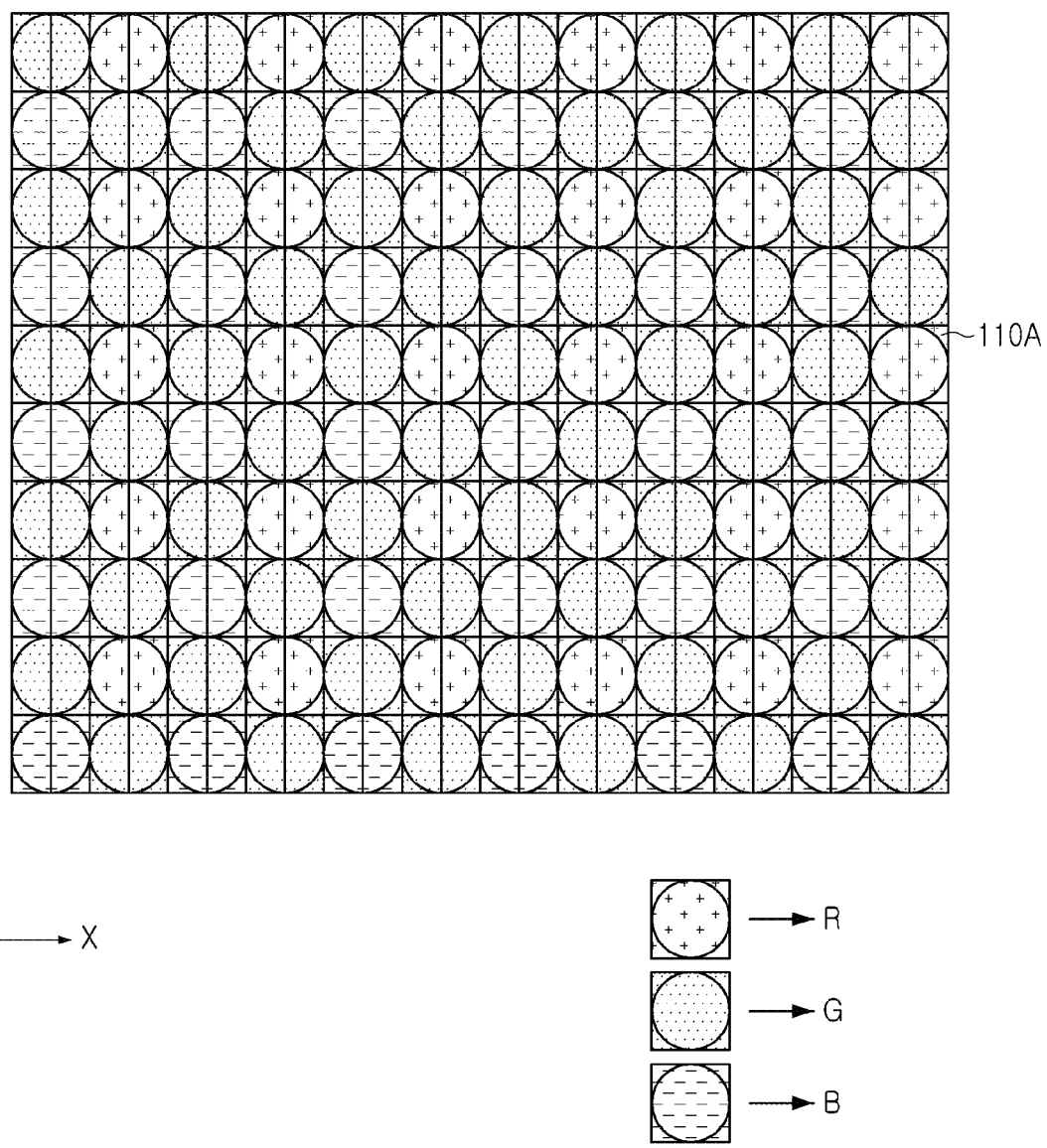
Figure 4:
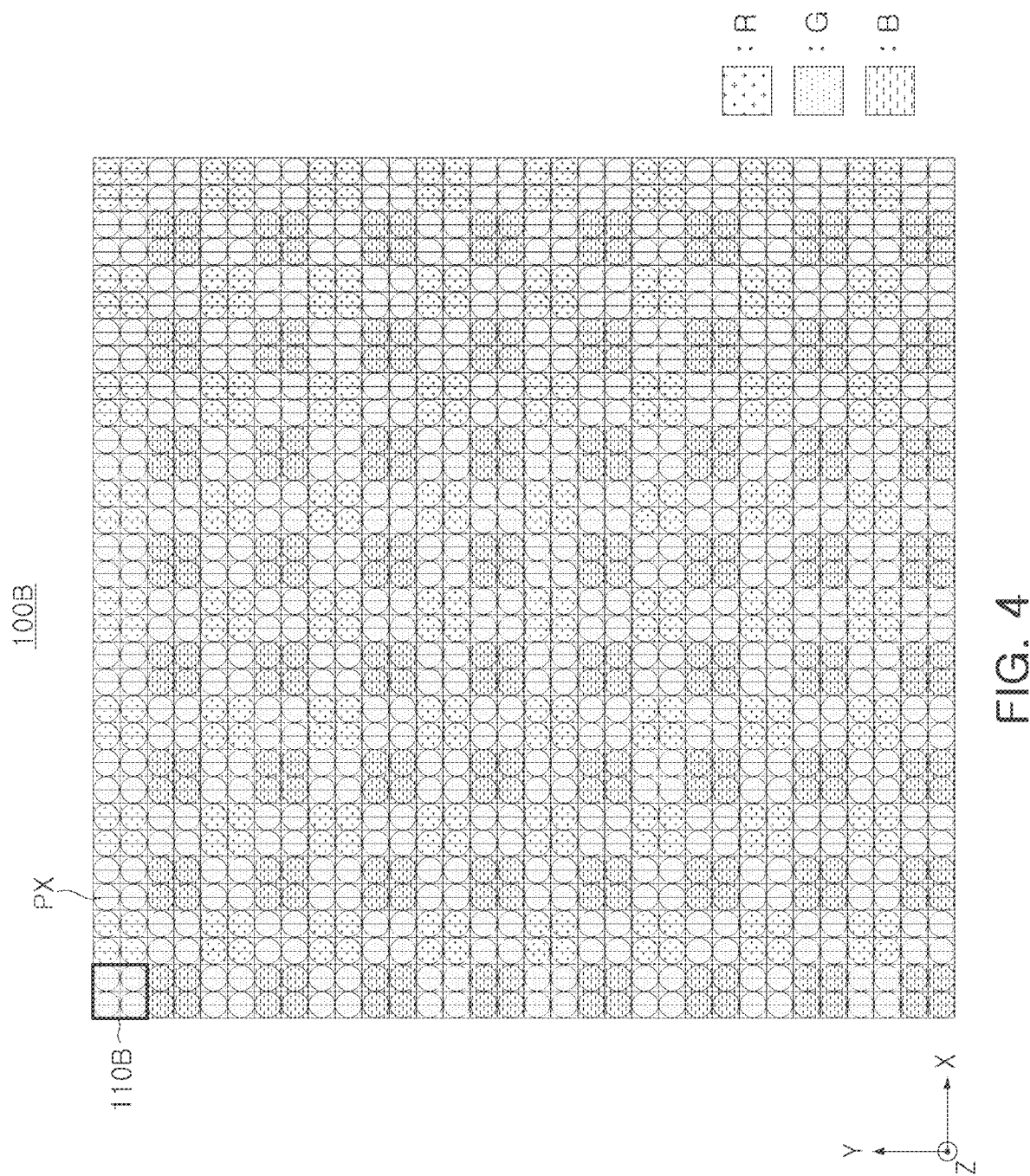

FIGS. 2 to 4 are views schematically illustrating a pixel array of an image sensor according to embodiments of inventive concepts.

First, referring to FIG. 2, a pixel array 100 of an image sensor according to an embodiment of inventive concepts may include a plurality of pixels 110 and 120. For example, the pixel array 100 may include a general pixel 110 and an autofocusing pixel 120. The general pixel 110 and the autofocusing pixel 120 may be provided in plural, respectively, and the number of each of them may be variously changed. For example, the number of general pixels 110 may be greater than the number of autofocusing pixels 120. In addition, a position of the autofocusing pixel 120 is not limited to those illustrated in FIG. 2, and may be variously changed.

The autofocusing pixel 120 may include a first photodiode and a second photodiode. In the autofocusing pixel 120, the first photodiode and the second photodiode may be arranged in one direction (the horizontal direction), and the first photodiode and the second photodiode may share one (1) microlens. According to embodiments, in a portion of the autofocusing pixels 120, the first photodiode and the second photodiode may be arranged in a direction, different from the one direction.

Referring to FIG. 3, a pixel array 100A may include a plurality of pixels 110A. Each of the plurality of pixels 110A may include a first photodiode and a second photodiode. In the embodiment illustrated in FIG. 3, each of the pixels 110A included in the pixel array 100A may be an autofocusing pixel. Similar to as described above with reference to FIG. 2, in at least a portion of the pixels 110A, the first photodiode and the second photodiode may be arranged in different directions, for example, in the vertical direction. According to embodiments, only a portion of the pixels 110A may be used for an autofocusing function.

Next, referring to FIG. 4, a pixel array 100B may include a plurality of pixel groups 110B. Each of the plurality of pixel groups 110B may include unit pixels PX. The unit pixels PX included in each of the pixel groups 110B may include color filters having the same color. In the embodiment illustrated in FIG. 4, each of the unit pixels PX may include a first photodiode and a second photodiode. According to embodiments, only a portion of the unit pixels PX may include the first photodiode and the second photodiode, or arrangement directions of the first photodiode and the second photodiode in at least a portion of the unit pixels PX may be different.

In the embodiments described with reference to FIGS. 2 to 4, a pixel internal isolation layer may be disposed between the first photodiode and the second photodiode. For example, a light-receiving area of each of the first photodiode and the second photodiode may be determined by the pixel internal isolation layer. When the pixel internal isolation layer is not correctly aligned between the first photodiode and the second photodiode, a difference between a light-receiving area of the first photodiode and a light-receiving area of the second photodiode may occur to deteriorate an autofocusing function of an image sensor.

In an embodiment of inventive concepts, a pixel internal isolation layer may be formed together with a pixel isolation layer separating the pixels from each other. For example, a trench for forming the pixel isolation layer and a trench for forming the pixel internal isolation layer may be simultaneously formed by a single process. Therefore, the pixel internal isolation layer may be accurately aligned and a difference in light-receiving area of the first photodiode and the second photodiode may be reduced and/or minimized, to limit and/or prevent deterioration of an autofocusing function of an image sensor.

Figure 5:
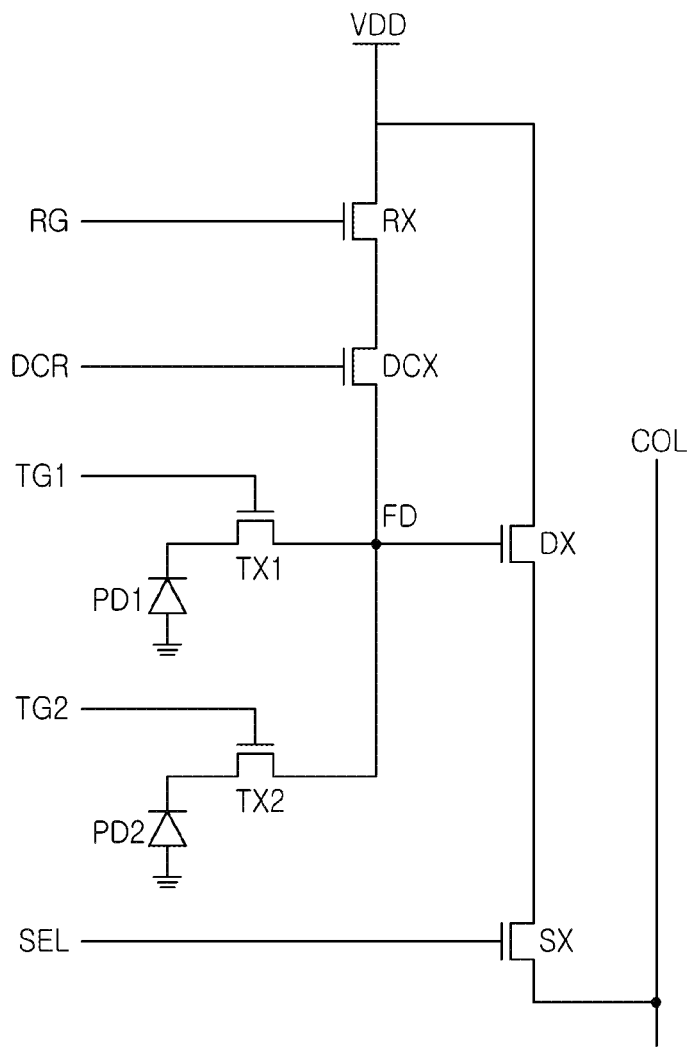
FIG. 5 is a view schematically illustrating a pixel circuit of an image sensor according to an embodiment of inventive concepts.

FIG. 5 is a view schematically illustrating a pixel circuit of an image sensor according to an embodiment of inventive concepts.

As an example, FIG. 5 may be a circuit diagram illustrating a pixel circuit of a pixel including a first photodiode and a second photodiode, separated from each other by a pixel internal isolation layer and providing an autofocusing function. The pixel circuit of the pixel providing the autofocusing function is not necessarily limited as illustrated in FIG. 5, and elements may be added or omitted as necessary.

Referring to FIG. 5, the pixel circuit may be connected to a first photodiode PD1 and a second photodiode PD2, and may output a reset voltage and a pixel voltage through a column line COL. For example, the pixel circuit may include a first transfer transistor TX1, a second transfer transistor TX2, a reset transistor RX, a driving transistor DX, a select transistor SX, and a conversion gain transistor DCX. The pixel circuit may be connected to a logic circuit of the image sensor through the column line COL. The logic circuit may acquire a reset voltage and a pixel voltage through the column line COL to generate a pixel signal.

When the first photodiode PD1 and the second photodiode PD2 are exposed to light during an exposure time period to generate charge, the first transfer transistor TX1 and the second transfer transistor TX2 may be sequentially turned on. The logic circuit may use a first pixel signal acquired after turning on the first transfer transistor TX1 and a second pixel signal acquired after turning on the second transfer transistor TX2, to provide an autofocusing function. A reset signal RG may be used to turn on and turn off the reset transistor RX. A conversion gain signal DCR may be used to turn on and turn off the conversion gain transistor DCX. A first transfer signal TG1 and a second transfer signal TG2 may be used to turn on and turn off the first transfer transistor TX1 and the second transfer transistor TX2, respectively. A selection signal SEL may be used to turn on and turn off the select transistor SX. A floating diffusion node FD may be between the first transfer transistor TX1 and the driving transistor DX and between the second transfer transistor TX2 and the conversion gain transistor DCX. The pixel circuit may be configured to receive a power supply voltage VDD through electrical connections to the reset transistor RX and driving transistor DX.

FIGS. 6 to 11 are views schematically illustrating pixels included in an image sensor according to an embodiment of inventive concepts.

Figure 6:
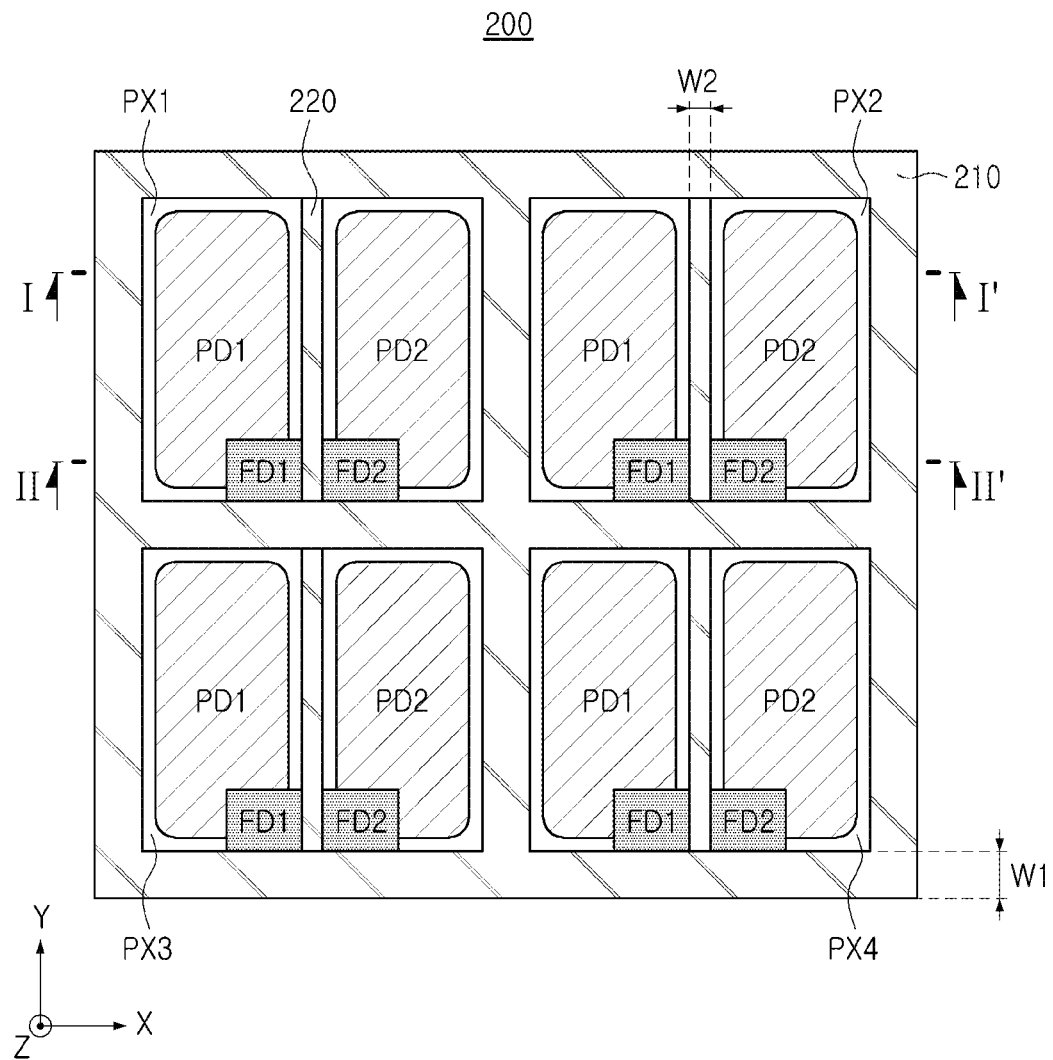
FIGS. 6 to 11 are views schematically illustrating pixels included in an image sensor according to an embodiment of inventive concepts.
Figure 7:
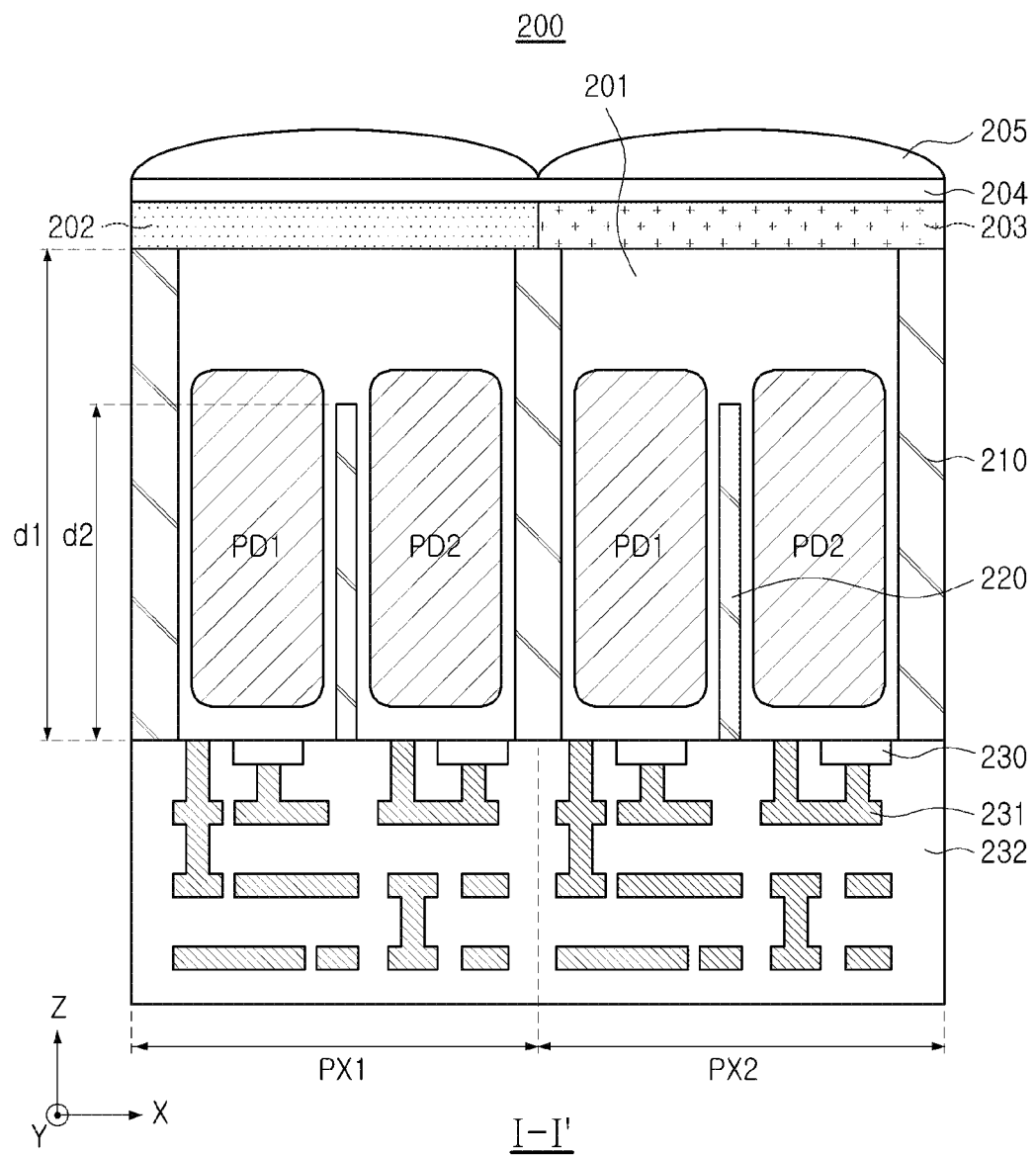
Figure 8:
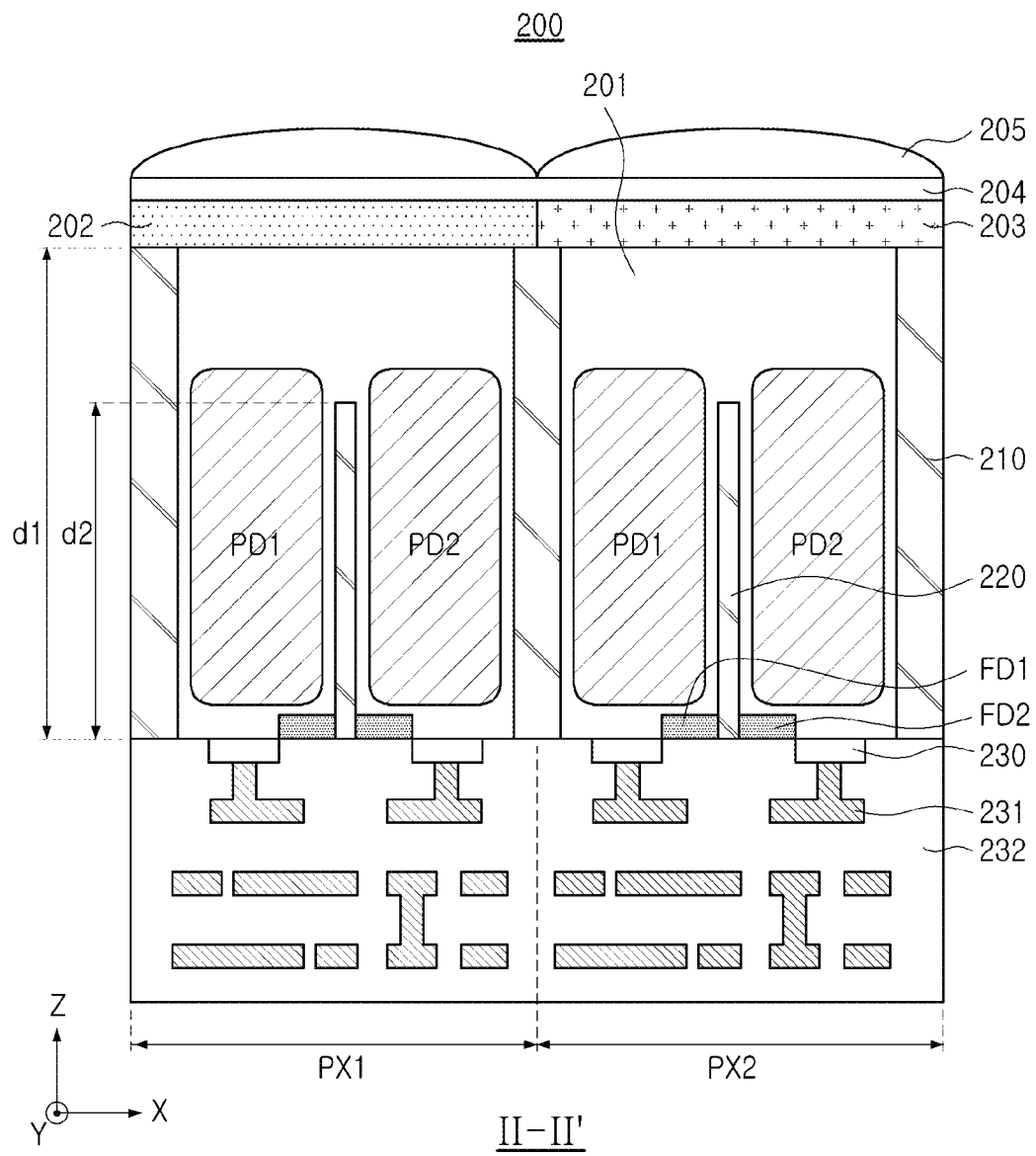

FIG. 6 may be a simplified view illustrating a portion of pixels PX1 to PX4 included in an image sensor 200 according to an embodiment of inventive concepts. FIG. 7 may be a cross-sectional view of FIG. 6 taken along cut line I-I', and FIG. 8 may be a cross-sectional view of FIG. 6 taken along cut line II-II'. Referring to FIGS. 6 to 8, a pixel isolation layer 210 may be disposed between pixels PX1 to PX4, and each of the pixels PX1 to PX4 may include a pixel internal isolation layer 220. The pixel internal isolation layer 220 may be disposed between a first photodiode PD1 and a second photodiode PD2. The pixel isolation layer 210 and the pixel internal isolation layer 220 may extend in a first direction (a Z-axis direction) within a substrate 201 including a semiconductor material.

A pixel circuit may be disposed below the first photodiode PD1 and the second photodiode PD2. For example, the pixel circuit may include a plurality of elements 230, wiring patterns 231 connected to the plurality of elements 230, an insulating layer 232 covering the plurality of elements 230 and the wiring patterns 231, and the like, and may be disposed on a first surface of the substrate 201.

The pixel circuit may include floating diffusions FD1 and FD2. For example, each of the pixels PX1 to PX4 may include a first floating diffusion FD1 and a second floating diffusion FD2. The first floating diffusion FD1 may be disposed below the first photodiode PD1, and the second floating diffusion FD2 may be disposed below the second photodiode PD2. The first floating diffusion FD1 and the second floating diffusion FD2 may be electrically connected to each other by at least one of the wiring patterns 231, and a location, an area, and the like of the first floating diffusion FD1 and the second floating diffusion FD2 may be variously changed according to embodiments.

The first floating diffusion FD1 and the second floating diffusion FD2 may be disposed on both sides of the pixel internal isolation layer 220. Elements 230 adjacent to the first floating diffusion FD1 and the second floating diffusion FD2 may be a first transfer transistor and a second transfer transistor, respectively. A gate of each of the first transfer transistor and the second transfer transistor may have a vertical structure in which at least a partial region is embedded in the substrate 201.

Each of the pixels PX1 to PX4 may include color filters 202 and 203, a light transmitting layer 204, and a microlens 205, arranged on a second surface of the substrate 201. As an example, each of the pixels PX1 to PX4 may include one (1) microlens 205 disposed on or above the first photodiode PD1 and the second photodiode PD2. Therefore, light that has passed through the one (1) microlens 205 may be directed into the first photodiode PD1 and the second photodiode PD2.

Referring to FIG. 6, the pixel isolation layer 210 may have a first width W1, and the pixel internal isolation layer 220 may have a second width W2, narrower than the first width W1. For example, the pixel internal isolation layer 220 may be configured to have a narrower width than the pixel isolation layer 210, to simultaneously form the pixel isolation layer 210 and the pixel internal isolation layer 220 by a single process. According to embodiments, the pixel isolation layer 210 and the pixel internal isolation layer 220 may be formed to have the same width. In addition, referring to FIGS. 7 and 8, in the first direction, the pixel isolation layer 210 may have a first length d1, the pixel internal isolation layer 220 may have a second length d2, and the first length d1 may be longer than the second length d2. For example, the pixel isolation layer 210 may completely pass through the substrate 201, and may extend from the first surface of the substrate 201 to the second surface of the substrate 201.

In an embodiment, the internal pixel isolation layer 220 may have a length, shorter than a length of the first photodiode PD1 and a length of the second photodiode PD2 in the first direction. Charges of the first photodiode PD1 and the second photodiode PD2 may move with the pixel internal isolation layer 220 interposed therebetween. Therefore, when light is concentrated on the first photodiode PD1 or the second photodiode PD2, excessively generated charges may move to limit and/or prevent saturation of the photodiodes PD1 and PD2.

In the embodiment illustrated in FIGS. 6 to 8, the pixel isolation layer 210 and the pixel internal isolation layer 220 may be formed by the same process, and the pixel isolation layer 210 and the pixel internal isolation layer 220 may extend from the first surface of the substrate 201 on which the pixel circuit is disposed. The pixel isolation layer 210 and the pixel internal isolation layer 220 may be formed by the same process to accurately align a position of the pixel internal isolation layer 220 within each of the pixels PX1 to PX4 and reduce and/or minimize a difference in the light-receiving area of the first photodiode PD1 and the second photodiode PD2, to improve an autofocusing function of the image sensor 200.

Figure 9:
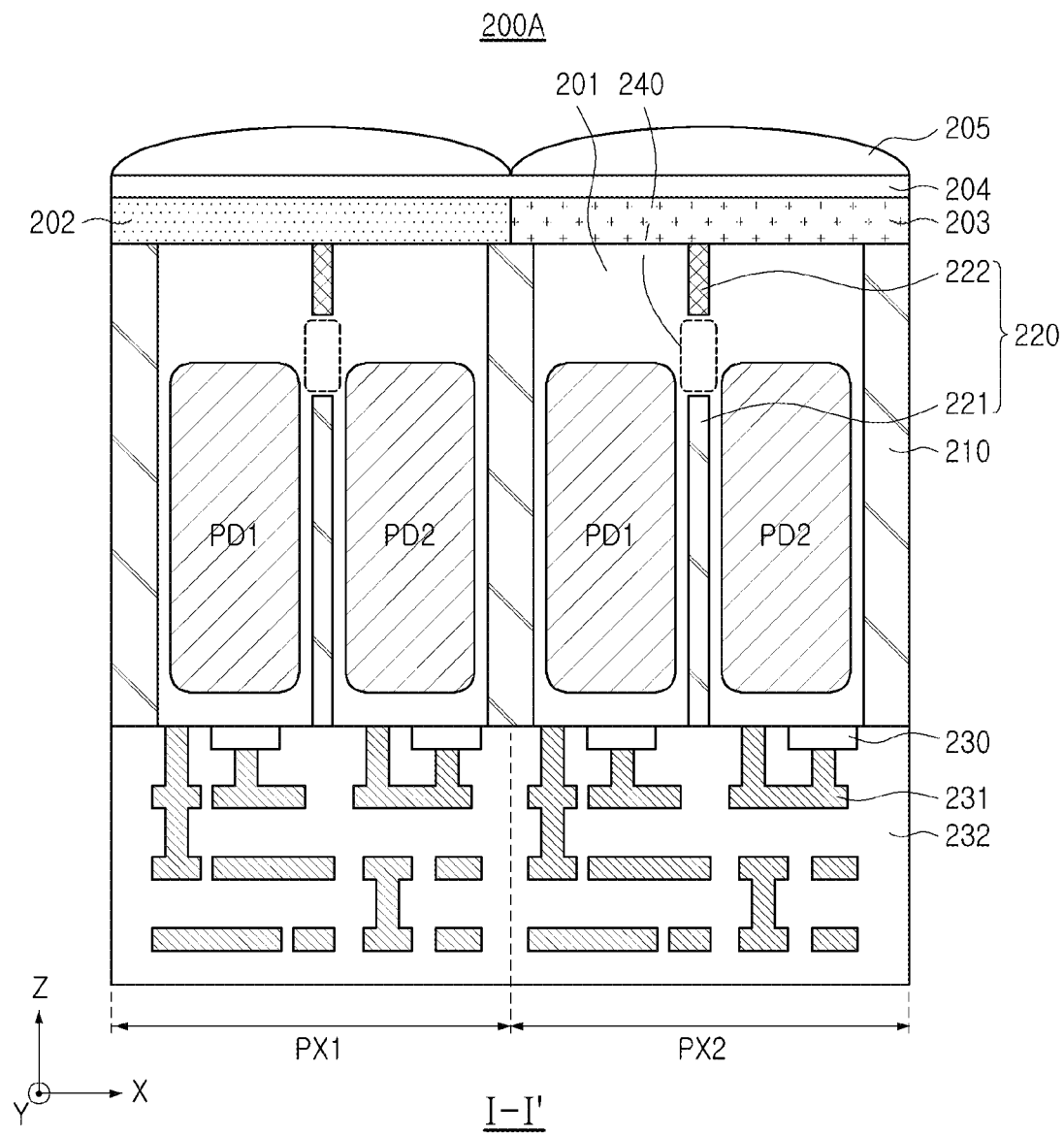

Next, referring to FIG. 9, in pixels PX1 to PX4, respectively, a pixel internal isolation layer 220 may include a first pixel internal isolation layer 221 and a second pixel internal isolation layer 222. The first pixel internal isolation layer 221 may extend from a first surface of a substrate 201 on which a pixel circuit is disposed, and the second pixel internal isolation layer 222 may extend from a second surface of the substrate 201 on which color filters 202 and 203, a light transmitting layer 204, a microlens 205, and the like are arranged. In the first direction, a length of the first pixel internal isolation layer 221 may be longer than a length of the second pixel internal isolation layer 222.

In an embodiment, the first pixel internal isolation layer 221 may be formed of a first material, and the second pixel internal isolation layer 222 may be formed of a second material, different from the first material. For example, the second material may have reflectivity higher than reflectivity of the first material. In addition, in an embodiment, the first pixel internal isolation layer 221 may be formed of a conductive material, and the second pixel internal isolation layer 222 may be formed of an insulating material. For example, the first pixel internal isolation layer 221 may be formed of polysilicon, and the second pixel internal isolation layer 222 may be formed of silicon oxide.

The second pixel internal isolation layer 222 may be formed of a material having relatively high reflectivity, to reflect light passed through the microlens 205 against the second pixel internal isolation layer 222 and direct the reflected light into the first photodiode PD1 or the second photodiode PD2. Therefore, sensitivity of an image sensor 200A may be improved. In addition, the first pixel internal isolation layer 221 may be formed of a conductive material and a predetermined bias voltage, for example, a negative voltage may be applied, to reduce dark current generated in the pixels PX1 to PX4.

Figure 10:
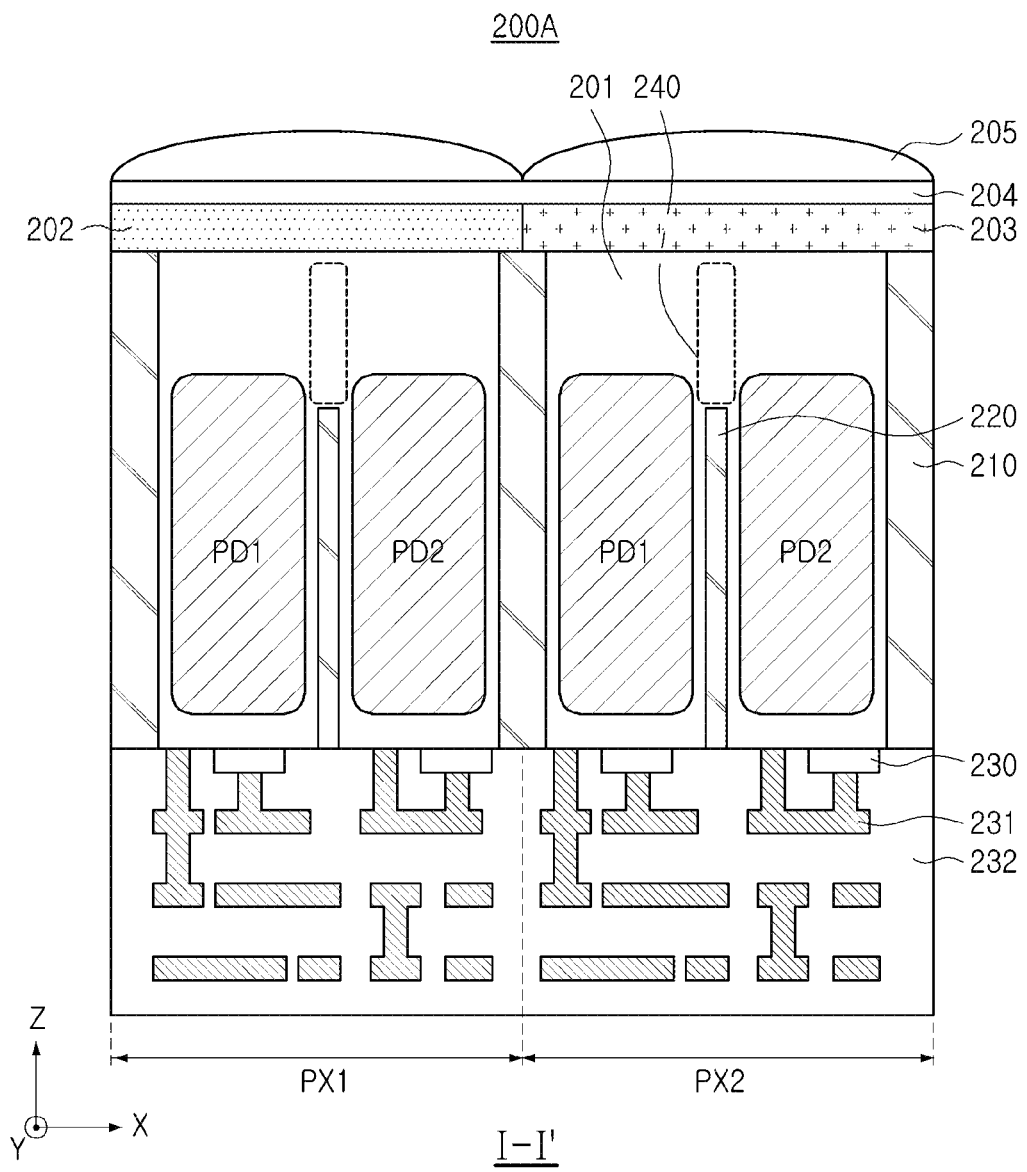

An impurity region 240 may be disposed between the first pixel internal isolation layer 221 and the second pixel internal isolation layer 222. For example, the impurity region 240 may be a region doped with a P-type impurity. The impurity region 240 between the first pixel internal isolation layer 221 and the second pixel internal isolation layer 222 may provide an efficient charge transfer path between the first photodiode PD1 and the second photodiode PD2. According to embodiments, the impurity region 240 may be doped with an N-type impurity. According to embodiments, as illustrated in FIG. 10, only an impurity region 240 may be disposed between a pixel internal isolation layer 220 and color filters 202 and 203 without a second pixel internal isolation layer 222.

In an embodiment, an impurity region 240 may be formed by a process of forming a first pixel internal isolation layer 221. For example, a trench for forming the first pixel internal isolation layer 221, extending from a first surface of a substrate 201, may be formed, and impurities may be implanted in the trench to prepare the impurity region 240. The trench for forming the first pixel internal isolation layer 221 may be first formed and the impurities may be then implanted, to reduce an alignment error between the impurity region 240 and a pixel internal isolation layer 220, and perform the impurity implantation operation with relatively low energy. Depending on the impurity implantation operation, at least a portion of the impurity region 240 may overlap a second pixel internal isolation layer 222.

Figure 11:
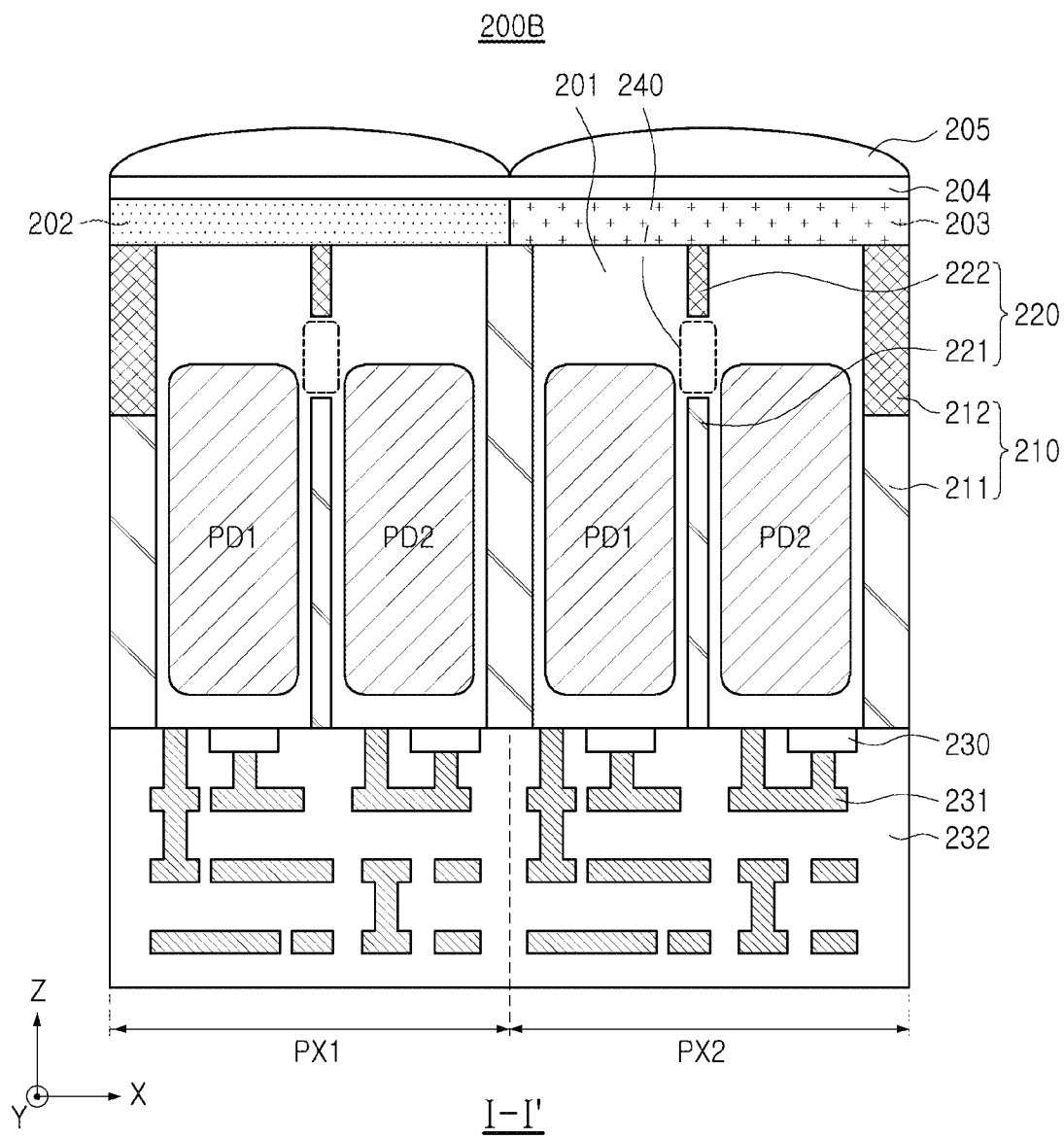

Next, referring to FIG. 11, in pixels PX1 to PX4, respectively, a pixel internal isolation layer 220 may include a first pixel internal isolation layer 221 and a second pixel internal isolation layer 222, and an impurity region 240 may be formed between the first pixel internal isolation layer 221 and the second pixel internal isolation layer 222. The first pixel internal isolation layer 221, the second pixel internal isolation layer 222, and the impurity region 240 can be understood with reference to the descriptions described above with reference to FIGS. 9 and 10.

In the embodiment illustrated in FIG. 11, a pixel isolation layer 210 may include a first pixel isolation layer 211 and a second pixel isolation layer 212. In the first direction, a length of the first pixel isolation layer 211 may be longer than a length of the second pixel isolation layer 212. Also, the second pixel isolation layer 212 may be formed of a material having reflectivity higher than reflectivity the first pixel isolation layer 211. In an embodiment, the first pixel isolation layer 211 may be formed of the same material as the first pixel internal isolation layer 221, and the second pixel isolation layer 212 may be formed of the same material as the second pixel internal isolation layer 222.

The second pixel isolation layer 212 may be formed of a material having relatively high reflectivity, to reflect portion of light passed through a microlens 205 against the second pixel isolation layer 212 and then direct the reflected light into a first photodiode PD1 or a second photodiode PD2. To reduce an amount of light absorbed by the first pixel isolation layer 211, the second pixel isolation layer 212 may be formed to have a length longer than a length of the second pixel internal isolation layer 222 in the first direction. Referring to FIG. 11, in the first direction, a length of the first pixel isolation layer 211 may be shorter than a length of the first pixel internal isolation layer 221, and a length of the second pixel isolation layer 212 may be longer than a length of the second pixel internal isolation layer 222.

FIGS. 12 to 15 are views schematically illustrating pixels included in an image sensor according to an embodiment of inventive concepts.

Figure 12:
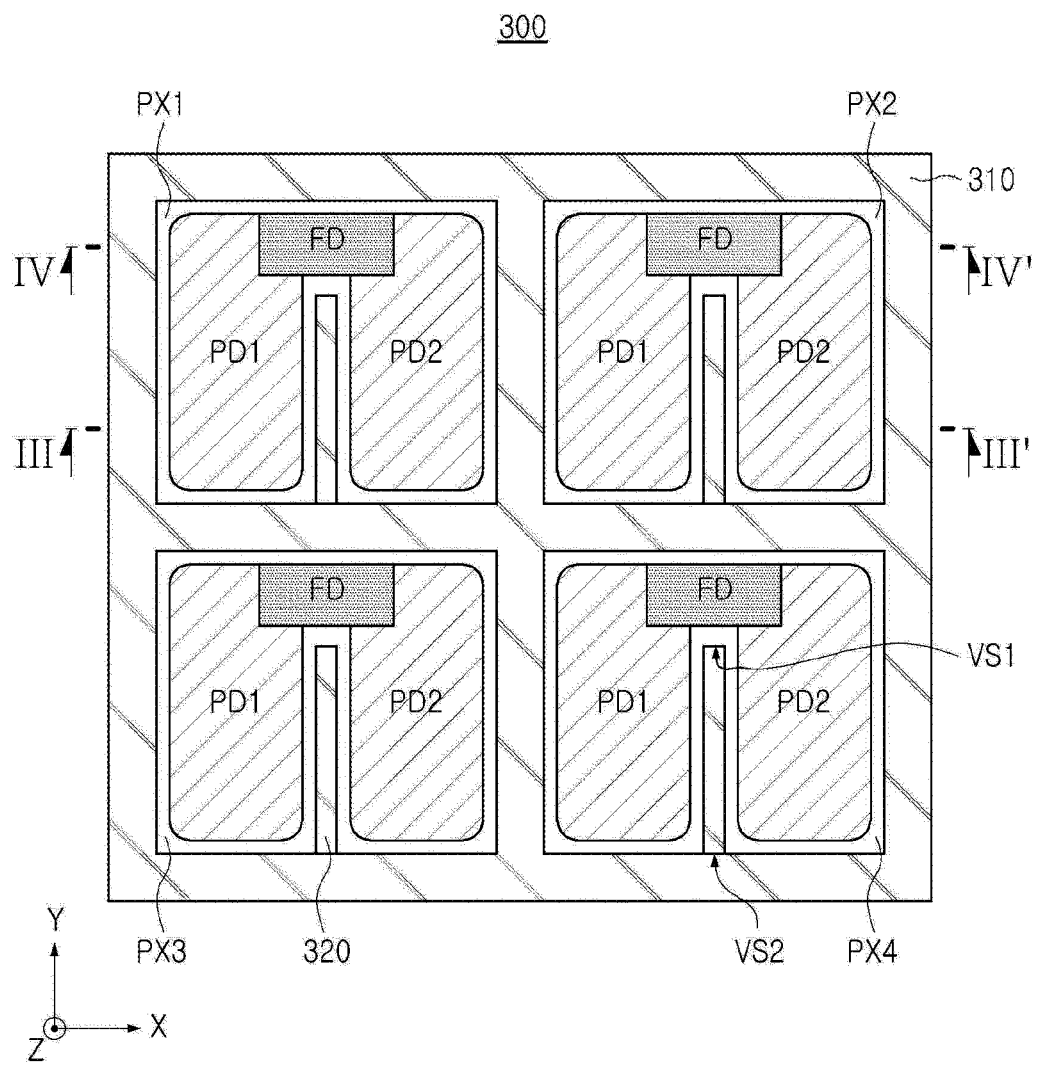
FIGS. 12 to 15 are views schematically illustrating pixels included in an image sensor according to an embodiment of inventive concepts.
Figure 13:
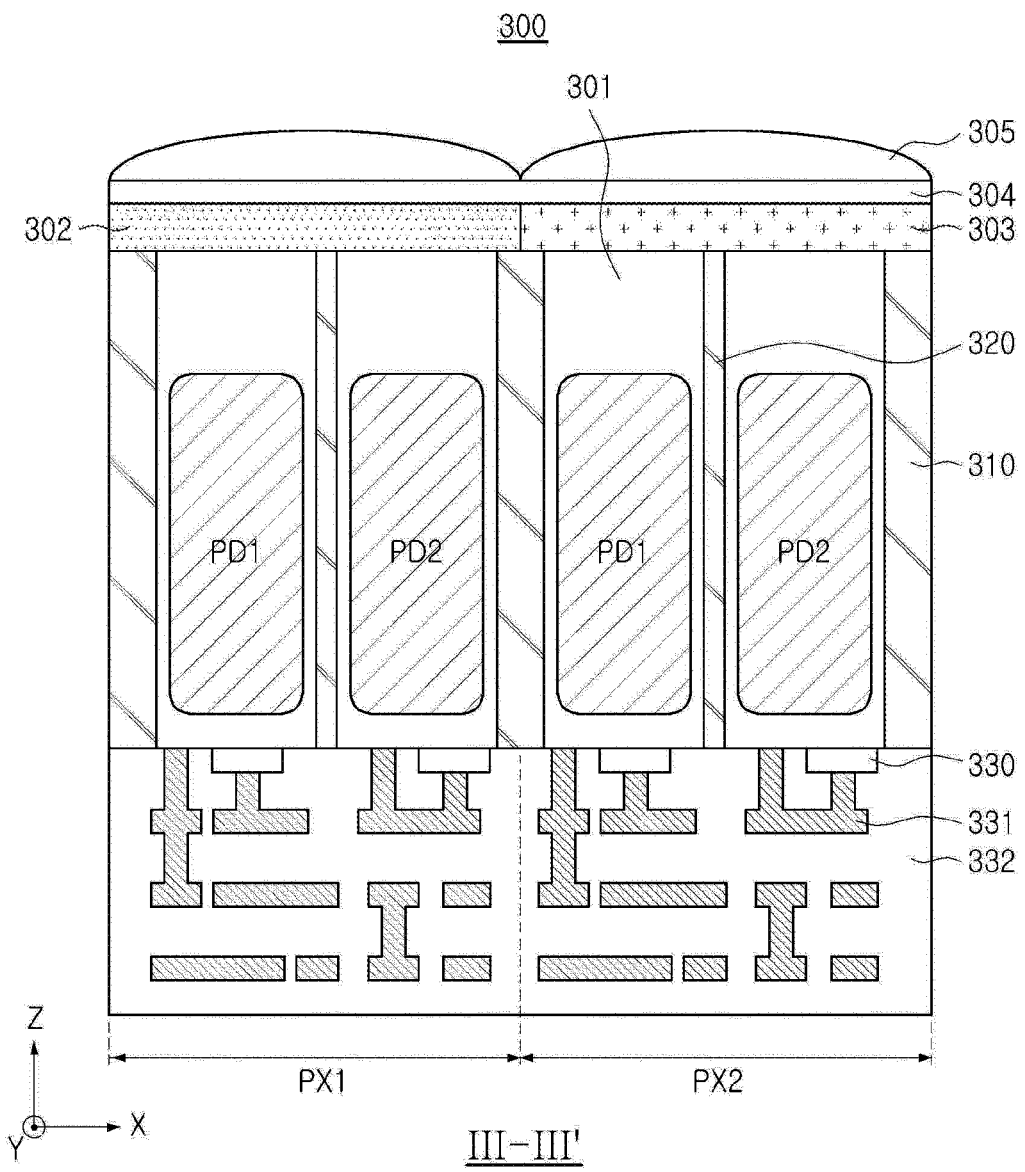
Figure 14:
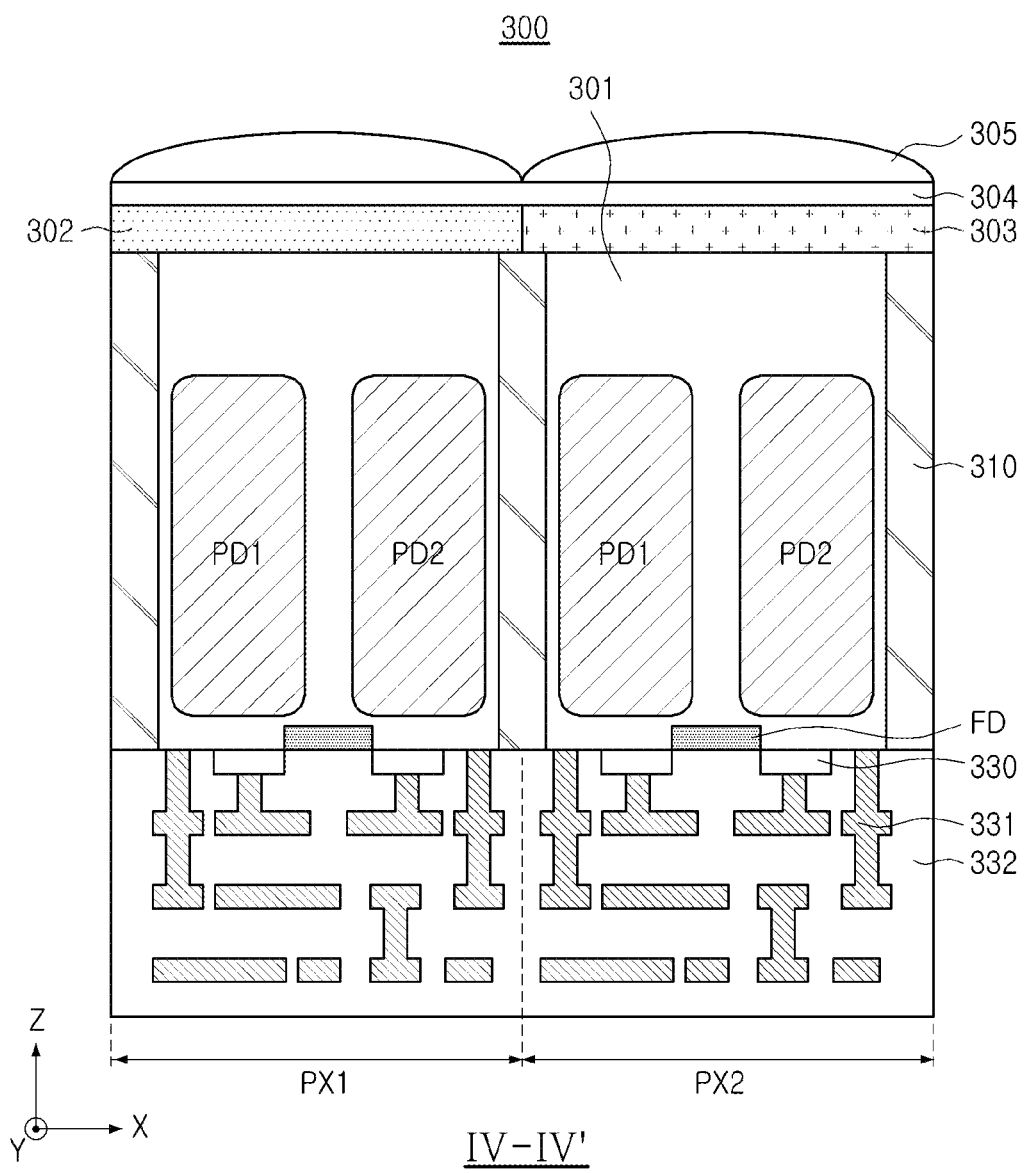
Figure 15:
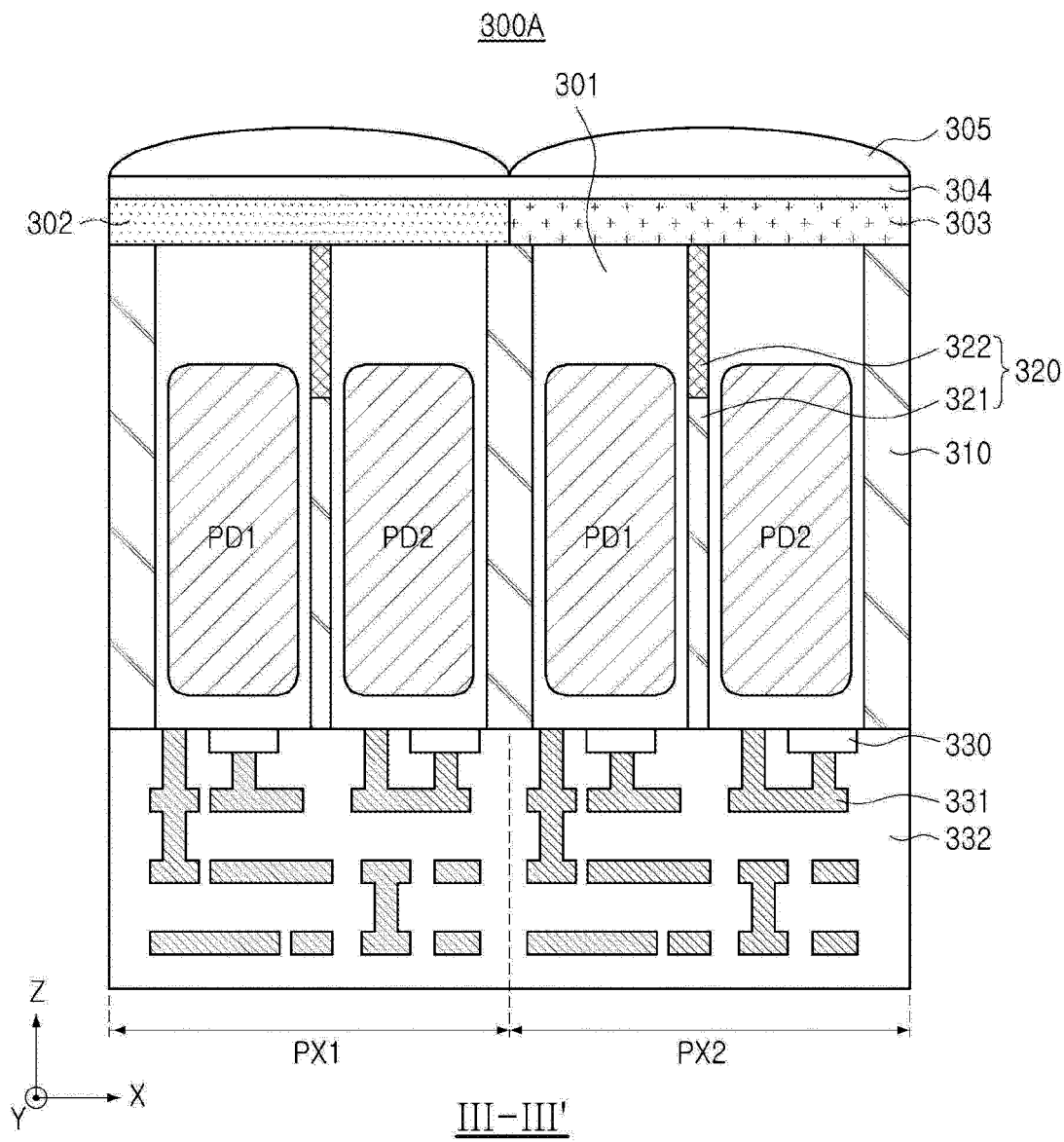

FIG. 12 may be a plan view illustrating a portion of pixels PX1 to PX4 included in an image sensor 300 according to an embodiment of inventive concepts, and FIG. 13 may be a cross-sectional view of FIG. 12 taken along cut line III-III'. FIGS. 14 and 15 may be cross-sectional views of FIG. 12 taken along cut line IV-IV'. First, referring to FIGS. 12 and 13 together, an image sensor 300 according to an embodiment may include a plurality of pixels PX1 to PX4. A pixel isolation layer 310 may be disposed between the plurality of pixels PX1 to PX4, and each of the pixels PX1 to PX4 may include a first photodiode PD1 and a second photodiode PD2, separated from each other by a pixel internal isolation layer 320. The pixel isolation layer 310 and the pixel internal isolation layer 320 may extend in the first direction (the Z-axis direction).

In the embodiment described with reference to FIGS. 12 to 15, the pixel internal isolation layer 320 may have a first vertical surface VS1 and a second vertical surface VS2. The first vertical surface VS1 and the second vertical surface VS2 may be arranged to oppose each other in a third direction (an Y-axis direction), intersecting a second direction (an X-axis direction) in which the first photodiode PD1 and the second photodiode PD2 are arranged. Referring to FIG. 12, the second vertical surface VS2 may be in direct contact with the pixel isolation layer 310, and the first vertical surface VS1 may be separated from the pixel isolation layer 310.

In an embodiment, a floating diffusion FD may be disposed between the first vertical surface VS1 and the pixel isolation layer 310. Therefore, in each of the pixels PX1 to PX4, the first photodiode PD1 and the second photodiode PD2 may share the floating diffusion FD. In addition, since excessively generated charges in at least one of the first photodiode PD1 and/or the second photodiode PD2 may move through the space between the first vertical surface VS1 and the pixel isolation layer 310, the pixel internal isolation layer 320 may completely pass through a substrate 301, as illustrated in FIGS. 13 and 15. As an example, the pixel internal isolation layer 320 may extend from a first surface of the substrate 301 on which a pixel circuit is disposed to a second surface of the substrate 301 on which color filters 302 and 303, a light transmitting layer 304, and a microlens 305 are arranged.

Referring to FIG. 15, a pixel internal isolation layer 320 may include a first pixel internal isolation layer 321 and a second pixel internal isolation layer 322. The first pixel internal isolation layer 321 may be formed of a first material, the second pixel internal isolation layer 322 may be formed of a second material, different from the first material, and the second material may have reflectivity higher than reflectivity of the first material. Therefore, light passed through a microlens 305 and directly incident on the pixel internal isolation layer 320, not a first photodiode PD1 and a second photodiode PD2, may not be absorbed by and may be reflected against the pixel internal isolation layer 320, and may be directed into the first photodiode PD1 or the second photodiode PD2, to improve sensitivity of an image sensor 300A.

For example, the first material may be polysilicon, and the second material may be silicon oxide. In addition, although FIG. 15 illustrates that an interface between the first pixel internal isolation layer 321 and the second pixel internal isolation layer 322 is located to be lower than upper surfaces of the first photodiode PD1 and the second photodiode PD2, the interface between the first pixel internal isolation layer 321 and the second pixel internal isolation layer 322 may be located to be higher than the upper surfaces of the first photodiode PD1 and the second photodiode PD2.

For example, in pixels PX1 to PX4, respectively, the second internal isolation layer 322 may be in contact with a pixel isolation layer 310 in the third direction. For example, in the third direction, the second pixel internal isolation layer 322 may be connected to the pixel isolation layer 310 on both sides of each of the pixels PX1 to PX4. In this case, a length of the first pixel internal isolation layer 321 may be shorter than a length of the second pixel internal isolation layer 322 in the third direction.

Figure 16:
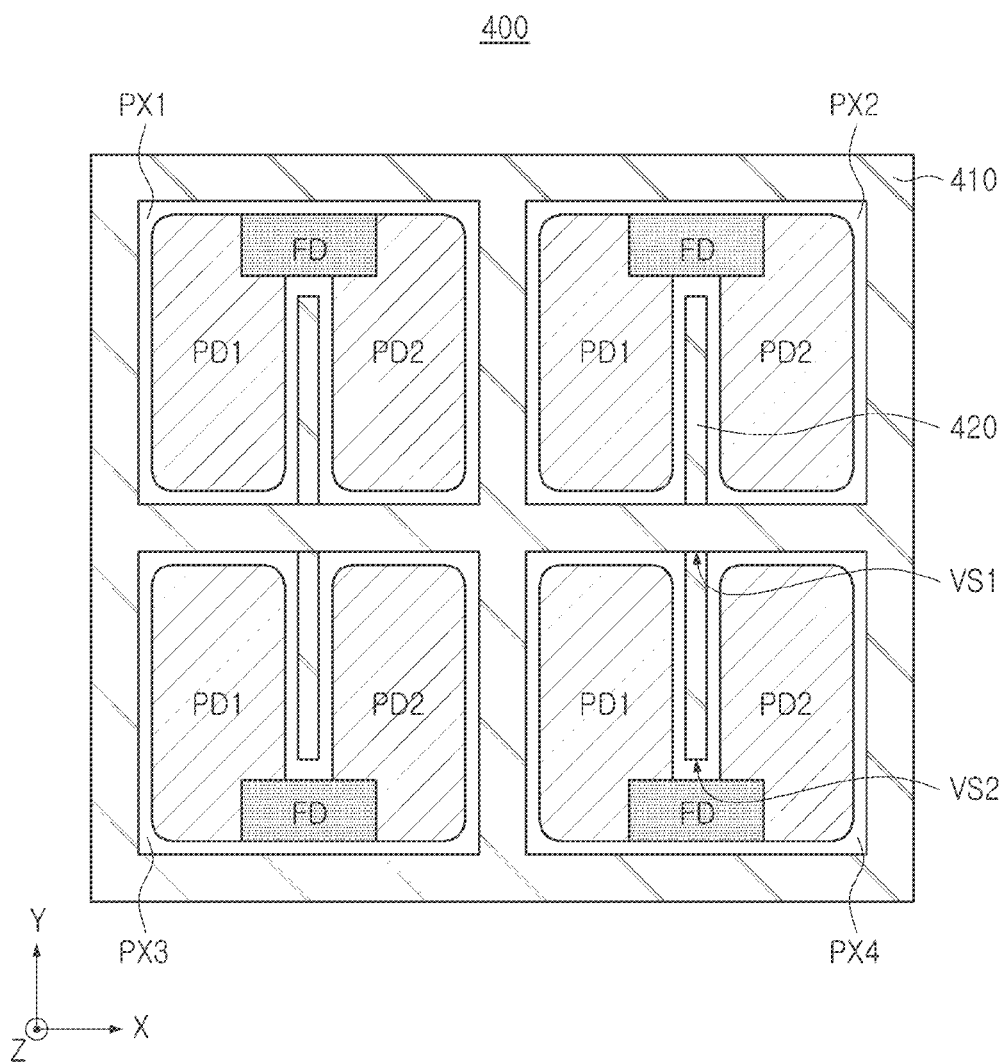
FIGS. 16 and 17 are views schematically illustrating pixels included in an image sensor according to an embodiment of inventive concepts.
Figure 17:
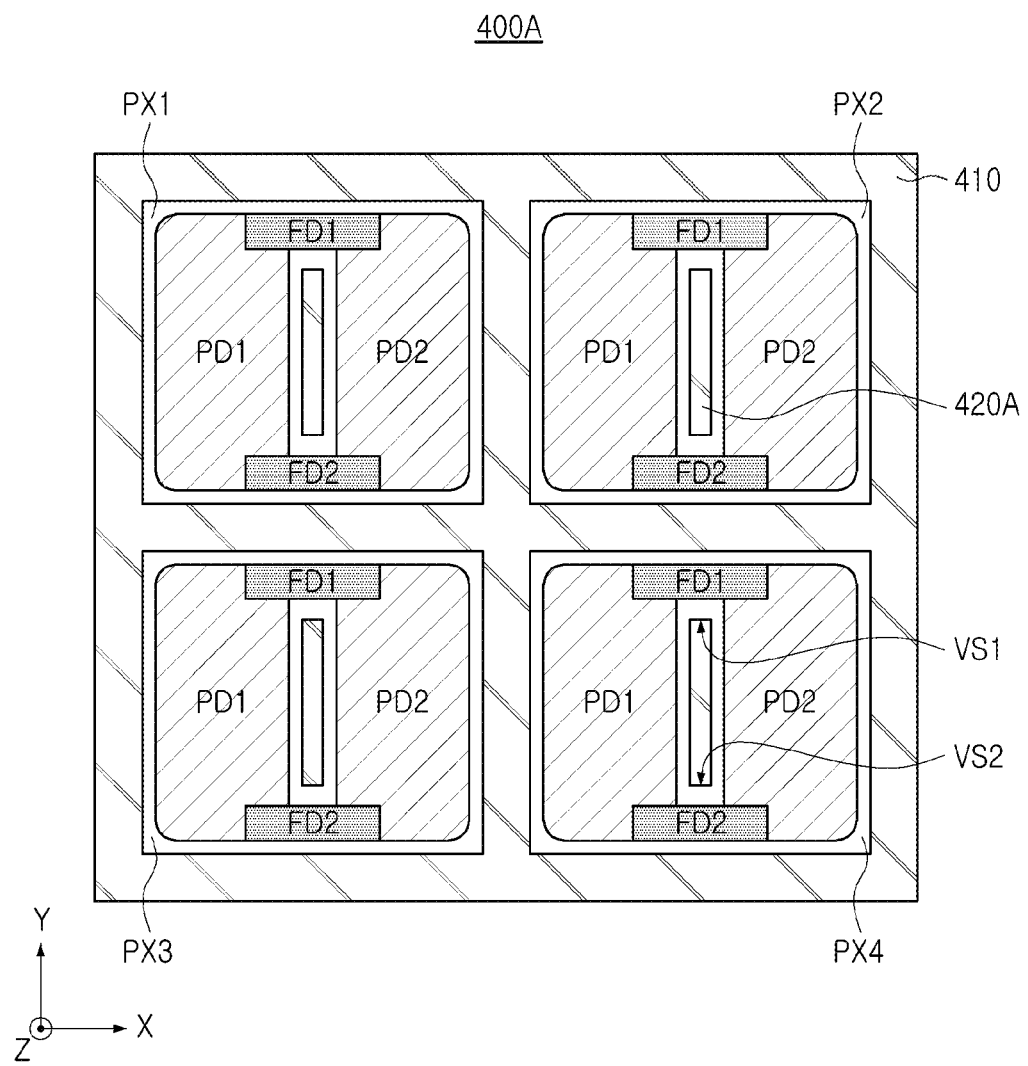

FIGS. 16 and 17 are views schematically illustrating pixels included in an image sensor according to an embodiment of inventive concepts.

In the embodiments illustrated in FIGS. 16 and 17, image sensors 400 and 400A may include a plurality of pixels PX1 to PX4 separated by a pixel isolation layer 410, respectively. Each of the plurality of pixels PX1 to PX4 may include a pixel internal isolation layer 420, a first photodiode PD1, and a second photodiode PD2. First, referring to FIG. 16, the pixel internal isolation layer 420 may include a first vertical surface VS1 and a second vertical surface VS2, and one of the first vertical surface VS1 and the second vertical surface VS2 may be in direct contact with the pixel isolation layer 410, the other thereof may be separated from the pixel isolation layer 410. In addition, in the embodiment illustrated in FIG. 16, pixels adjacent to each other in the third direction (the Y-axis direction), for example, a first pixel PX1 and a third pixel PX3 may form a structure in which the first pixel PX1 and the third pixel PX3 are vertically symmetrical to each other.

In the embodiment illustrated in FIG. 17, a first vertical surface VS1 and a second vertical surface VS2 of a pixel internal isolation layer 420A may be separated from a pixel isolation layer 410. Referring to FIG. 17, in the third direction (the Y-axis direction), a first floating diffusion FD1 may be disposed between the first vertical surface VS1 and the pixel isolation layer 410, and a second floating diffusion FD2 may be disposed between the second vertical surface VS2 and the pixel isolation layer 410. The first floating diffusion FD1 and the second floating diffusion FD2 may be electrically connected to each other by a wiring pattern or the like. According to embodiments, only one of the first floating diffusion FD1 and the second floating diffusion FD2 may be disposed in each of the pixels PX1 to PX4.

Also in the embodiments illustrated in FIGS. 16 and 17, each of the pixel internal isolation layers 420 and 420A may include a first internal isolation layer and a second internal isolation layer. The first internal isolation layer and the second internal isolation layer may be in direct contact with each other or may be separated from each other. When the first internal isolation layer and the second internal isolation layer are separated from each other, an impurity region may be disposed therebetween. In addition, the first internal isolation layer and the second internal isolation layer may have different shapes. In an embodiment, the first internal isolation layer and the second internal isolation layer may have different lengths in the third direction. Alternatively, the impurity region may be formed between the first internal isolation layer and a color filter without the second internal isolation layer.

Figure 18:
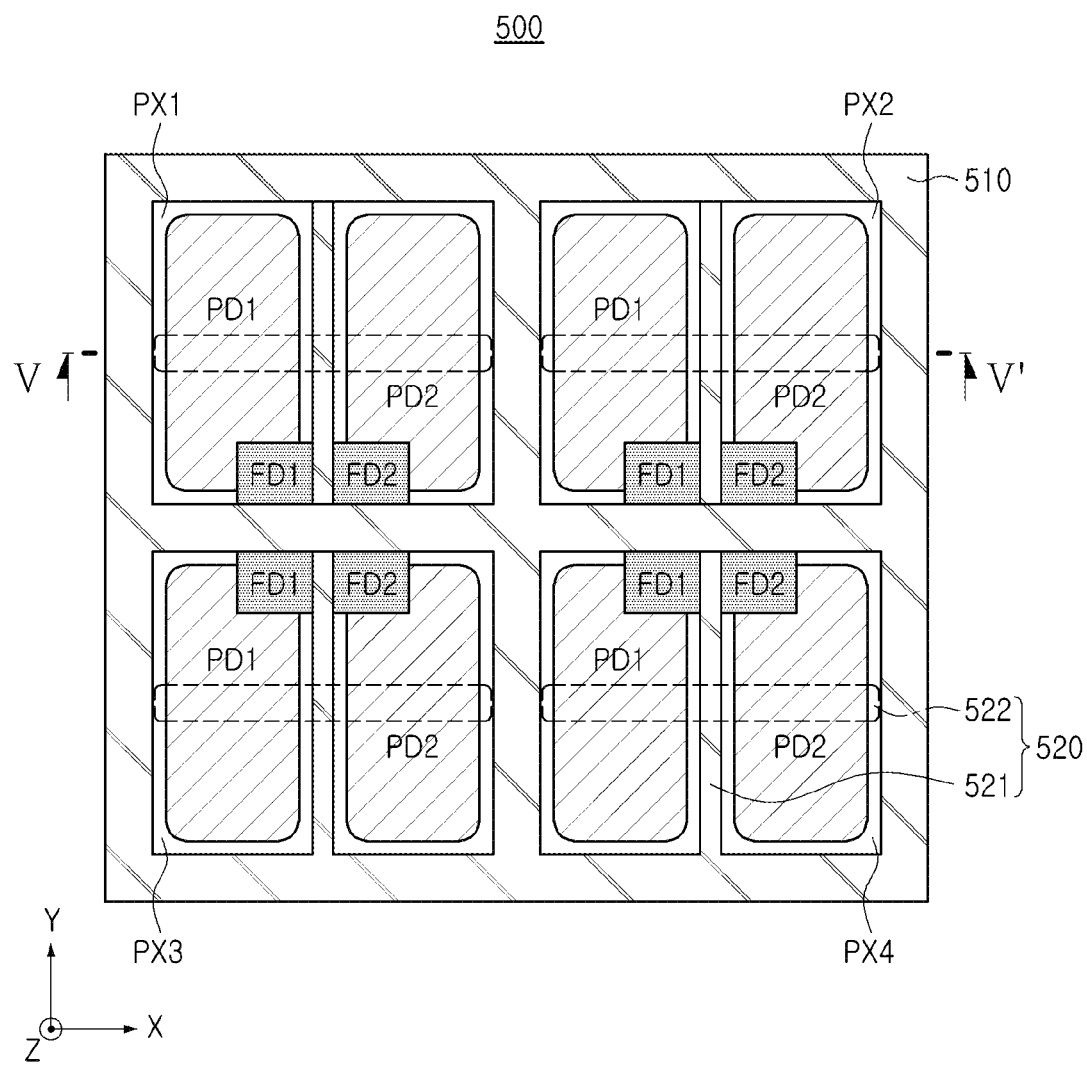
FIGS. 18 and 19 are views schematically illustrating pixels included in an image sensor according to an embodiment of inventive concepts.
Figure 19:
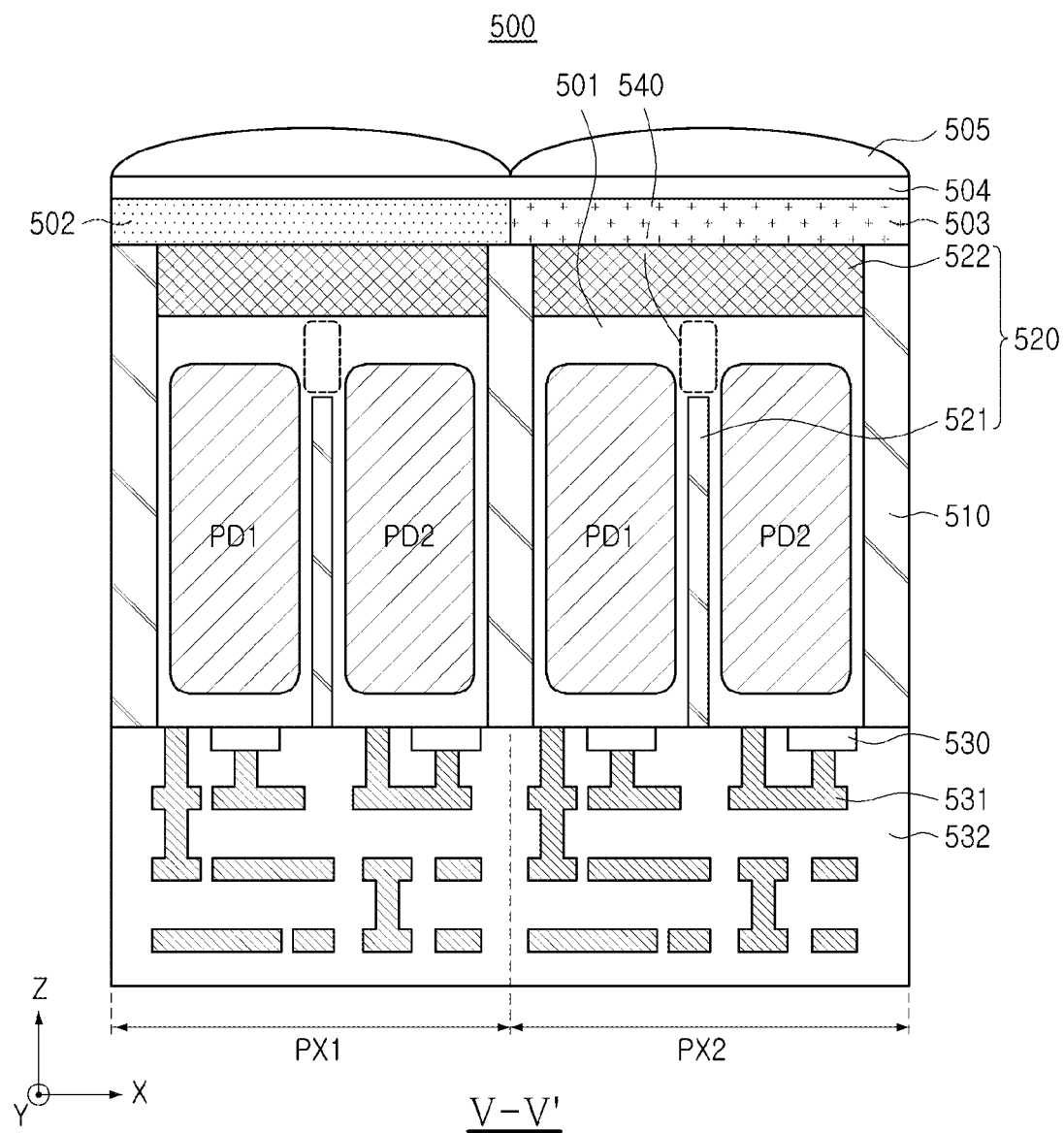

FIGS. 18 and 19 are views schematically illustrating pixels included in an image sensor according to an embodiment of inventive concepts.

FIG. 18 may be a simplified view illustrating a portion of pixels PX1 to PX4 included in an image sensor 500 according to an embodiment of inventive concepts, and FIG. 19 may be a cross-sectional view of FIG. 18 taken along cut line V-V'. Pixels PX1 to PX4 may be separated from each other by a pixel isolation layer 510, and in each of the pixels PX1 to PX4, a first photodiode PD1 and a second photodiode PD2 may be separated from each other by a pixel internal isolation layer 520. The pixel isolation layer 510 and the pixel internal isolation layer 520 may extend inside a substrate 501 in the first direction (the Z-axis direction).

The pixel isolation layer 510 may extend from a first surface of the substrate 501 to a second surface of the substrate 501. For example, the first surface may be a surface on which a plurality of elements 530, wiring patterns 531, insulating layer 532, and the like are arranged, and the second surface may be a surface on which color filters 502 and 503, a light transmitting layer 504, a microlens 505, and the like are arranged.

The pixel internal isolation layer 520 may include a first pixel internal isolation layer 521 and a second pixel internal isolation layer 522. The first pixel internal isolation layer 521 and the second pixel internal isolation layer 522 may be intersected on the first surface of the substrate 501. The first photodiode PD1 and the second photodiode PD2 may be separated from each other by the first pixel internal isolation layer 521, and the second pixel internal isolation layer 522 may not overlap the first photodiode PD1 and the second photodiode PD2 in the second direction (the X-axis direction) and the third direction (the Y-axis direction).

Referring to FIG. 18, on the first surface, the second pixel internal isolation layer 522 may extend in the second direction, and the first pixel internal isolation layer 521 may extend in the third direction. Referring to FIG. 19, the first pixel internal isolation layer 521 and the second pixel internal isolation layer 522 may be separated from each other in the first direction, and an impurity region 540 may be formed therebetween. The first pixel internal isolation layer 521 is illustrated to have a length shorter than a length of the first photodiode PD1 and a length of the second photodiode PD2 in the first direction, but is not limited thereto.

The first pixel internal isolation layer 521 and the second pixel internal isolation layer 522 may be formed of different materials. For example, the first pixel internal isolation layer 521 may be formed of a conductive material, and the second pixel internal isolation layer 522 may be formed of an insulating material. In addition, in an embodiment, the second pixel internal isolation layer 522 may be formed to have reflectivity higher than reflectivity of the first pixel internal isolation layer 521. In this case, light passed through the microlens 505 may be reflected from the second pixel internal isolation layer 522, and may be then direct the reflected light into the first photodiode PD1 or the second photodiode PD2.

On the first surface of the substrate 501, a width of the first pixel internal isolation layer 521 and a width of the second pixel internal isolation layer 522 may be equal to or narrower than a width of the pixel isolation layer 510. In an embodiment, the first pixel internal isolation layer 521 and the second pixel internal isolation layer 522 may have the same width.

Figure 20:
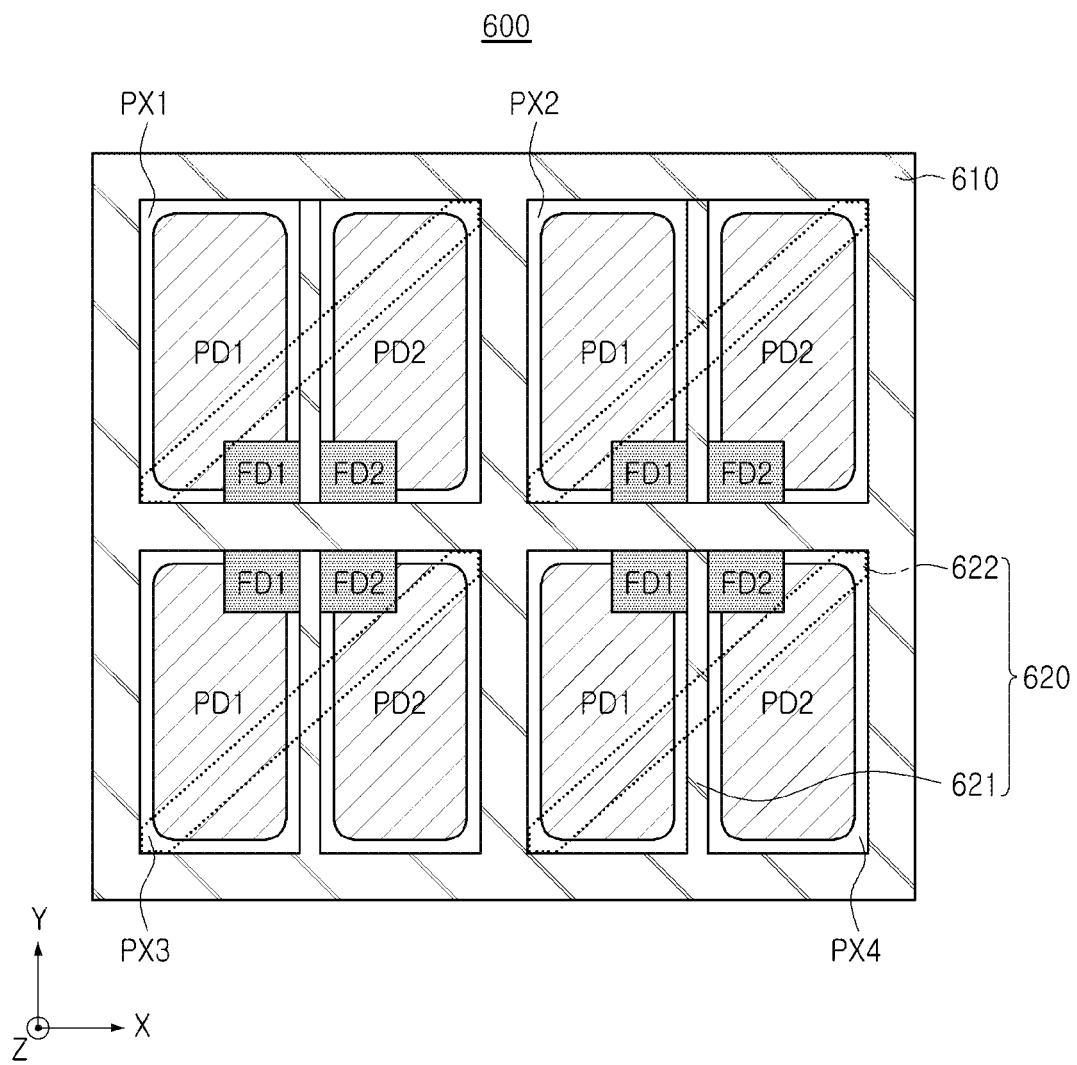
FIGS. 20 to 22 are views schematically illustrating pixels included in an image sensor according to an embodiment of inventive concepts.
Figure 21:
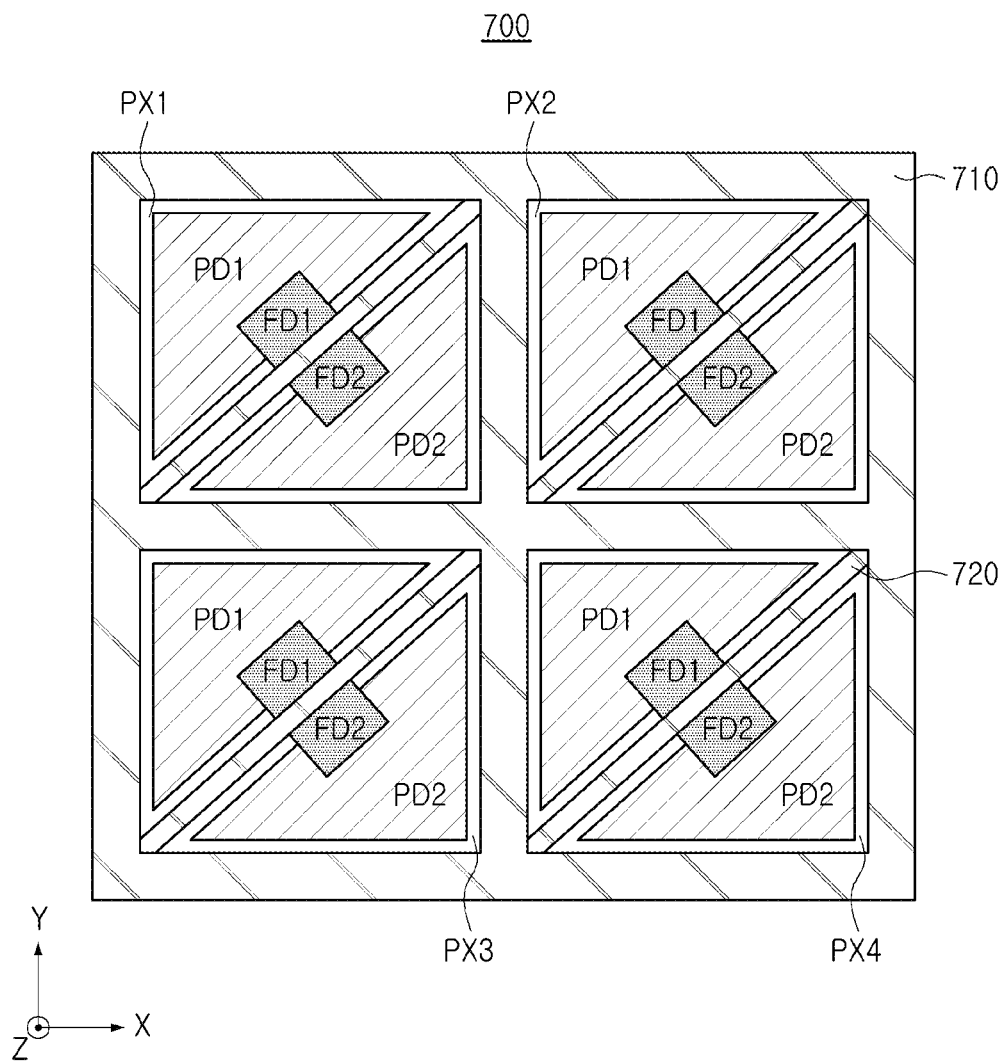
Figure 22:
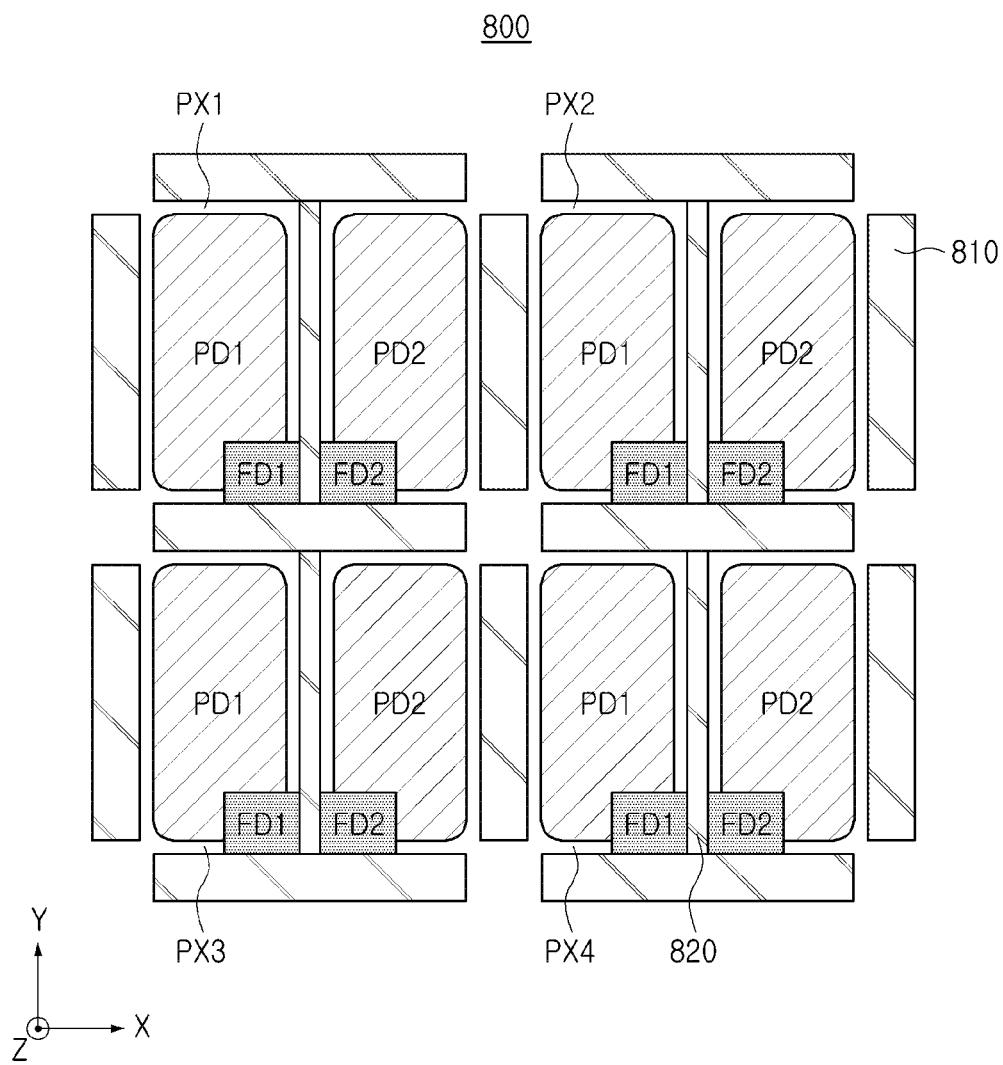

FIGS. 20 to 22 are views schematically illustrating pixels included in an image sensor according to an embodiment of inventive concepts.

First, referring to FIG. 20, pixels PX1 to PX4 of an image sensor 600 may be separated from each other by a pixel isolation layer 610, and each of the pixels PX1 to PX4 may include a first pixel internal isolation layer 621 and a second pixel internal isolation layer 622. Similar to the embodiment described above with reference to FIGS. 18 and 19, the first pixel internal isolation layer 621 and the second pixel internal isolation layer 622 may be separated from each other in the first direction (the Z-axis direction). Also, the second pixel internal isolation layer 622 may not overlap a first photodiode PD1 and a second photodiode PD2 in the second direction (the X-axis direction) and the third direction (the Y-axis direction).

In the embodiment illustrated in FIG. 20, the second pixel internal isolation layer 622 may extend in each of the pixels PX1 to PX4 in a diagonal direction. According to embodiments, in at least a portion of the pixels PX1 to PX4, the second pixel internal isolation layer 622 may extend in different directions. For example, in a first pixel PX1, the second pixel internal isolation layer 622 may extend in a direction of 45 degrees with respect to the second direction. In a second pixel PX2, the second pixel internal isolation layer 622 may extend in a direction of 135 degrees with respect to the second direction.

As illustrated in FIG. 20, the second pixel internal isolation layer 622 may be disposed in the diagonal direction, to use pixel signals acquired from each of the first photodiode PD1 and the second photodiode PD2 in implementing autofocusing functions in different directions. As an example, in the embodiment illustrated in FIG. 20, the pixel signals acquired from each of the first photodiode PD1 and the second photodiode PD2 of the first pixel PX1 may be also used to implement an autofocusing function in the vertical direction. In the embodiment illustrated in FIG. 20, since the second pixel internal isolation layer 622 may extend in the diagonal direction, a length of the second pixel internal isolation layer 622 may be longer than a length of the first pixel internal isolation layer 621, on a plane parallel to an upper surface of a substrate.

Next, referring to FIG. 21, pixels PX1 to PX4 of an image sensor 700 may be separated by a pixel isolation layer 710, and each of the pixels PX1 to PX4 may include a pixel internal isolation layer 720 extending in the diagonal direction. Therefore, as illustrated in FIG. 21, a first photodiode PD1 and a second photodiode PD2 may have a different shape, as compared to those of the image sensors 200, 300, 400, 500, and 600 according to the above-described embodiments. Each of the pixels PX1 to PX4 may include a first floating diffusion FD1 and a second floating diffusion FD2, and the first floating diffusion FD1 and the second floating diffusion FD2 may be electrically connected to each other by a wiring pattern or the like. In addition, according to embodiments, in at least a portion of the pixels PX1 to PX4, the pixel internal isolation layer 720 may extend in a diagonal direction, different from that illustrated in FIG. 21.

Next, in the embodiment illustrated in FIG. 22, a pixel isolation layer 810 disposed between pixels PX1 to PX4 in an image sensor 800 may be separated as a plurality of regions. Referring to FIG. 22, each of the pixels PX1 to PX4 may be surrounded by the pixel isolation layer 810 in the second direction (the X-axis direction) and the third direction (the Y-axis direction), and a pixel internal isolation layer 820 may be connected to a pair of pixel isolation layers 810 separated from each other in the third direction. Therefore, in the embodiment illustrated in FIG. 22, at least a portion of the pixel isolation layer 810 may be separated without being connected to the pixel internal isolation layer 820.

FIGS. 23 to 26 are views schematically illustrating pixels included in an image sensor according to an embodiment of inventive concepts.

Figure 23:
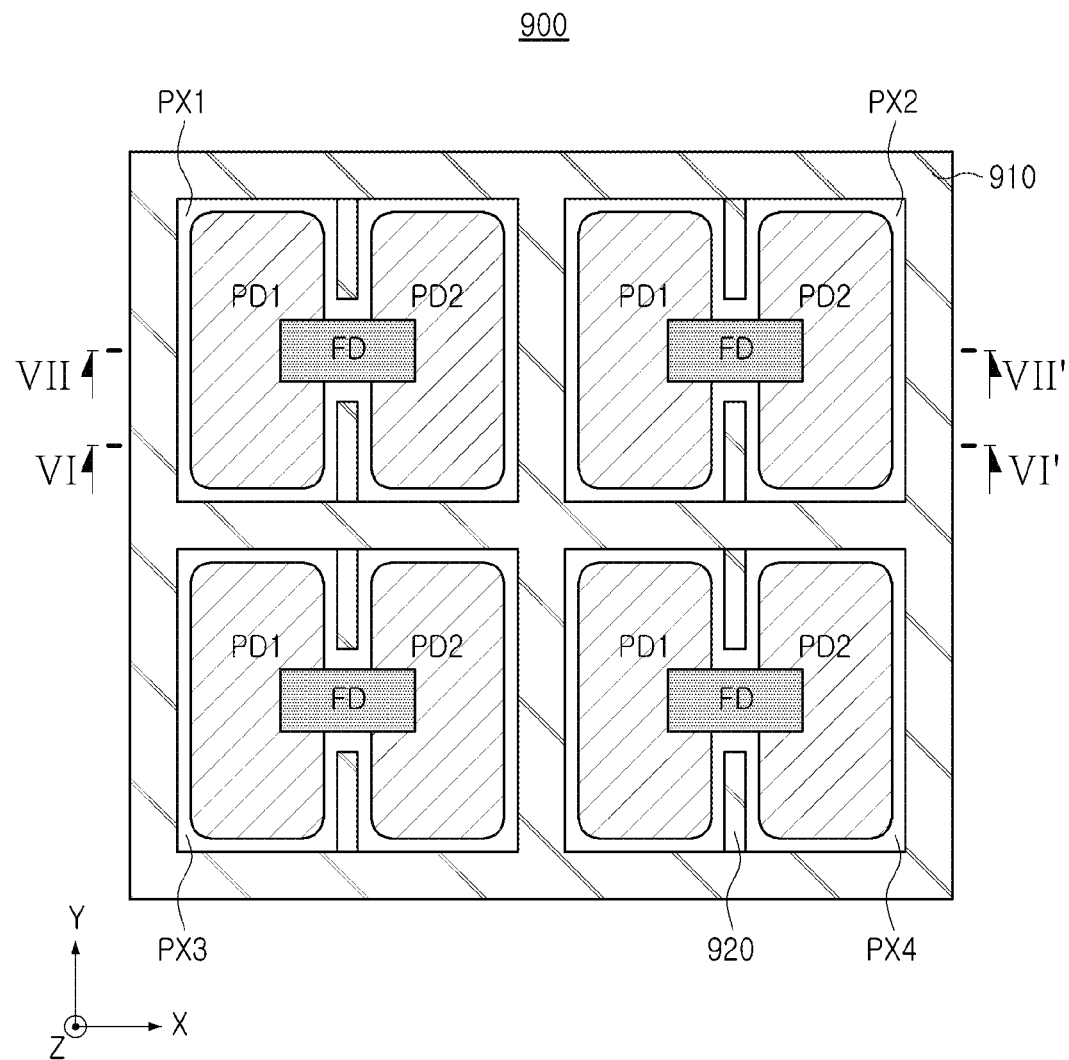
FIGS. 23 to 26 are views schematically illustrating pixels included in an image sensor according to an embodiment of inventive concepts.
Figure 25:
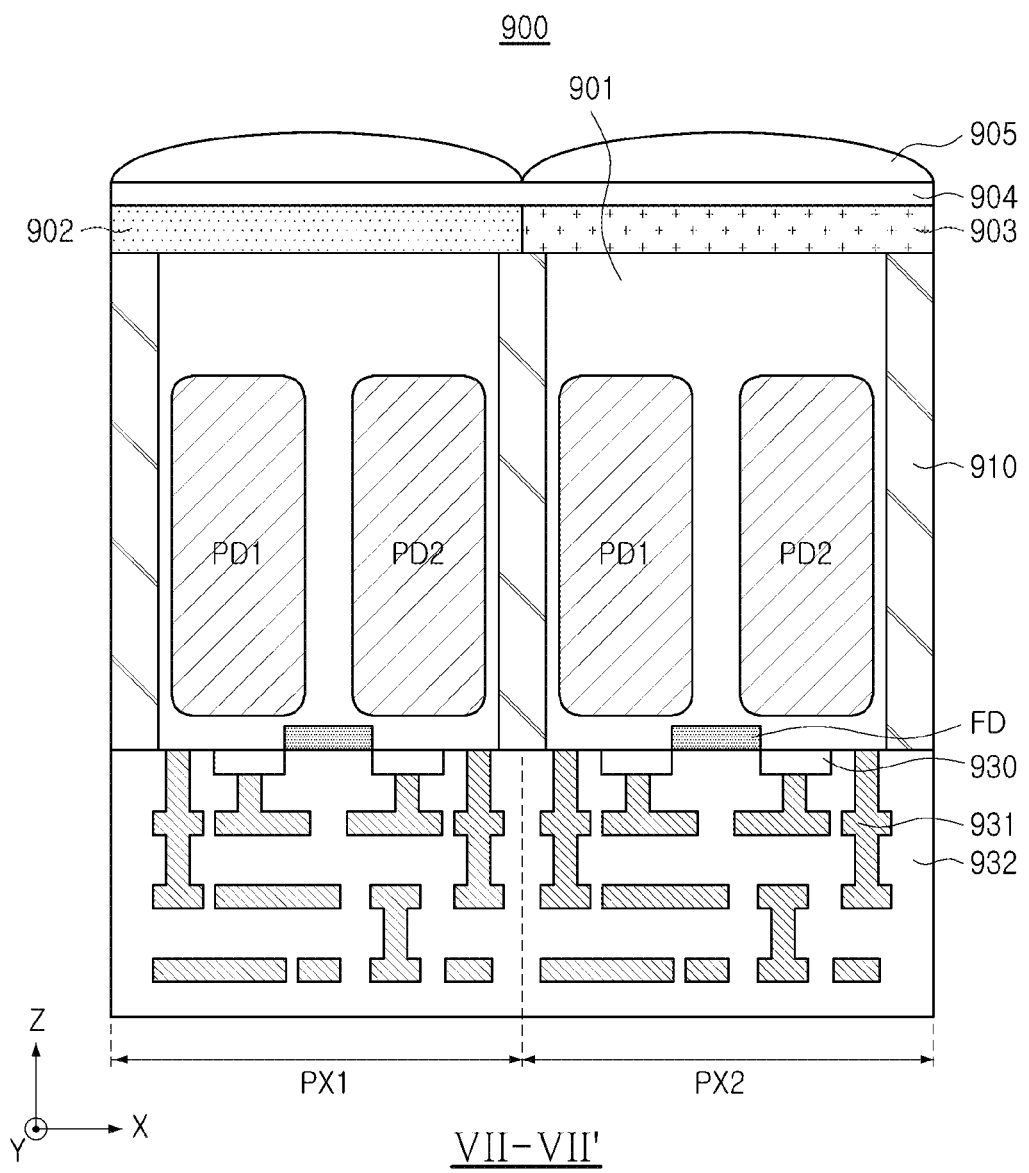

Referring to FIG. 23, pixels PX1 to PX4 included in an image sensor 900 may be separated from each other by a pixel isolation layer 910, and a first photodiode PD1 and a second photodiode PD2 included in each of the pixels PX1 to PX4 may be separated by a pixel internal isolation layer 920. The pixel internal isolation layer 920 may include a plurality of regions separated by a desired and/or alternatively predetermined interval, in the third direction (the Y-axis direction) intersecting the second direction (the X-axis direction), which may be a direction in which the first photodiode PD1 and the second photodiode PD2 are arranged. A floating diffusion FD may be disposed between the plurality of regions included in the pixel internal isolation layer 920. Referring to FIG. 25 illustrating a cross-sectional view of FIG. 23 taken along cut line VII-VII', the pixel internal isolation layer 920 may not be disposed on or above the floating diffusion FD.

In the embodiment illustrated in FIG. 23, intervals between the plurality of regions included in the pixel internal isolation layer 920 may be different in a portion of the pixels PX1 to PX4. As an example, an interval in a first pixel PX1 between the plurality of regions included in the pixel internal isolation layer 920 may be smaller than an interval in a second pixel PX2 between the plurality of regions included in the pixel internal isolation layer 920. an interval in a third pixel PX3 between the plurality of regions included in the pixel internal isolation layer 920 may be smaller than the interval in the first pixel PX1 between the plurality of regions included in the pixel internal isolation layer 920.

Figure 24:
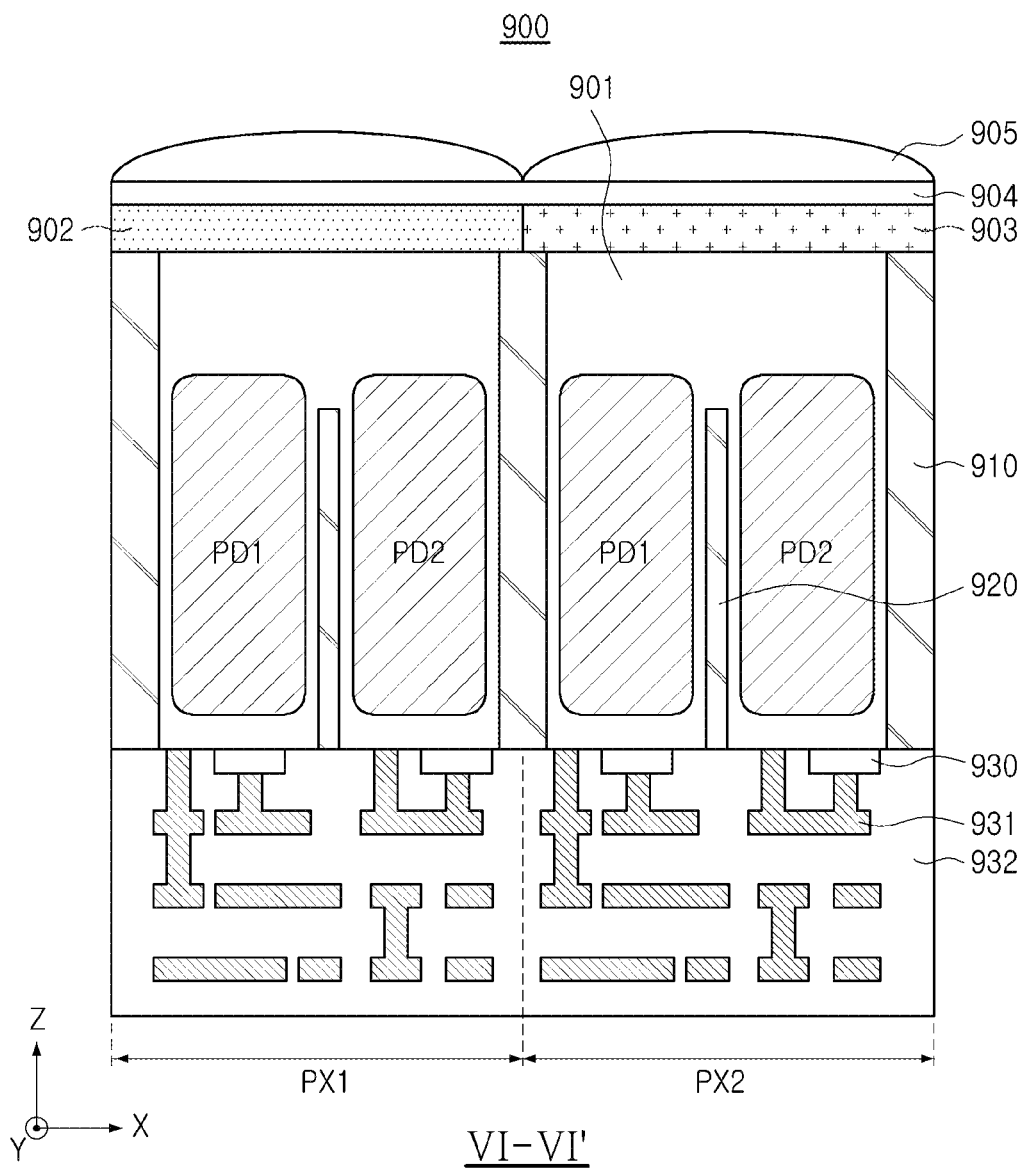

Referring to FIG. 24 illustrating a cross-sectional view of FIG. 23 taken along cut line VI-VI', the first pixel PX1 may include a green color filter 902, and the second pixel PX2 may include a red color filter 903. The third pixel PX3 may include a blue color filter. As an example, in a pixel generating charges in response to light of a short wavelength band, intervals between the plurality of regions included in the pixel internal isolation layer 920 may be relatively reduced.

Referring to FIG. 24, a substrate 901 has a first surface on which a plurality of devices 930, wiring patterns 931, and an insulating layer 932 are arranged, and a second surface opposing the first surface. The pixel isolation layer 910 may extend from the first surface to the second surface. The internal pixel isolation layer 920 may extend from the first surface, and may have a length shorter than a length of the pixel isolation layer 910 in the first direction (the Z-axis direction).

Figure 26:
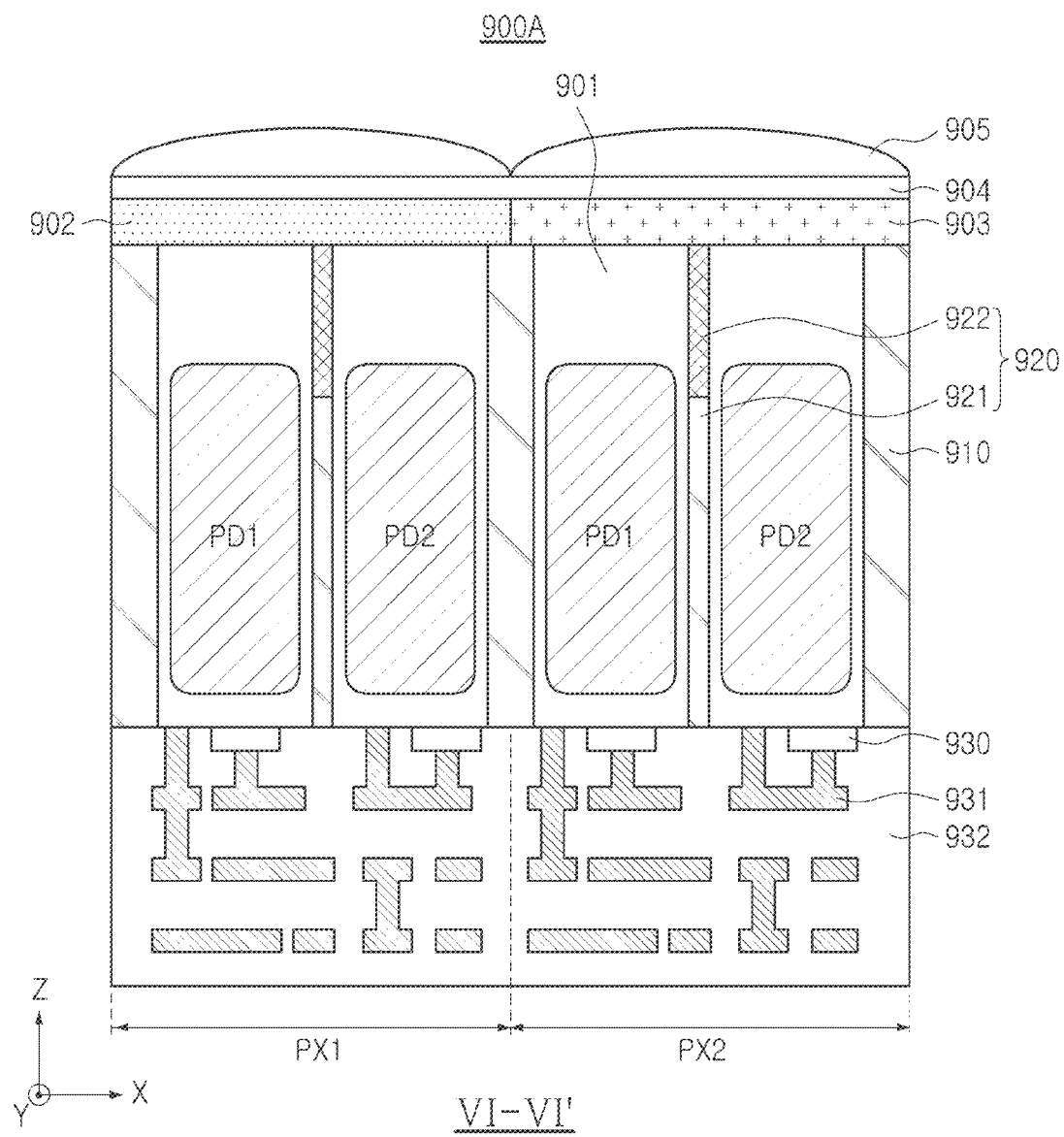

Referring to FIG. 26, a pixel internal isolation layer 920 may include a first pixel internal isolation layer 921 extending from a first surface of a substrate and a second pixel internal isolation layer 922 extending from a second surface of the substrate. In pixels PX1 to PX4, respectively, since the pixel internal isolation layer 920 may include a plurality of regions separated in the third direction, a charge path in which excessively generated charges in one of photodiodes PD1 and PD2 move to the other thereof may be implemented in each of the pixels PX1 to PX4.

In an image sensor 900A according to the embodiment illustrated in FIG. 26, the second pixel internal isolation layers 922 may be in contact with the pixel isolation layers 910 at both ends in the third direction. For example, unlike the first pixel internal isolation layer 921 having a plurality of regions separated from each other in the third direction, the second pixel internal isolation layer 922 may have a shape completely intersecting each of the pixels PX1 to PX4. Therefore, a length of the second pixel internal isolation layer 922 may be longer than a length of the first pixel internal isolation layer 921 in the third direction.

Figure 27:
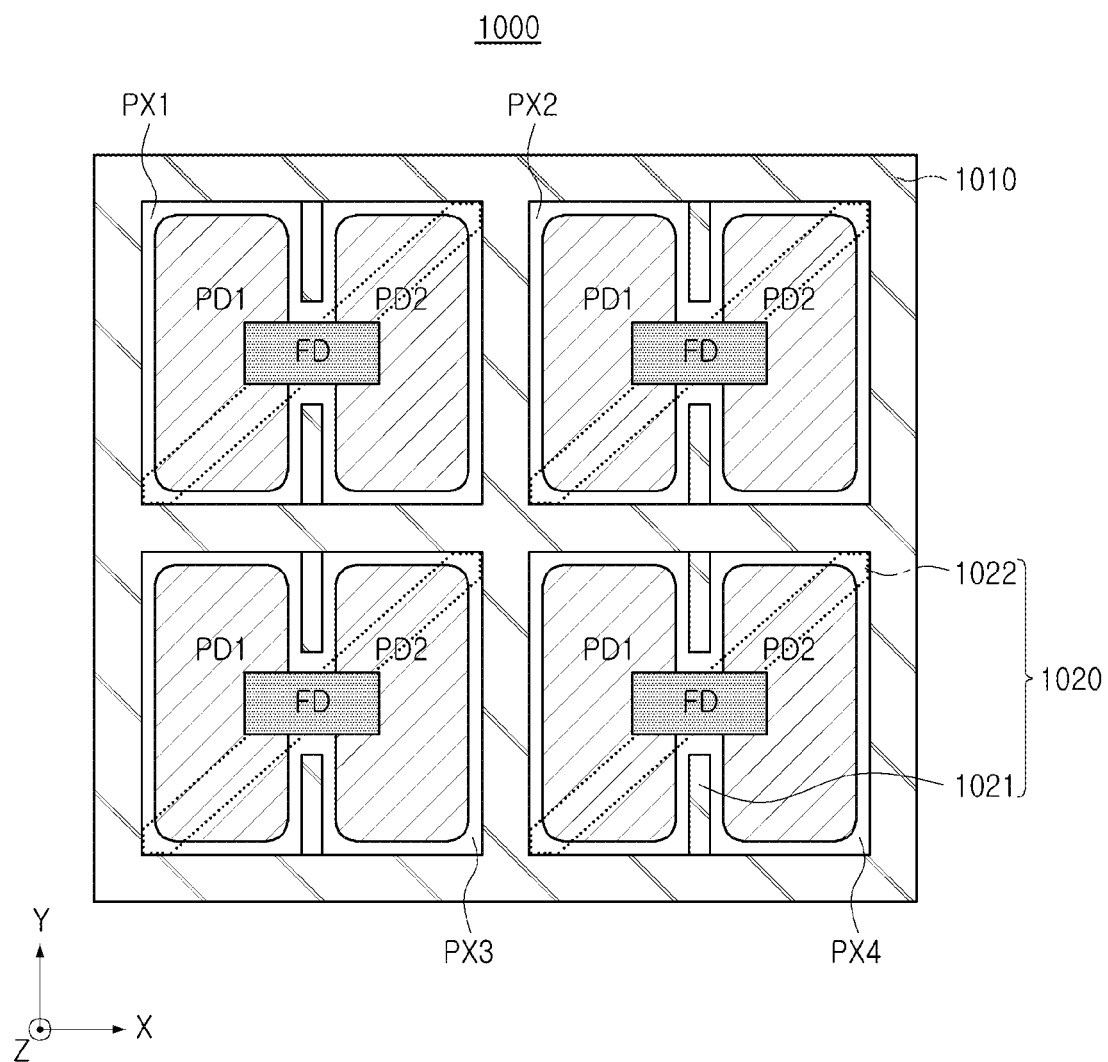
FIG. 27 is a view schematically illustrating pixels included in an image sensor according to an embodiment of inventive concepts.

FIG. 27 is a view schematically illustrating pixels included in an image sensor according to an embodiment of inventive concepts.

In an image sensor 1000 according to the embodiment illustrated in FIG. 27, a pixel internal isolation layer 1020 in pixels PX1 to PX4, respectively, may include a first pixel internal isolation layer 1021 and a second pixel internal isolation layer 1022. The first pixel internal isolation layer 1021 may have a structure similar to the pixel internal isolation layer 920 described with reference to FIGS. 23 to 26. The second pixel internal isolation layer 1022 may extend from each of the pixels PX1 to PX4 in the diagonal direction.

In a similar manner to the embodiments described above, for example, in a similar manner to the embodiments described with reference to FIGS. 18 and 19, an impurity region may be formed between the first pixel internal isolation layer 1021 and the second pixel internal isolation layer 1022 in the first direction (the Z-axis direction). The impurity region may be provided as a charge path for facilitating charge transfer between a first photodiode PD1 and a second photodiode PD2.

Alternatively, in a similar manner to the embodiment described with reference to FIG. 26, the first pixel internal isolation layer 1021 and the second pixel internal isolation layer 1022 may be in contact with each other in the first direction. In this case, a length the first pixel internal isolation layer 1021 may be longer than a length of the first photodiode PD1 and a length of the second photodiode PD2 in the first direction. In addition, according to embodiments, an autofocusing function in the vertical direction may be implemented using a pixel signal corresponding to charges of the first photodiode PD1 and a pixel signal corresponding to charges of the second photodiode PD2.

FIGS. 28 to 33 are views illustrating a method of manufacturing an image sensor according to an embodiment of inventive concepts.

Figure 28:
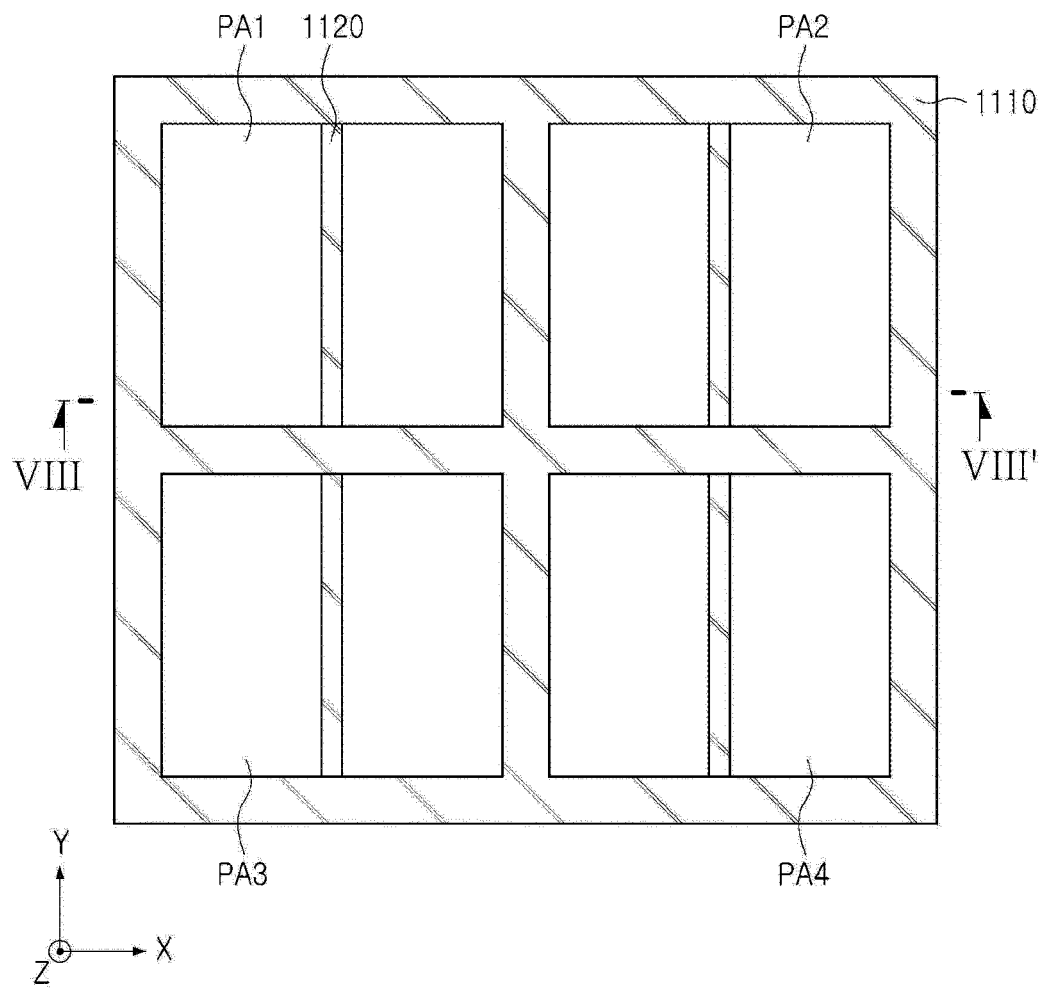
FIGS. 28 to 33 are views illustrating a method of manufacturing an image sensor according to an embodiment of inventive concepts.
Figure 29:
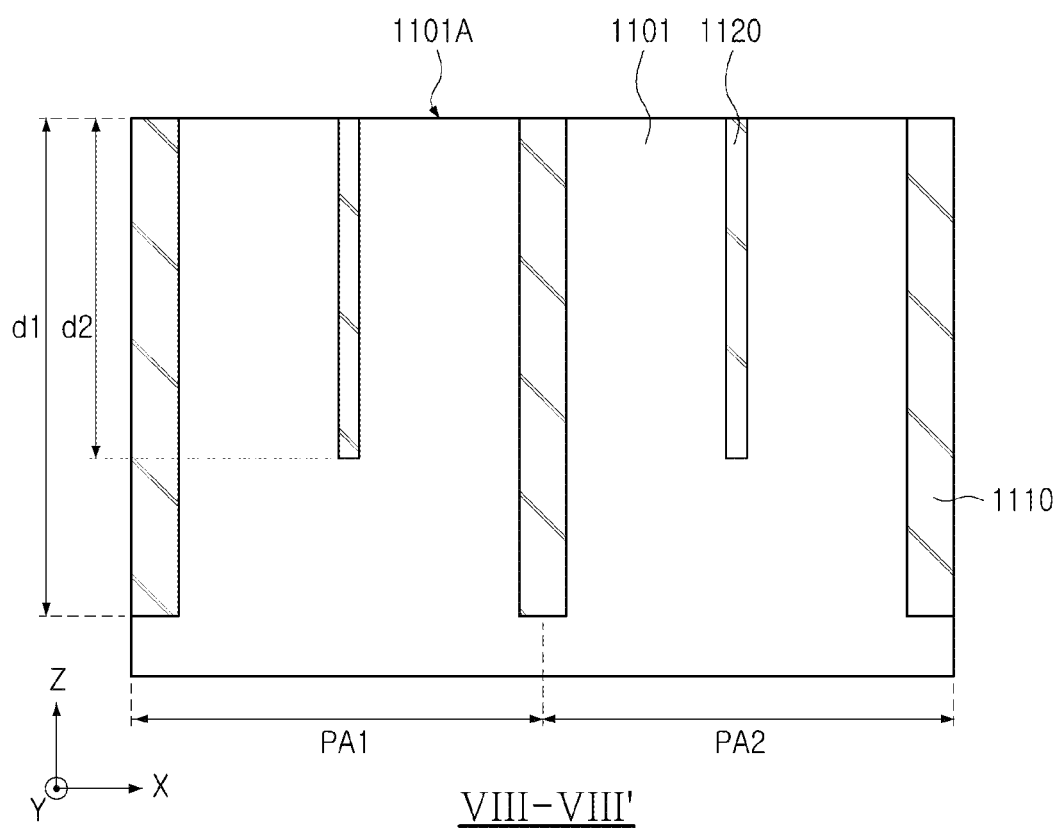

First, referring to FIG. 28, a method of manufacturing an image sensor may begin with forming a pixel isolation layer 1110 on a substrate 1101. Referring also to FIG. 29 illustrating a cross-sectional view of FIG. 28 taken along cut line VIII-VIII', the pixel isolation layer 1110 may be formed from a first surface 1101A of the substrate 1101. For example, a trench extending from the first surface 1101A of the substrate 1101 may be formed and the formed trench may be filled with a material such as polysilicon, to prepare the pixel isolation layer 1110.

Referring to FIGS. 28 and 29, the pixel isolation layer 1110 may be formed together with a pixel internal isolation layer 1120 respectively disposed inside pixel regions PA1 to PA4. The internal pixel isolation layer 1120 may be formed to have a width narrower than a width of the pixel isolation layer 1110, and may include the same material as the pixel isolation layer 1110, for example, polysilicon. Referring to FIG. 29, in the first direction (the Z-axis direction), the pixel isolation layer 1110 may have a first length d1, and the pixel internal isolation layer 1120 may have a second length d2, shorter than the first length d1.

Figure 30:
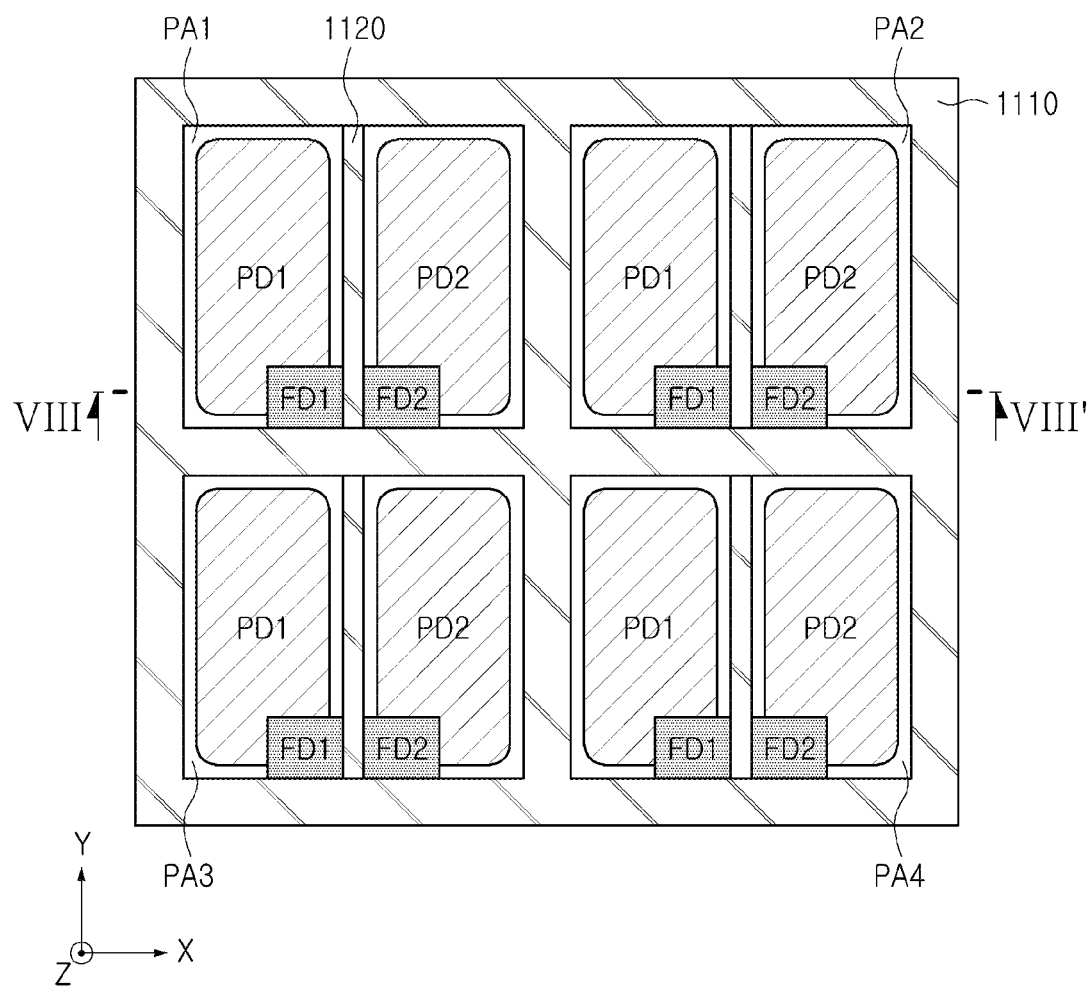
Figure 31:
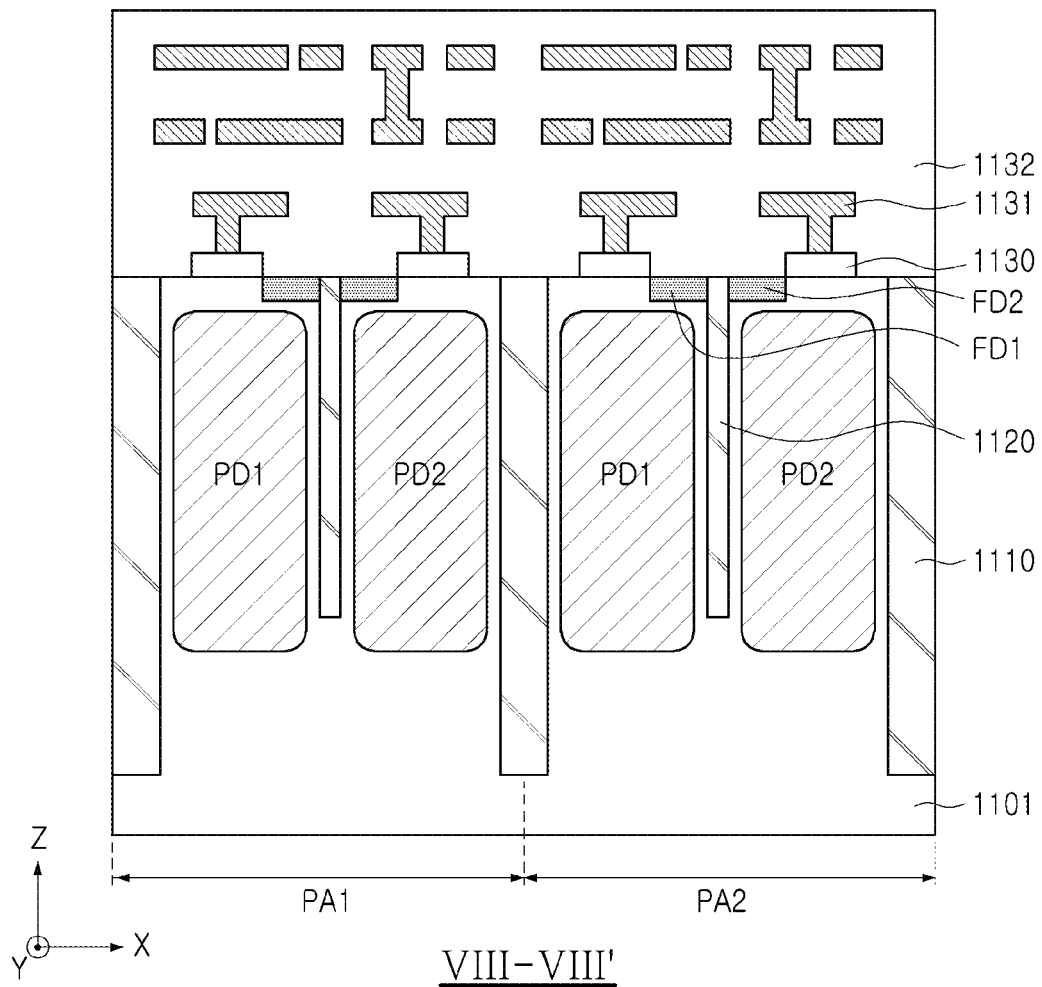

Next, referring to FIGS. 30 and 31, photodiodes PD1 and PD2 and a pixel circuit may be formed in each of the pixel regions PA1 to PA4. The photodiodes PD1 and PD2 may be formed on both sides of the pixel internal isolation layer 1120, and may be formed by an impurity implantation process of implanting an N-type impurity, for example. The pixel circuit may be formed on the first surface 1101A of the substrate 1101, and may include floating diffusions FD1 and FD2, a plurality of elements 1130, wiring patterns 1131, and the like. An insulating layer 1132 covering the pixel circuit may be formed on the first surface 1101A of the substrate 1101. The insulating layer 1132 may be formed of silicon oxide, silicon nitride, or the like. The floating diffusions FD1 and FD2 may be formed to be adjacent to the pixel internal isolation layer 1120, and elements 1130 adjacent to the floating diffusions FD1 and FD2 may be transfer transistors.

Figure 32:
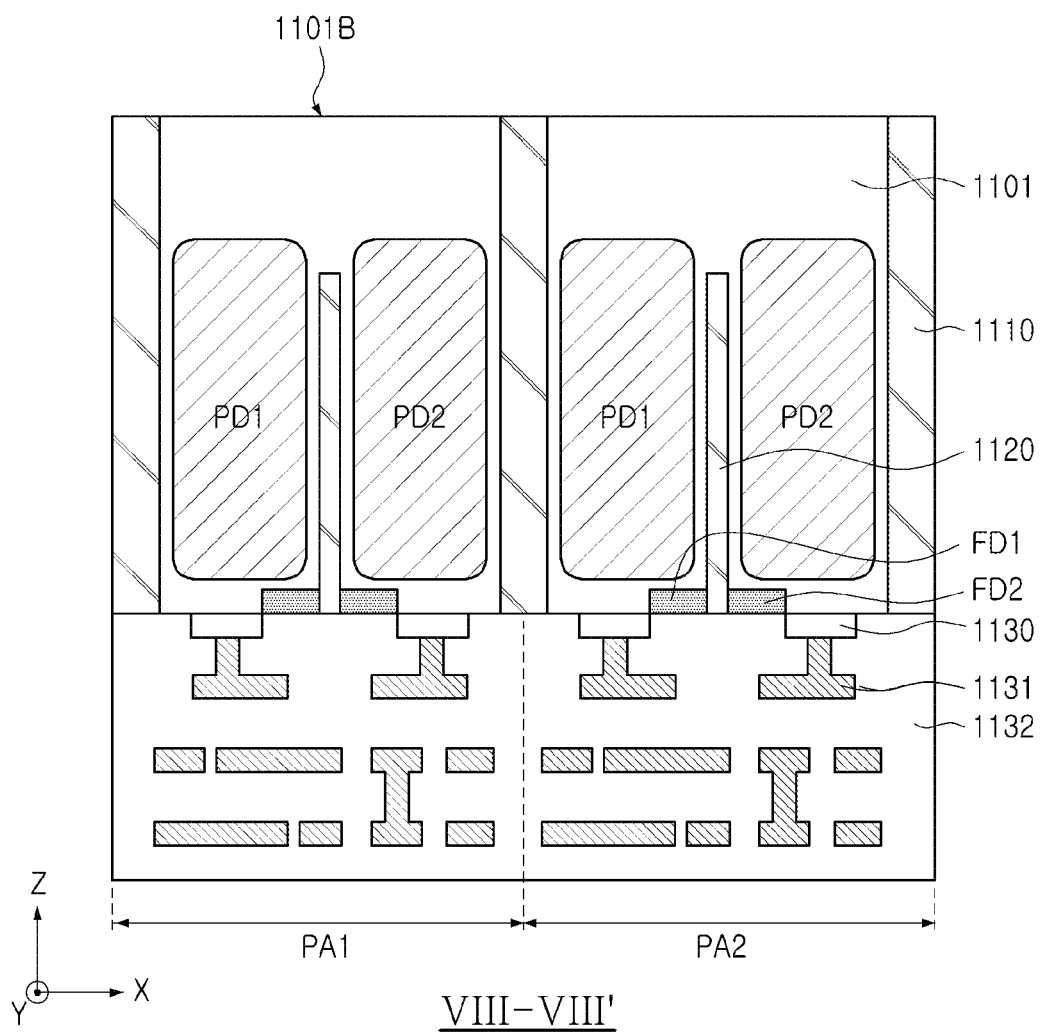

Next, referring to FIG. 32, a partial region of the substrate 1101 may be removed while the substrate 1101 is turned over to face the first surface 1101A in a downward direction. For example, a partial region of the substrate 1101 may be removed by performing a polishing process or the like. In the embodiment illustrated in FIG. 32, it is illustrated that a portion of the substrate 1101 may be removed by a polishing process to expose one surface of the pixel isolation layer 1110. In a different manner to this, the pixel isolation layer 1110 may not be exposed. The one surface of the substrate 1101 exposed by the polishing process may be defined as a second surface 1101B.

Figure 33:
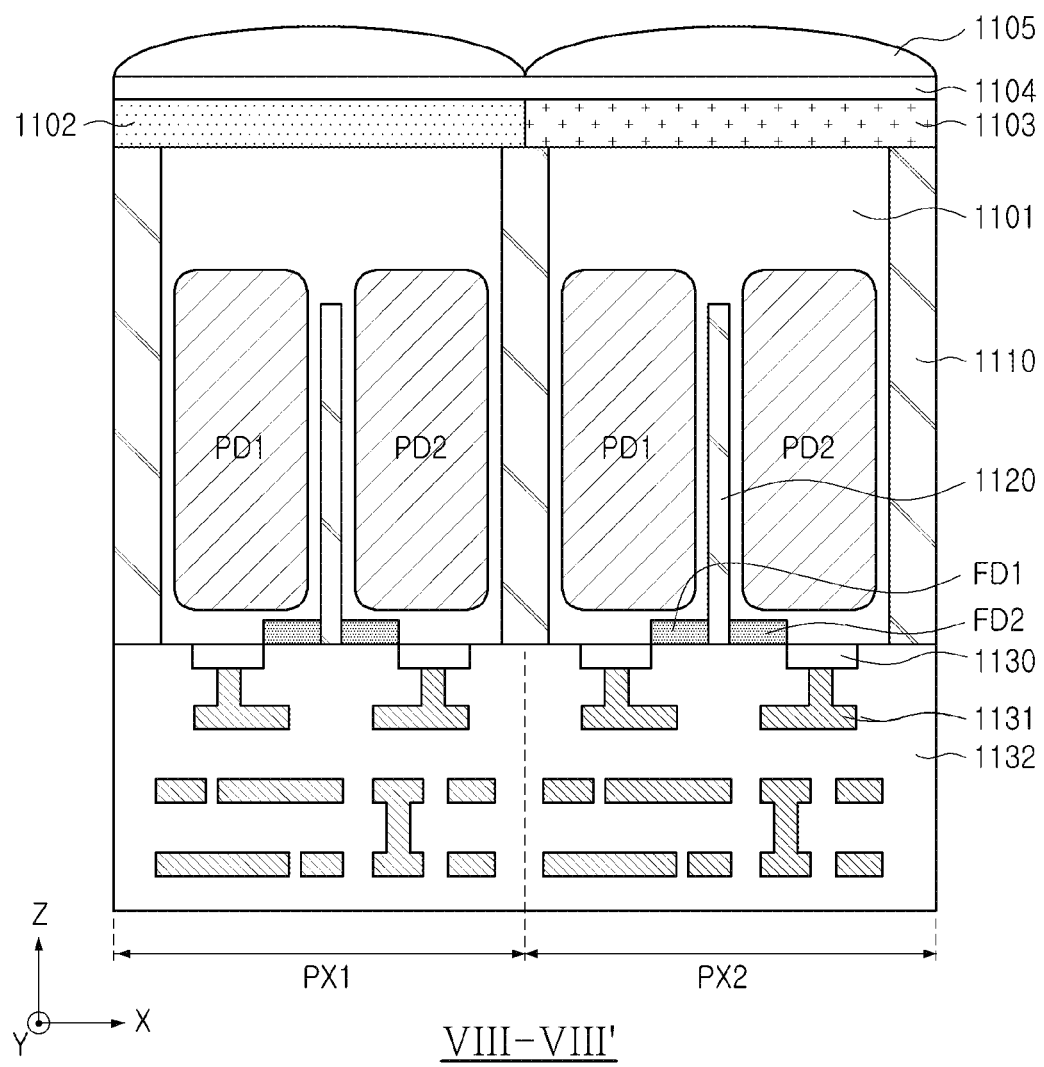

Referring to FIG. 33, color filters 1102 and 1103, a light transmitting layer 1104, and a microlens 1105 may be formed on the second surface 1101B. The color filters 1102 and 1103 included in adjacent pixels PX1 and PX2 may transmit light of different colors. The light transmitting layer 1104 may be shared by the adjacent pixels PX1 and PX2, and the microlens 1105 for each of the pixels PX1 and PX2 may be disposed. Therefore, the photodiodes PD1 and PD2 may be provided as a plurality of photodiodes below one (1) microlens 1105.

FIGS. 34 to 41 are views illustrating a method of manufacturing an image sensor according to an embodiment of inventive concepts.

Figure 34:
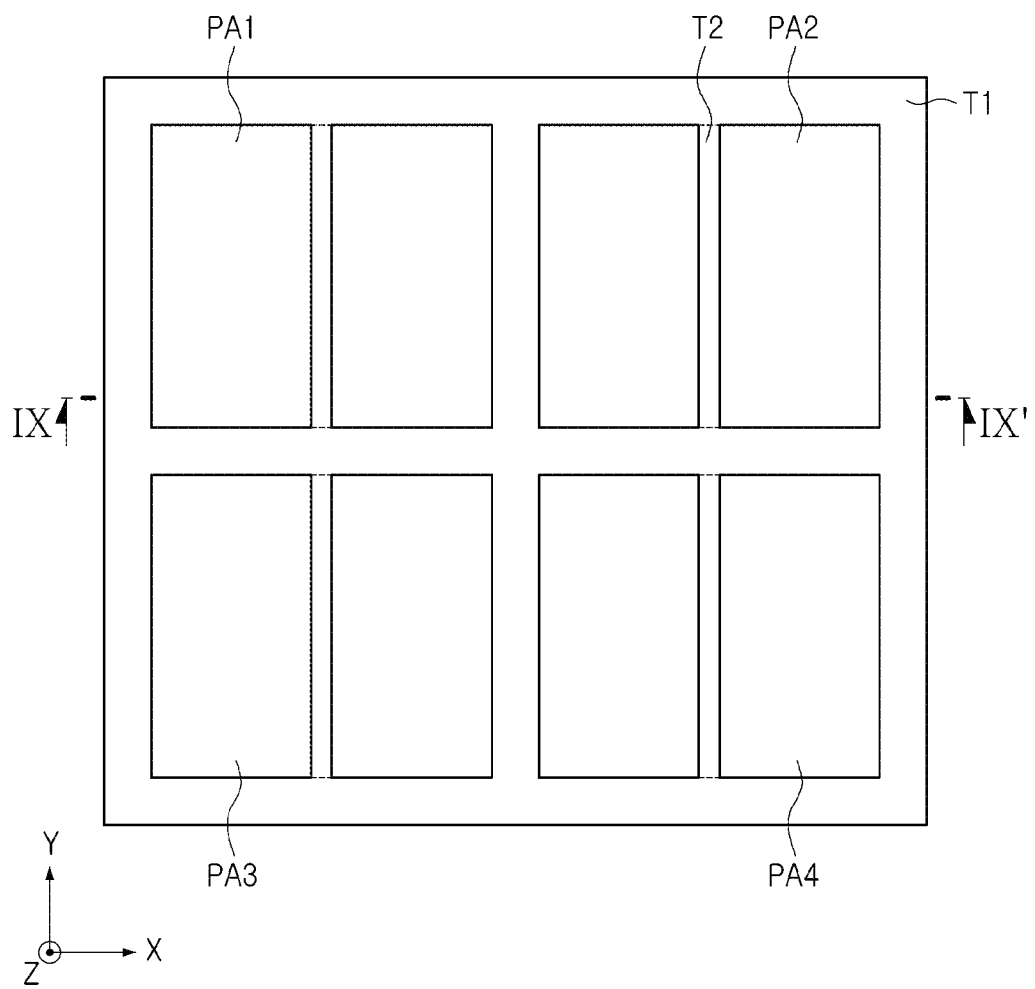
FIGS. 34 to 41 are views illustrating a method of manufacturing an image sensor according to an embodiment of inventive concepts.
Figure 35:
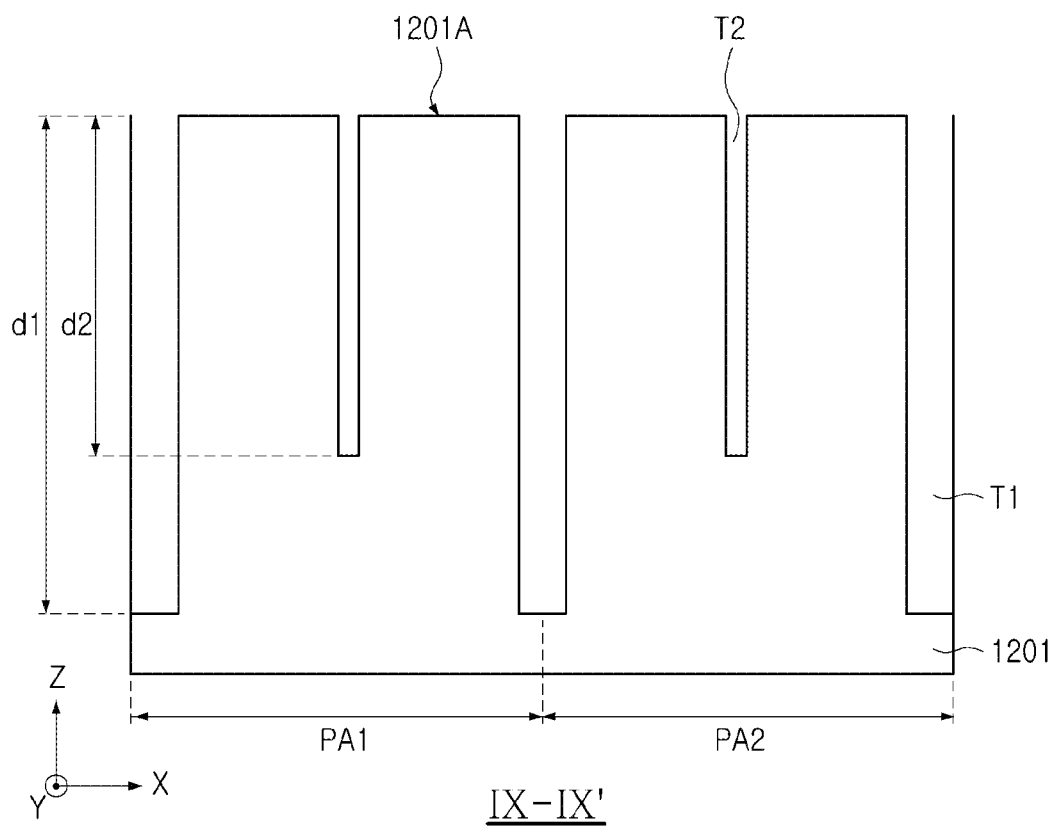

First, referring to FIG. 34, in order to manufacture an image sensor, a first trench T1 and a second trench T2 may be formed in a substrate 1201 including a semiconductor material. Referring to FIG. 35 illustrating a cross-sectional view of FIG. 34 taken along cut line IX-IX' together, the first trench T1 and the second trench T2 may extend from a first surface 1201A of the substrate 1201, and may be formed simultaneously by an etching process. For example, the first trench T1 may have a first length d1 in the first direction (the Z-axis direction), perpendicular to the first surface 1201A of the substrate 1201, and the second trench T2 may have a second length d2, shorter than the first length d1. Also, in a direction parallel to the first surface 1201A, a width of the first trench T1 may be wider than a width of the second trench T2. Pixel regions PA1 to PA4 may be defined by the first trench T1, and the second trench T2 may be disposed inside each of the pixel regions PA1 to PA4.

Figure 36:
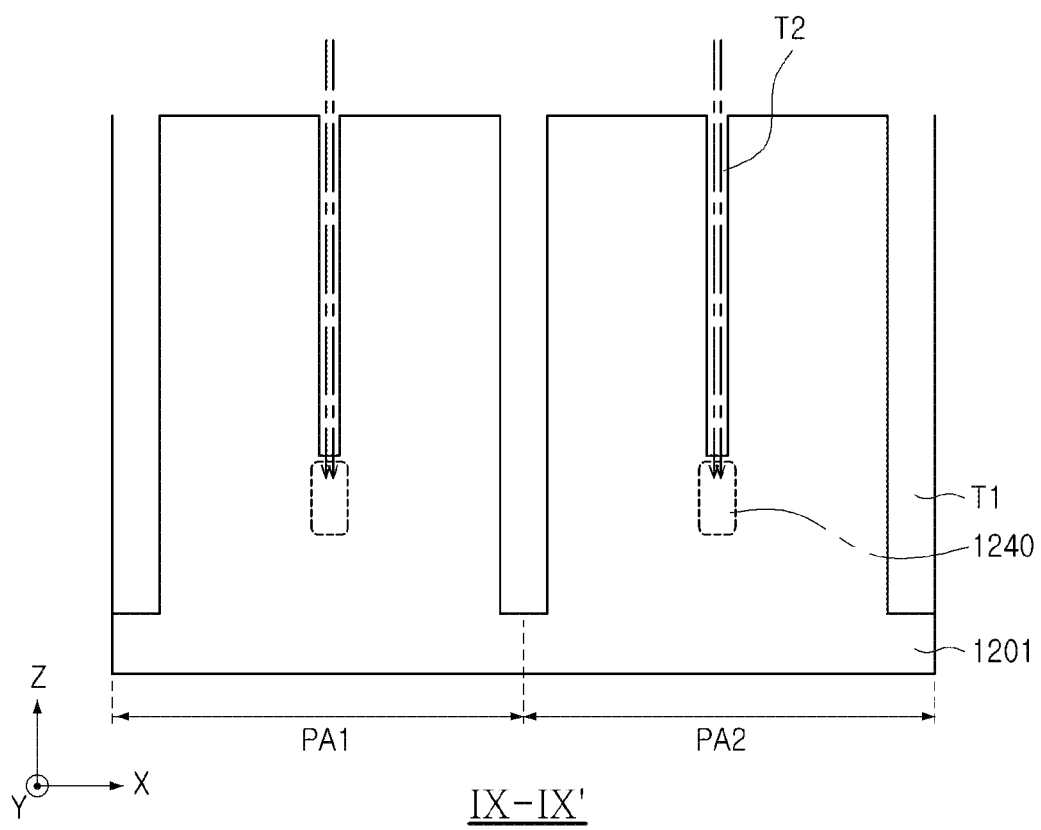

Next, referring to FIG. 36, impurities may be implanted through the second trench T2. An impurity region 1240 may be formed on or below the second trench T2 by an impurity implantation process. For example, the impurity region 1240 may be provided as a charge path between photodiodes formed on or around both sides of the second trench T2, and may include a P-type impurity. According to embodiments, the impurity region 1240 may include an N-type impurity. As illustrated in FIG. 36, the second trench T2 together with the first trench T1 may be formed, and the impurity implantation process may be performed, to complete the impurity implantation process with relatively low energy. According to embodiments, the impurity region 1240 may be formed to have a depth, substantially equal to a depth of a bottom surface of the first trench T1.

Figure 37:
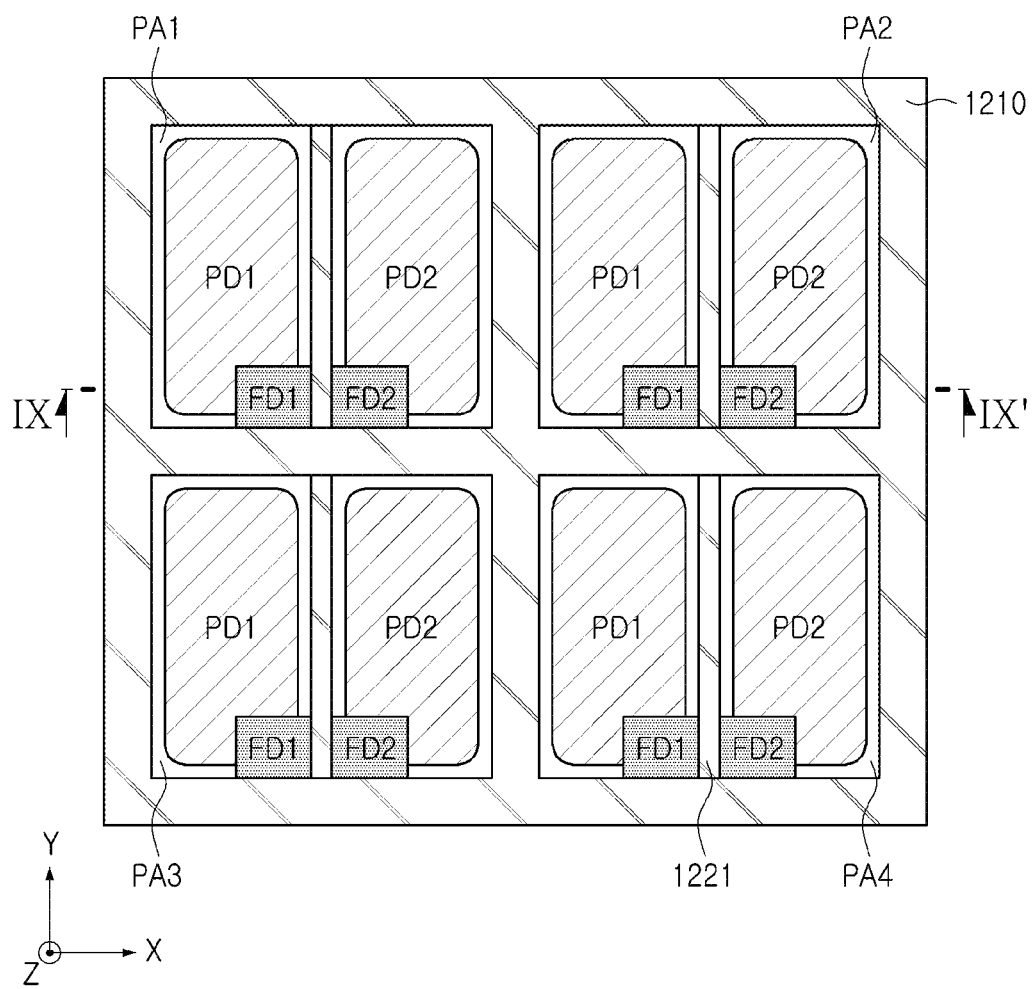
Figure 38:
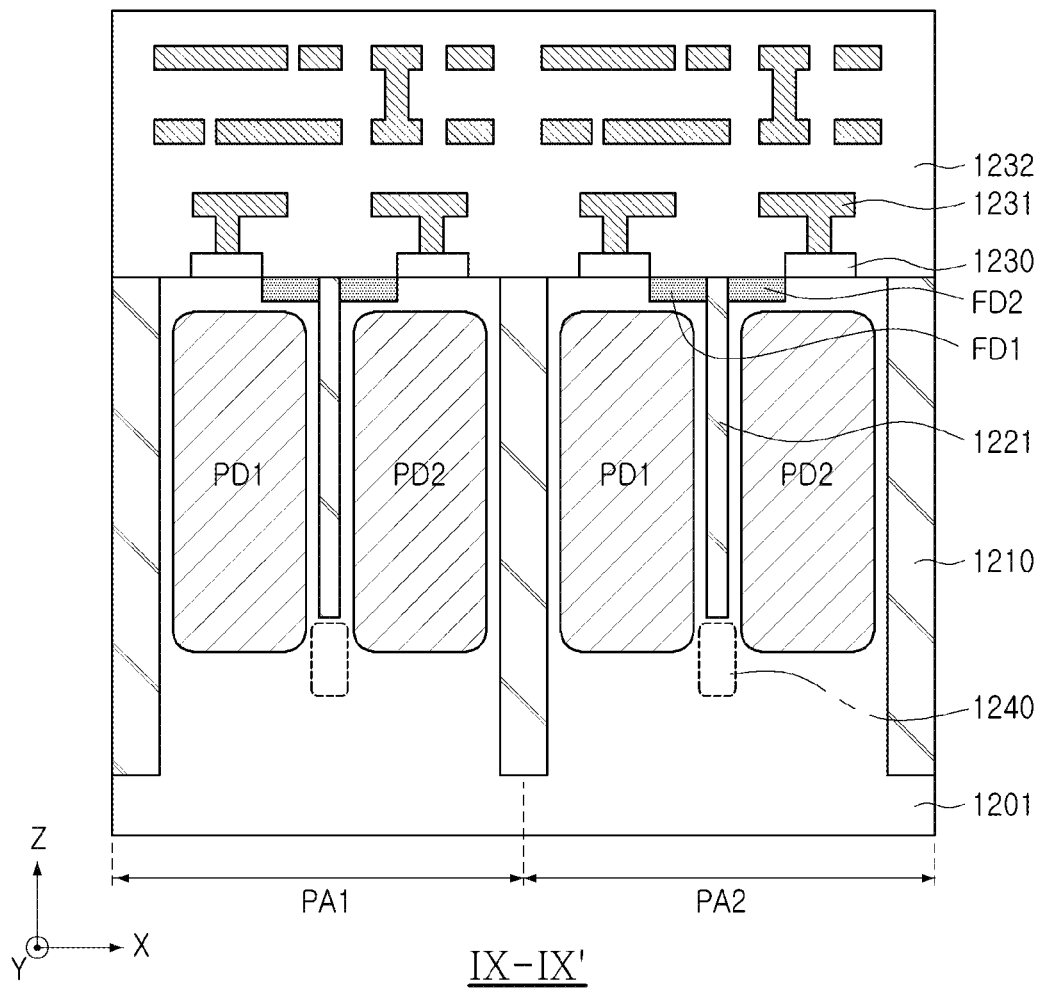

Referring to FIGS. 37 and 38, the first trench T1 and the second trench T2 may be filled with desired and/or alternatively predetermined materials to form a pixel isolation layer 1210 and a first pixel internal isolation layer 1221, respectively. In addition, photodiodes PD1 and PD2 may be formed within the substrate 1201, and a pixel circuit may be formed on the first surface 1201A. The pixel circuit may include floating diffusions FD1 and FD2, a plurality of elements 1230, wiring patterns 1231, and the like, and may be covered with an insulating layer 1232.

The pixel isolation layer 1210 and the first pixel internal isolation layer 1221 may be formed by filling the first trench T1 and the second trench T2 with materials such as polysilicon, respectively. As previously described with reference to FIG. 36, since an impurity region 1240 may be formed by performing an impurity implantation process to pass through the second trench T2, the first pixel internal isolation layer 1221 and the impurity region 1240 may be accurately aligned.

Figure 39:
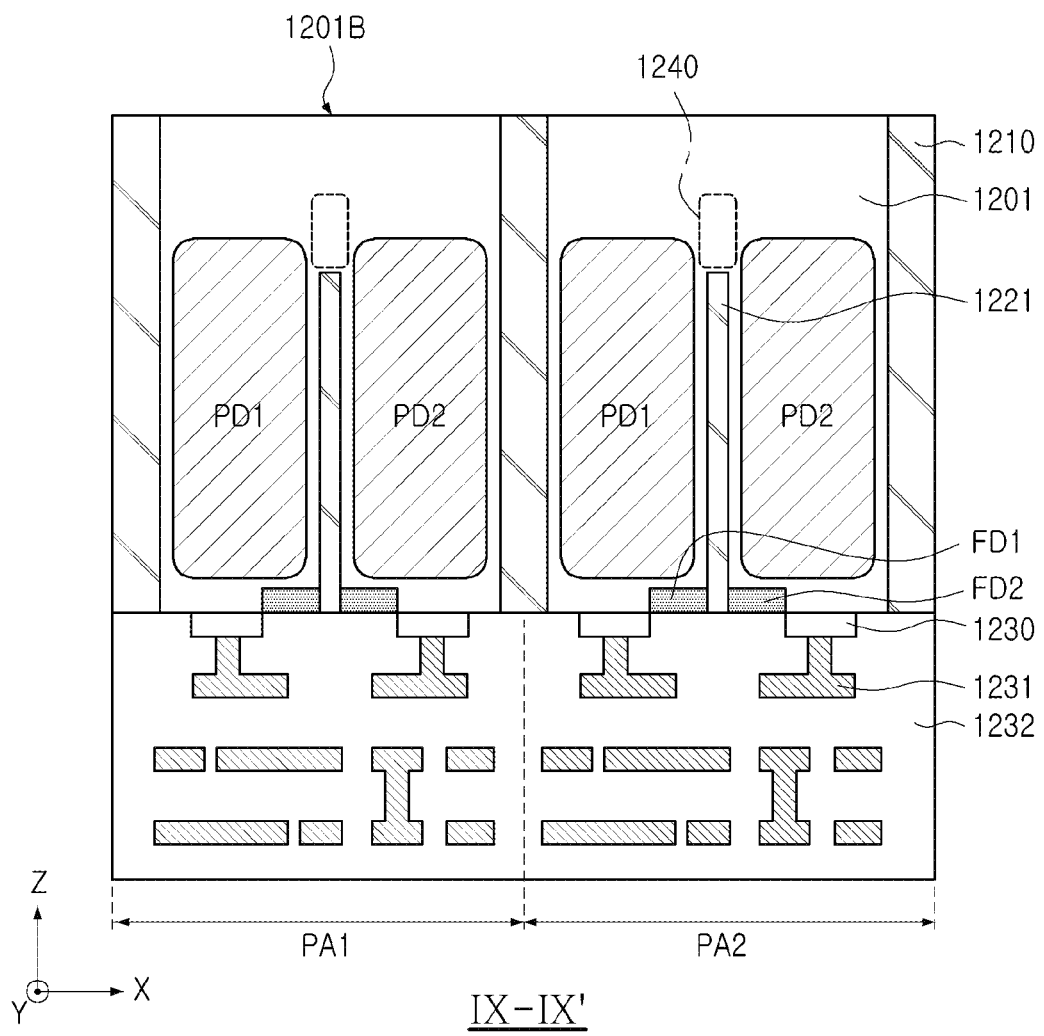

Referring to FIG. 39, after the substrate 1201 is turned over, a polishing process may be performed. One surface of the substrate 1201 exposed by the polishing process may be defined as a second surface 1201B. As an example, the polishing process may be performed until one surface of the pixel isolation layer 1210 forms a coplanar surface with the second surface 1201B. Therefore, as illustrated in FIG. 39, the pixel isolation layer 1210 may pass through the substrate 1201.

Figure 40:
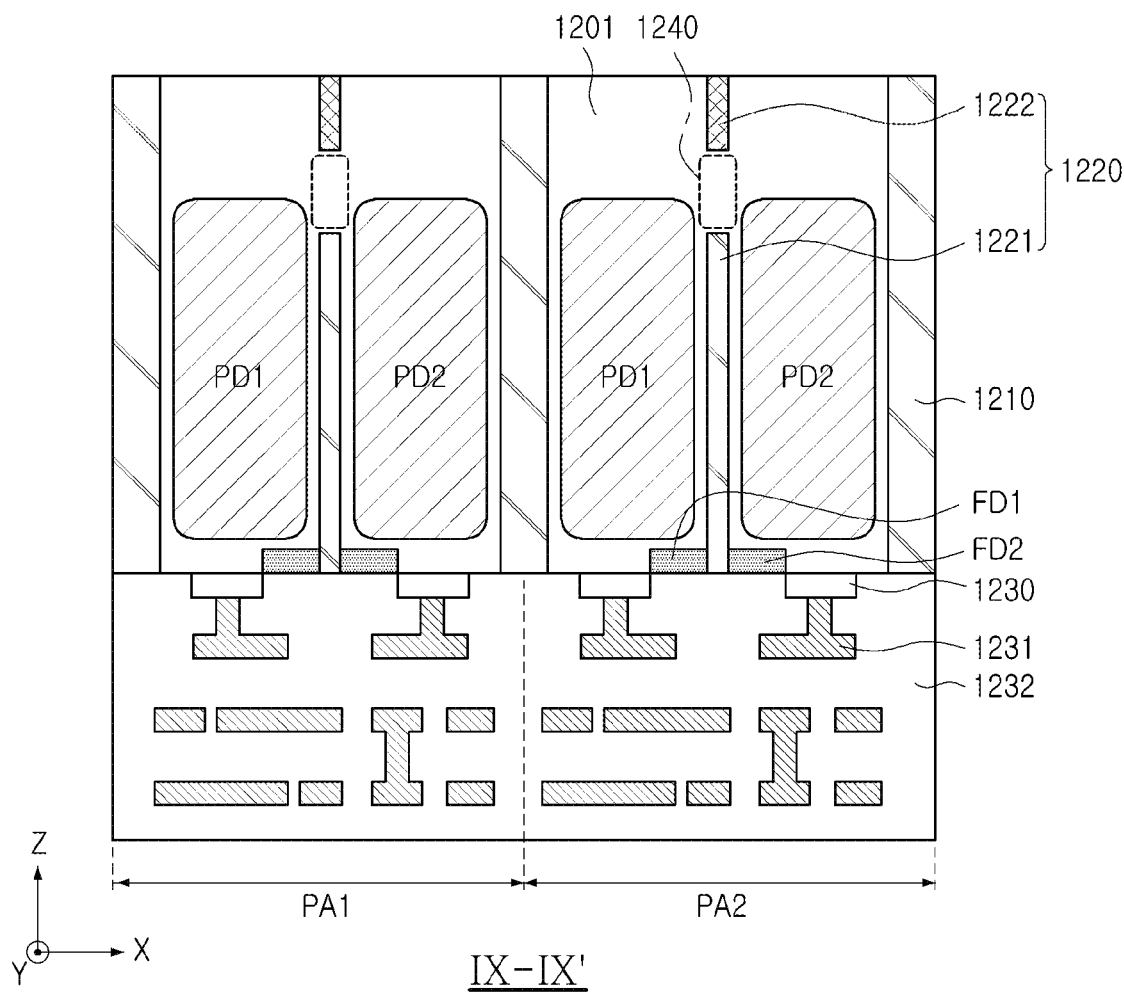

Referring to FIG. 40, a second pixel internal isolation layer 1222 extending from the second surface 1201B may be formed. The second pixel internal isolation layer 1222 may be formed to be aligned with the impurity region 1240 and the first pixel internal isolation layer 1221 in the second direction (the X-axis direction) and the third direction (the Y-axis direction). For example, the second pixel internal isolation layer 1222 may be formed on or above the impurity region 1240, and may be provided together with the first pixel internal isolation layer 1221 to prepare a pixel internal isolation layer 1220.

In the embodiment illustrated in FIG. 40, the second pixel internal isolation layer 1222 may have the same shape as the first pixel internal isolation layer 1221. According to embodiments, the second pixel internal isolation layer 1222 may have various shapes, different from the first pixel internal isolation layer 1221. For example, unlike the first pixel internal isolation layer 1221 extending in the third direction, the second pixel internal isolation layer 1222 may extend in the second direction or in a direction intersecting the second and third directions. Also, the second pixel internal isolation layer 1222 may not be formed according to embodiments.

Figure 41:
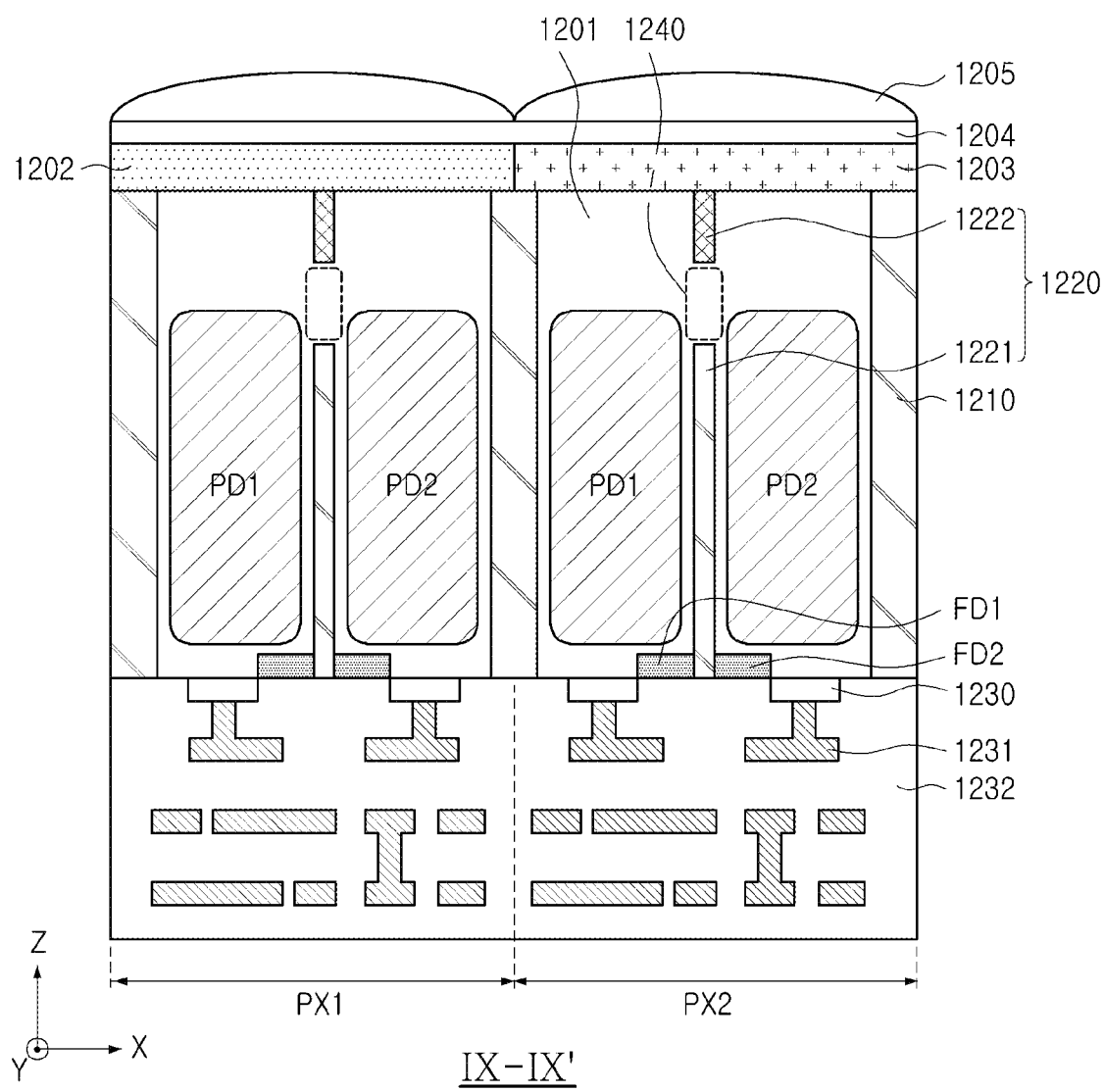

Next, referring to FIG. 41, color filters 1202 and 1203, a light transmitting layer 1204, and a microlens 1205 may be formed on the substrate 1201. The color filters 1202 and 1203 respectively included in a first pixel PX1 and a second pixel PX2, adjacent to each other, may transmit light of different colors. In addition, one (1) microlens 1205 may be disposed in each of the pixels PX1 and PX2. Therefore, the photodiodes PD1 and PD2 may be provided as a plurality of photodiodes below the one (1) microlens 1205.

Figure 42:
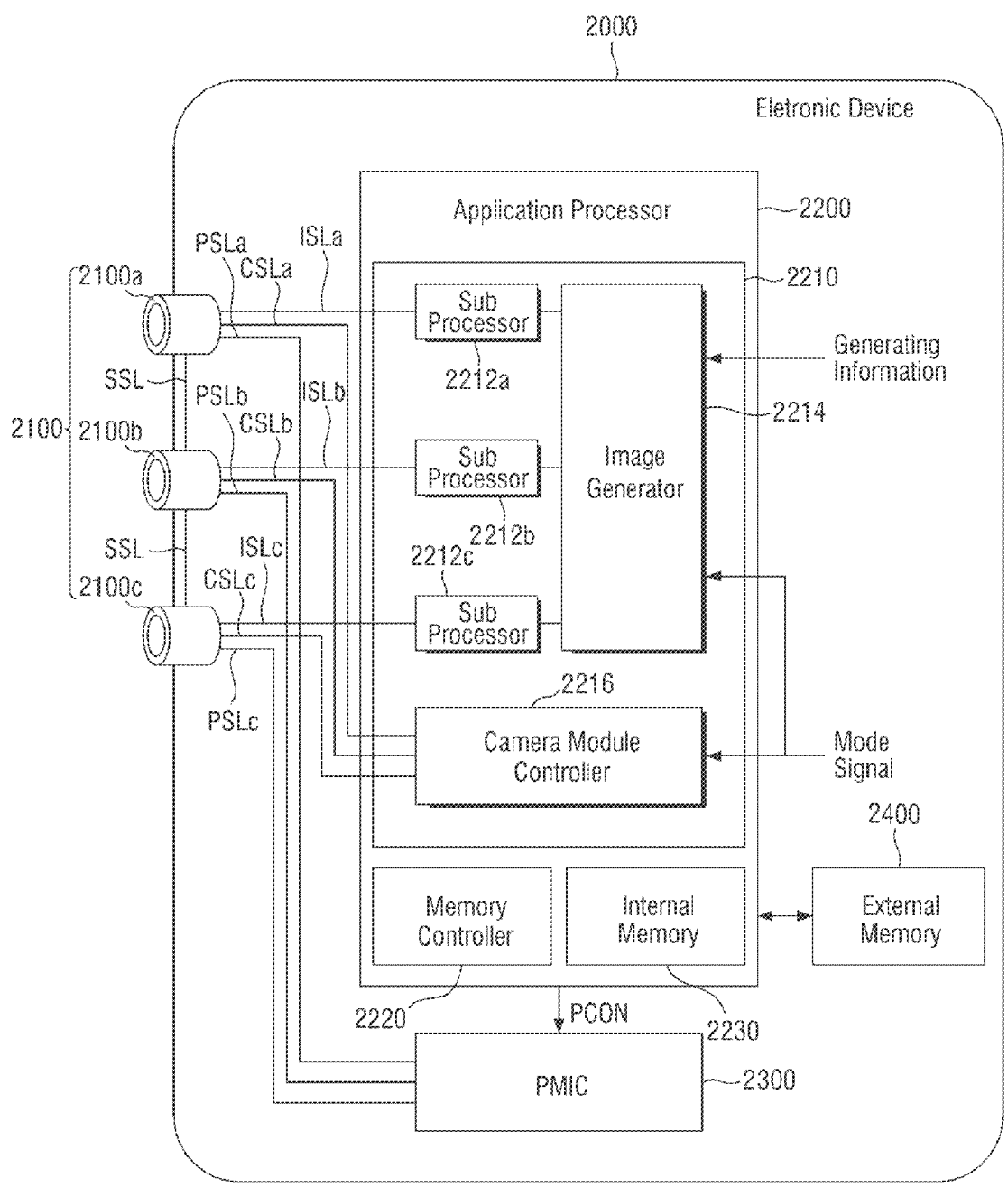
FIGS. 42 and 43 are views schematically illustrating an electronic device including an image sensor according to an embodiment of inventive concepts.
Figure 43:
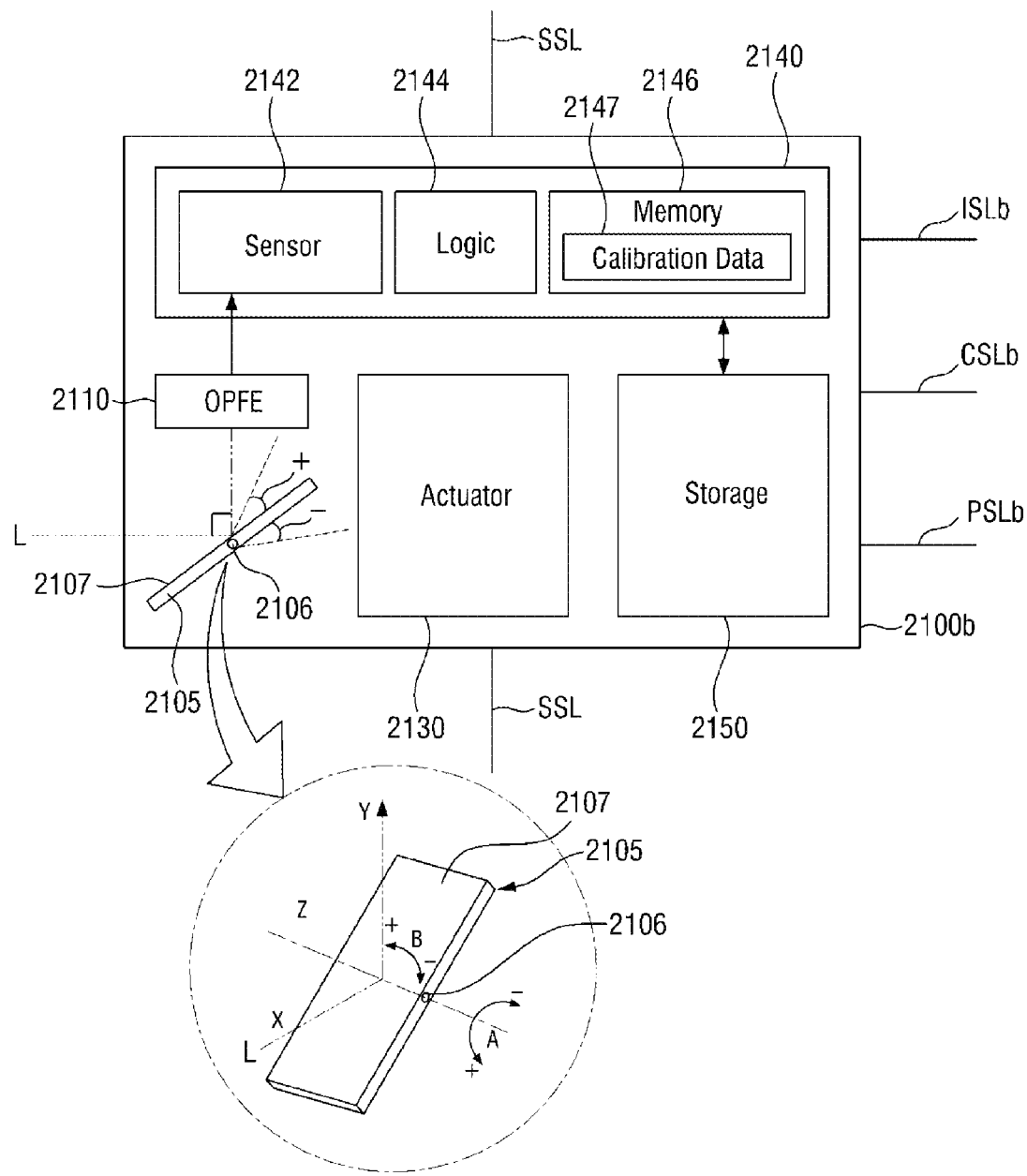

FIGS. 42 and 43 are views schematically illustrating an electronic device including an image sensor according to an embodiment of inventive concepts.

Referring to FIG. 42, an electronic device 2000 may include a camera module group 2100, an application processor 2200, a power management integrated circuit (PMIC) 2300, and an external memory 2400.

The camera module group 2100 may include a plurality of camera modules 2100a, 2100b, and 2100c. Although the drawing illustrates an embodiment in which three (3) camera modules 2100a, 2100b, and 2100c are arranged, embodiments are not limited thereto. In an embodiment, the camera module group 2100 may be modified to include only two (2) camera modules. In addition, in an embodiment, the camera module group 2100 may be modified and implemented to include n (where n is a natural number of 4 or more) camera modules. In addition, in an embodiment, at least one of the plurality of camera modules 2100a, 2100b, and 2100c included in the camera module group 2100 may include the image sensors described in FIGS. 1 to 41.

The external memory 2400 may be a nonvolatile memory, such as a flash memory, a phase-change random access memory (PRAM), a magneto-resistive RAM (MRAM), a resistive RAM (ReRAM), or a ferro-electric RAM (FRAM), or a volatile memory, such as a static RAM (SRAM), a dynamic RAM (DRAM), or a synchronous DRAM (SDRAM).

Hereinafter, referring to FIG. 43, a configuration of the camera module 2100b will be described in more detail, but the following description may be equally applied to other camera modules 2100a and 2100c according to an embodiment.

Referring back to FIG. 43, the camera module 2100b may include a prism 2105, an optical path folding element (hereinafter referred to as "OPFE") 2110, an actuator 2130, an image sensing device 2140, and a storage device 2150.

The prism 2105 may include a reflective surface 2107 of a light reflecting material to change a path of light L externally incident.

In an embodiment, the prism 2105 may change the path of the light L, incident in the first direction X, to the second direction Y, perpendicular to the first direction X. In addition, the prism 2105 may rotate the reflective surface 2107 of the light reflecting material in a direction A around a central axis 2106, or may rotate the central axis 2106 in a direction B, to change the path of the light L, incident in the first direction X, to the second direction Y, perpendicular thereto. In this case, the OPFE 2110 may also move in the third direction Z, perpendicular to the first direction X and the second direction Y.

In an embodiment, as illustrated, a maximum rotation angle of the prism 2105 may be 15 degrees or less in a positive (+) direction of the direction A, and may be greater than 15 degrees in a negative (−) direction of the direction A. Embodiments are not limited thereto.

In an embodiment, the prism 2105 may move in a positive (+) direction or a negative (−) direction of the direction B by around 20 degrees, or between 10 degrees and 20 degrees, or between 15 degrees and 20 degrees. In this case, a moving angle may be an angle that may move at the same angle, or may move to almost the same angle in a range of around 1 degree, in the positive (+) or negative (−) direction of the direction B.

In an embodiment, the prism 2105 may move the reflective surface 2107 of the light reflecting material in the third direction (e.g., the direction Z), parallel to an extending direction of the central axis 2106.

The OPFE 2110 may include, for example, optical lenses of m (where m is a natural number) groups. The m optical lenses may move in the second direction Y to change an optical zoom ratio of the camera module 2100b. For example, if a basic optical zoom magnification of the camera module 2100b is Z, when the m optical lenses included in the OPFE 2110 move, an optical zoom magnification of the camera module 2100b may be changed to have an optical zoom magnification of 3Z, 5Z, or 5Z or higher.

The actuator 2130 may move the OPFE 2110 or an optical lens (hereinafter, referred to as an optical lens) to a specific position. For example, the actuator 2130 may adjust a position of the optical lens to locate an image sensor 2142 at a focal length of the optical lens for accurate sensation. The actuator 2130 may include an electric motor.

The image sensing device 2140 may include an image sensor 2142, a control logic 2144, and a memory 2146. The image sensor 2142 may sense an image of an object to be sensed by using light L provided through an optical lens. The control logic 2144 may control an overall operation of the camera module 2100b. For example, the control logic 2144 may control an operation of the camera module 2100b according to a control signal provided through a control signal line CSLb.

The memory 2146 may store information necessary for an operation of the camera module 2100b, such as calibration data 2147. The calibration data 2147 may include information necessary for the camera module 2100b to generate image data using light L externally provided. The calibration data 2147 may include, for example, information on the degree of rotation, described above, information on a focal length, information on an optical axis, or the like. When the camera module 2100b is implemented in the form of a multi-state camera of which focal length is changed according to a position of the optical lens, the calibration data 2147 may include a focal length value for each position (or state) of the optical lens, and information related to autofocusing.

The storage device 2150 may store the image data sensed by the image sensor 2142. The storage device 2150 may be disposed outside the image sensing device 2140, and may be implemented in stacked form with a sensor chip constituting the image sensing device 2140. In an embodiment, the storage device 2150 may be implemented as an electrically erasable programmable read-only memory (EEPROM), but embodiments are not limited thereto.

Referring to FIGS. 42 and 23 together, in an embodiment, the plurality of camera modules 2100a, 2100b, and 2100c may include the actuator 2130, respectively. Therefore, the plurality of camera modules 2100a, 2100b, and 2100c may include the same or different calibration data 2147, respectively, according to an operation of the actuator 2130 included therein.

In an embodiment, a camera module (e.g., 2100b), among the plurality of camera modules 2100a, 2100b, and 2100c, may be a folded lens type camera module including the prism 2105 and the OPFE 2110, described above, and remaining camera module(s) (e.g., 2100a or 2100c) may be a vertical type camera module not including the prism 2105 and the OPFE 2110, but embodiments are not limited thereto.

In an embodiment, a camera module (e.g., 2100c), among the plurality of camera modules 2100a, 2100b, and 2100c, may be a vertical type depth camera for extracting depth information using, for example, infrared ray (IR). In this case, the application processor 2200 may merge image data provided from the depth camera with image data provided from another camera module (for example, 2100a or 2100b) to generate a 3D depth image.

In an embodiment, at least two camera modules (e.g., 2100a and 2100b), among the plurality of camera modules 2100a, 2100b, and 2100c, may have different fields of view (e.g., field of view angles). In this case, for example, optical lenses of the at least two camera modules (e.g., 2100a and 2100b), among the plurality of camera modules 2100a, 2100b, and 2100c, may be different from each other, but are not limited thereto.

In addition, in an embodiment, field of view angles of each of the plurality of camera modules 2100a, 2100b, and 2100c may be different. In this case, optical lenses included in each of the plurality of camera modules 2100a, 2100b, and 2100c may also be different from each other, but are not limited thereto.

In an embodiment, each of the plurality of camera modules 2100a, 2100b, and 2100c may be arranged to be physically separated from each other. For example, a sensation area of one (1) image sensor 2142 may not be divided and used by the plurality of camera modules 2100a, 2100b, and 2100c, but an independent image sensor 2142 inside each of the plurality of camera modules 2100a, 2100b, and 2100c may be disposed.

Referring back to FIG. 42, the application processor 2200 may include an image processing device 2210, a memory controller 2220, and an internal memory 2230. The application processor 2200 may be implemented to be separated from the plurality of camera modules 2100a, 2100b, and 2100c. For example, the application processor 2200 and the plurality of camera modules 2100a, 2100b, and 2100c may be implemented to be separated from each other, as separate semiconductor chips.

The image processing device 2210 may include a plurality of sub-image signal processors 2212a, 2212b, and 2212c, an image generator 2214, and a camera module controller 2216.

The image processing device 2210 may include a plurality of sub-image signal processors 2212a, 2212b, and 2212c, corresponding to the number of camera modules 2100a, 2100b, and 2100c.

Image data generated from each of the camera modules 2100a, 2100b, and 2100c may be provided to the corresponding sub-image signal processors 2212a, 2212b, and 2212c through image signal lines ISLa, ISLb, and ISLc, separated from each other. For example, image data generated from the camera module 2100a may be provided to the sub-image signal processor 2212a through the image signal line ISLa, image data generated from the camera module 2100b may be provided to the sub-image signal processor 2212b through the image signal line ISLb, and image data generated from the camera module 2100c may be provided to the sub-image signal processor 2212c through the image signal line ISLc. Transmission of such image data may be performed using, for example, a camera serial interface (CSI) based on a mobile industry processor interface (MIPI), but embodiments are not limited thereto.

In an embodiment, a sub-image signal processor may be disposed to correspond to a plurality of camera modules. For example, the sub-image signal processor 2212a and the sub-image signal processor 2212c may not be implemented to be separated from each other, as illustrated, but may be implemented to be integrated into a single sub-image signal processor, and image data provided from the camera module 2100a and the camera module 2100c may be selected by a select element (e.g., a multiplexer) or the like, and may be then provided to the integrated sub-image signal processor.

Image data provided to each of the sub-image signal processors 2212a, 2212b, and 2212c may be provided to the image generator 2214. The image generator 2214 may use the image data provided from each of the sub-image signal processors 2212a, 2212b, and 2212c, according to image generation information or a mode signal, to generate an output image.

Specifically, the image generator 2214 may merge at least portion of the image data generated from the camera modules 2100a, 2100b, and 2100c having different field of view angles, according to image generation information or a mode signal, to generate an output image. In addition, the image generator 2214 may generate an output image by selecting any one of image data generated from camera modules 2100a, 2100b, and 2100c having different field of view angles according to image generation information or a mode signal.

In an embodiment, the image generation information may include a zoom signal or a zoom factor. Further, in an embodiment, the mode signal may be, for example, a signal based on a mode selected by a user.

When the image generation information is a zoom signal (e.g., a zoom factor) and each of the camera modules 2100a, 2100b, and 2100c has different fields of view (e.g., field of view angles), the image generator 2214 may operate differently according to a type of the zoom signal. For example, when the zoom signal is a first signal, after merging image data output from the camera module 2100a and image data output from the camera module 2100c, the merged image signal and image data output from the camera module 2100b, not used in the merging, may be used to generate an output image. When the zoom signal is a second signal, different from the first signal, the image generator 2214 may not perform such image data merging, and may select any one of the image data output from each of the camera module 2100a, 2100b, and 2100c, to create an output image. Embodiments are not limited thereto, and a method of processing image data may be modified and performed as needed.

In an embodiment, the image generator 2214 may receive a plurality of pieces of image data having different exposure points in time from at least one sub-image signal processor, among the plurality of sub-image signal processors 2212a, 2212b, and 2212c, and may process high dynamic range (HDR) with respect to the plurality of pieces of image data, to generate merged image data having an increased dynamic range.

The camera module controller 2216 may provide a control signal to each of the camera modules 2100a, 2100b, and 2100c. The control signal generated from the camera module controller 2216 may be provided to the corresponding camera modules 2100a, 2100b, and 2100c through control signal lines CSLa, CSLb, and CSLc, separated from each other.

Any one of the plurality of camera modules 2100a, 2100b, and 2100c may be designated as a master camera (for example, 2100b), according to image generation information including a zoom signal, or a mode signal, and remaining camera modules (for example, 2100a and 2100c) may be designated as slave cameras. Such information may be included in the control signal, and may be provided to the corresponding camera modules 2100a, 2100b, and 2100c through the control signal lines CSLa, CSLb, and CSLc, separated from each other.

Camera modules operating as masters and slaves may be changed according to a zoom factor or an operation mode signal. For example, when a field of view angle of the camera module 2100a is wider than a field of view angle of the camera module 2100b and the zoom factor indicates a low zoom magnification, the camera module 2100b may operate as a master, and the camera module 2100a may operate as a slave. When the zoom factor indicates a high zoom magnification, the camera module 2100a may operate as a master and the camera module 2100b may operate as a slave.

In an embodiment, a control signal provided from the camera module controller 2216 to each of the camera modules 2100a, 2100b, and 2100c may include a sync enable signal. For example, when the camera module 2100b is a master camera and the camera modules 2100a and 2100c are slave cameras, the camera module controller 2216 may transmit a sync enable signal to the camera module 2100b. The camera module 2100b receiving such a sync enable signal may generate a sync signal based on the sync enable signal, and may transmit the generated sync signal to the camera modules 2100a and 2100c through a sync signal line SSL. The camera module 2100b and the camera modules 2100a and 2100c may be synchronized with the sync signal, to transmit image data to the application processor 2200.

In an embodiment, a control signal provided from the camera module controller 2216 to the plurality of camera modules 2100a, 2100b, and 2100c may include mode information according to a mode signal. Based on this mode information, the plurality of camera modules 2100a, 2100b, and 2100c may operate in a first operation mode and a second operation mode in relation to a sensation rate.

In the first operation mode, the plurality of camera modules 2100a, 2100b, and 2100c may generate an image signal at a first rate (for example, generate an image signal having a first frame rate), may encode the generated image signal at a second rate, higher than the first rate (e.g., encode an image signal having a second frame rate, higher than the first frame rate), and may transmit the encoded image signal to the application processor 2200. In this case, the second rate may be 30 times or less of the first rate.

The application processor 2200 may store the transmitted image signal, e.g., the encoded image signal, in the internal memory 2230, or in a storage 2400 outside the application processor 2200, and may then read the encoded image signal from the internal memory 2230 or the storage 2400, may decode the read image signal, and may display image data generated based on the decoded image signal. For example, a corresponding sub-image signal processor, among the plurality of sub-image signal processors 2212a, 2212b, and 2212c of the image processing device 2210, may decode the read image signal, and may also perform image processing on the decoded image signal.

In the second operation mode, the plurality of camera modules 2100a, 2100b, and 2100c may generate an image signal at a third rate, lower than the first rate (e.g., generate an image signal having a third frame rate, lower than the first frame rate), and may transmit the image signal to the application processor 2200. The image signal provided to the application processor 2200 may be a signal, not encoded. The application processor 2200 may perform image processing on the received image signal, or may store the received image signal in the internal memory 2230 or the storage 2400.

The PMIC 2300 may supply power, for example, a power voltage to each of the plurality of camera modules 2100a, 2100b, and 2100c. For example, under control of the application processor 2200, the PMIC 2300 may supply first power to the camera module 2100a through a power signal line PSLa, may supply second power to the camera module 2100b through a power signal line PSLb, and may supply third power to the camera module 2100c through a power signal line PSLc.

The PMIC 2300 may generate power, corresponding to each of the plurality of camera modules 2100a, 2100b, and 2100c, in response to a power control signal PCON from the application processor 2200, and may also adjust a level of the power. The power control signal PCON may include a power adjustment signal for each operation mode of the plurality of camera modules 2100a, 2100b, and 2100c. For example, the operation mode may include a low power mode. In this case, the power control signal PCON may include information on a camera module operating in the low power mode and a level of the power to be set. The levels of pieces of power provided to each of the plurality of camera modules 2100a, 2100b, and 2100c may be the same or different from each other. Also, the level of power may be dynamically changed.

According to an embodiment of inventive concepts, an image sensor may include an autofocusing pixel, and the autofocusing pixel may include a first photodiode and a second photodiode, separated from each other by a pixel internal isolation layer. The pixel internal isolation layer may include a first pixel internal isolation layer and a second pixel internal isolation layer isolation layer, formed of different materials. The pixel internal isolation layer may extend from a first surface of a substrate together with a pixel isolation layer between pixels, and may provide a charge path through which charges may move between the first photodiode and the second photodiode. Therefore, alignment errors between the pixel isolation layer and the pixel internal isolation layer may be reduced and/or minimized, and capacitance of the pixels may be improved.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

Various features and effects of inventive concepts are not limited to the above-described contents, and can be more easily understood in the course of describing specific embodiments of inventive concepts.

While example embodiments have been illustrated and described above, it will be apparent to those skilled in the art that modifications and variations could be made without departing from the scope of inventive concepts as defined by the appended claims.

What is claimed is:

1. An image sensor comprising:
a pixel array including a substrate, a plurality of pixels arranged in directions parallel to an upper surface of the substrate, and a pixel isolation layer between the plurality of pixels, each of the plurality of pixels including at least one photodiode and a pixel circuit below the at least one photodiode; and
a logic circuit configured to acquire a pixel signal from the plurality of pixels,
wherein the pixel array comprises at least one autofocusing pixel,
wherein the at least one autofocusing pixel comprises a first photodiode, a second photodiode, a pixel internal isolation layer between the first photodiode and the second photodiode, and a microlens on the first photodiode and the second photodiode,
wherein the pixel internal isolation layer includes a first pixel internal isolation layer and a second pixel internal isolation layer,
the first pixel internal isolation layer and the second pixel internal isolation layer are separated from each other in a first direction,
the first direction is perpendicular to the upper surface of the substrate,
a material of the first pixel internal isolation layer is different than a material of the second pixel internal isolation layer,
wherein the second pixel internal isolation layer does not overlap the first photodiode and the second photodiode in a second direction and a third direction, and
wherein the first direction, the second direction, and third direction are different from each other and perpendicular to each other, and
wherein a first surface of the substrate is a lower surface of the substrate and a second surface of the substrate is opposite the first surface of the substrate,
wherein the second pixel internal isolation layer comprises an insulating material, and
wherein the second pixel internal isolation layer has a third surface and a fourth surface parallel to the first surface, the third surface is separated from the first photodiode and the second photodiode in the first direction, and the third surface is co-planar with the second surface.

2. The image sensor of claim 1, wherein the first pixel internal isolation layer extends from the pixel circuit and comprises polysilicon.

3. The image sensor of claim 2, wherein the pixel circuit is configured to apply a negative voltage to the first pixel internal isolation layer while the logic circuit acquires the pixel signal from the plurality of pixels.

4. The image sensor of claim 2, wherein, in one direction parallel to the upper surface of the substrate, a length of the first pixel internal isolation layer is different from a length of the second pixel internal isolation layer.

5. The image sensor of claim 4, wherein the first pixel internal isolation layer is separated from the pixel isolation layer.

6. The image sensor of claim 1, wherein
the at least one autofocusing pixel comprises an impurity region between the first pixel internal isolation layer and the second pixel internal isolation layer, and
the impurity region is doped with a P-type impurity.

7. The image sensor of claim 1, wherein
the pixel isolation layer comprises a first pixel isolation layer and a second pixel isolation layer,
the first pixel isolation layer extends from the pixel circuit and includes a first material,
the second pixel isolation layer extends from the first pixel isolation layer and includes a second material, and
the second material is different from the first material.

8. The image sensor of claim 7, wherein
the first pixel internal isolation layer comprises the first material, and
the second pixel internal isolation layer comprises the second material.

9. The image sensor of claim 7, wherein a reflectivity of the second material is higher than a reflectivity of the first material.

10. An image sensor comprising:
a substrate having a first surface and a second surface opposing the first surface;
a pixel array including a plurality of pixels and a pixel isolation layer between the plurality of pixels, the pixel isolation layer extending from the first surface to the second surface of the substrate in a first direction perpendicular to the first surface,
each of the plurality of pixels including at least one photodiode inside the substrate and a pixel circuit having a plurality of elements on the first surface; and
a logic circuit configured to acquire pixel signal from the plurality of pixels,
wherein the pixel array includes at least one autofocusing pixel,
wherein the at least one autofocusing pixel includes a first photodiode, a second photodiode, a pixel internal isolation layer extending from the first surface in the first direction between the first photodiode and the second photodiode, and a microlens on the second surface,
wherein the pixel internal isolation layer includes a first pixel internal isolation layer extending from the first surface and a second pixel internal isolation layer extending from the second surface,
wherein the first pixel internal isolation layer and the second pixel internal isolation layer have different shapes in a plane parallel to the first surface,
wherein the second pixel internal isolation layer does not overlap the first photodiode and the second photodiode in a second direction and a third direction,
wherein the first direction, the second direction, and third direction are different from each other and perpendicular to each other,
wherein the second pixel internal isolation layer comprises an insulating material, and
wherein the second pixel internal isolation layer has a third surface and a fourth surface parallel to the first surface, the third surface is separated from the first photodiode and the second photodiode in the first direction, and the third surface is co-planar with the second surface.

11. The image sensor of claim 10, wherein, in the plane, parallel to the first surface, the first pixel internal isolation layer and the second pixel internal isolation layer extend in a second direction, and wherein, in the second direction, a length of the first pixel internal isolation layer is different from a length of the second pixel internal isolation layer.

12. The image sensor of claim 11, wherein, in the second direction, the length of the first pixel internal isolation layer is shorter than the length of the second pixel internal isolation layer.

13. The image sensor of claim 10, wherein, in the plane, parallel to the first surface, a width of the pixel internal isolation layer is narrower than a width of the pixel isolation layer.

14. The image sensor of claim 10, wherein the at least one autofocusing pixel comprises an impurity region between the first pixel internal isolation layer and the second pixel internal isolation layer in the first direction, and the impurity region is doped with a P-type impurity.

15. The image sensor of claim 10, wherein the pixel isolation layer comprises a first pixel isolation layer and a second pixel isolation layer, the first pixel isolation layer extends from the first surface, the second pixel isolation layer extends from the second surface in the first direction and connects to the first pixel isolation layer, and a length of the second pixel isolation layer is shorter than a length of the first pixel isolation layer in the first direction.

16. The image sensor of claim 15, wherein a reflectivity of the second pixel internal isolation layer is higher than a reflectivity of the first pixel internal isolation layer.

\* \* \* \* \*